US012720746B2

(12) United States Patent
Rajashekhar et al.

(10) Patent No.: US 12,720,746 B2
(45) Date of Patent: Aug. 25, 2026

(54) THREE-DIMENSIONAL MEMORY DEVICE INCLUDING BACKSIDE SEMICONDUCTOR SOURCE STRUCTURE AND METHODS FOR FORMING THE SAME

(71) Applicant: WESTERN DIGITAL TECHNOLOGIES, INC., San Jose, CA (US)

(72) Inventors: Adarsh Rajashekhar, Santa Clara, CA (US); Raghuveer S. Makala, Campbell, CA (US); Kartik Sondhi, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 439 days.

(21) Appl. No.: 18/343,162

(22) Filed: Jun. 28, 2023

(65) Prior Publication Data

US 2025/0008729 A1 Jan. 2, 2025

(51) Int. Cl.

*H10B 43/27* (2023.01)
*H10B 41/10* (2023.01)
*H10B 41/27* (2023.01)
*H10B 41/35* (2023.01)
*H10B 43/10* (2023.01)
*H10B 43/35* (2023.01)

(52) U.S. Cl.

CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search

CPC .................... H10B 41/00–70; H10B 43/00–50
See application file for complete search history.

(56) References Cited

U.S. PATENT DOCUMENTS 9,805,805 B1 * 10/2017 Zhang .................... G11C 16/14
9,824,966 B1 * 11/2017 Kanakamedala ...... H10B 43/35
10,629,616 B1 4/2020 Kai et al.
10,720,445 B1 7/2020 Shimizu et al.
11,195,781 B2 12/2021 Okina et al.
11,195,857 B2 12/2021 Kai et al.
11,201,107 B2 12/2021 Okina et al.

(Continued)

OTHER PUBLICATIONS

IPRP-WO—Notification Concerning Transmittal of International Preliminary Report on Patentability and Written Opinion of the International Searching Authority for International Patent Application No. PCT/US2024/011861, mailed Jan. 8, 2026, 8 pages.

(Continued)

*Primary Examiner* — Christine S. Kim
*Assistant Examiner* — Tyler J Wiegand
(74) *Attorney, Agent, or Firm* — THE MARBURY LAW GROUP PLLC

(57) ABSTRACT

A semiconductor structure includes an alternating stack of insulating layers and electrically conductive layers located on a semiconductor layer, a memory opening vertically extending through the alternating stack and the semiconductor layer, a memory opening fill structure located in the memory opening and containing a memory film and a vertical semiconductor channel, and a backside semiconductor source structure including a doped semiconductor material. The backside semiconductor source structure may be polycrystalline or single crystalline.

1 Claim, 77 Drawing Sheets

(56) References Cited

U.S. PATENT DOCUMENTS

| | | | | |
|---|---|---|---|---|
| 11,355,486 | B2 | 6/2022 | Mizutani et al. | |
| 11,393,836 | B2 | 7/2022 | Tsutsumi et al. | |
| 11,482,539 | B2 | 10/2022 | Sharangpani et al. | |
| 11,508,711 | B2 | 11/2022 | Ninomiya et al. | |
| 11,631,690 | B2 | 4/2023 | Okina et al. | |
| 11,676,954 | B2 | 6/2023 | Rabkin et al. | |
| 2020/0258817 | A1 | 8/2020 | Okina et al. | |
| 2021/0035965 | A1 | 2/2021 | Mizutani et al. | |
| 2021/0035999 | A1* | 2/2021 | Nishikawa | H10B 41/27 |
| 2021/0091063 | A1 | 3/2021 | Ninomiya et al. | |
| 2022/0130853 | A1 | 4/2022 | Sharangpani et al. | |
| 2022/0157841 | A1 | 5/2022 | Tsutsumi et al. | |
| 2022/0157842 | A1 | 5/2022 | Tsutsumi et al. | |
| 2022/0189984 | A1 | 6/2022 | Okina | |
| 2022/0208748 | A1 | 6/2022 | Rabkin et al. | |
| 2022/0302149 | A1 | 9/2022 | Zhang et al. | |
| 2022/0302150 | A1 | 9/2022 | Zhang et al. | |
| 2023/0422523 | A1* | 12/2023 | Kim | H10B 43/27 |

OTHER PUBLICATIONS

Arkles, B. et al., "Synthesis and Exploratory Deposition Studies of Isotetrasilane and Reactive Intermediates for Epitaxial Silicon," *Inorganic Chemistry* 2019, vol. 58, No. 5, pp. 3050-3057, (2019); DOI: 10.1021/acs.inorgchem.8b02761.

Loh, T.H. et al., "Ultrathin low temperature SiGe buffer for the growth of high quality Ge epilayer on Si(100) by ultrahigh vacuum chemical vapor deposition," *Appl. Phys. Lett.*, vol. 90, 092108 (2007); https://doi.org/10.1063/1.2709993.

U.S. Appl. No. 17/232,209, filed Apr. 16, 2021, SanDisk Technologies LLC.

U.S. Appl. No. 17/577,533, filed Jan. 18, 2022, SanDisk Technologies LLC.

U.S. Appl. No. 17/655,272, filed Mar. 17, 2022, SanDisk Technologies LLC.

U.S. Appl. No. 17/659,057, filed Apr. 13, 2022, SanDisk Technologies LLC.

U.S. Appl. No. 17/661,783, filed May 3, 2022, SanDisk Technologies LLC.

U.S. Appl. No. 17/662,926, filed May 11, 2022, SanDisk Technologies LLC.

U.S. Appl. No. 17/684,975, filed Mar. 2, 2022, SanDisk Technologies LLC.

U.S. Appl. No. 17/806,406, filed Jun. 10, 2022, SanDisk Technologies LLC.

U.S. Appl. No. 17/806,415, filed Jun. 10, 2022, SanDisk Technologies LLC.

U.S. Appl. No. 17/931,362, filed Sep. 12, 2022, SanDisk Technologies LLC.

U.S. Appl. No. 18/158,783, filed Jan. 24, 2023, SanDisk Technologies LLC.

U.S. Appl. No. 63/379,805, filed Oct. 17, 2022, SanDisk Technologies LLC.

U.S. Appl. No. 63/480,132, filed Jan. 17, 2023, SanDisk Technologies LLC.

U.S. Appl. No. 63/483,339, filed Feb. 6, 2023, SanDisk Technologies LLC.

U.S. Appl. No. 63/487,097, filed Feb. 27, 2023, SanDisk Technologies LLC.

U.S. Appl. No. 63/492,573, filed Mar. 28, 2023, SanDisk Technologies LLC.

U.S. Appl. No. 63/492,576, filed Mar. 28, 2023, SanDisk Technologies LLC.

U.S. Appl. No. 63/496,653, filed Apr. 17, 2023, SanDisk Technologies LLC.

U.S. Appl. No. 63/496,660, filed Apr. 17, 2023, SanDisk Technologies LLC.

U.S. Appl. No. 63/504,915, filed May 30, 2023, Western Digital Technologies, Inc.

U.S. Appl. No. 63/508,386, filed Jun. 15, 2023, Western Digital Technologies, Inc.

ISR—Notification of Transmittal of The International Search Report and Written Opinion of the International Searching Authority for International Patent Application No. PCT/US2022/011861, mailed May 16, 2024, 11 pages.

Sondhi, K. et al., "Three-Dimensional Memory Device Including Backside Semiconductor Source Structure And Methods For Forming The Same," U.S. Appl. No. 18/343,118, filed Jun. 28, 2023.

Sharangpani, R. et al., "Memory Device Including Aluminum Nitride Diffusion Barrier Layer And Methods For Forming The Same," U.S. Appl. No. 18/344,227, filed Jun. 29, 2023.

* cited by examiner 24
32B(32)
46
44
32
46
32
58
62
52
54
56
50
60
55

HP2
24
32B(32)
46
32
46
32
44
HP1
58
26
62
26F
26S
25
52
54
56
50
60
55

60L
62L
56
54
52
32T(32)
42
32
14
12
9

THREE-DIMENSIONAL MEMORY DEVICE INCLUDING BACKSIDE SEMICONDUCTOR SOURCE STRUCTURE AND METHODS FOR FORMING THE SAME

FIELD

The present disclosure relates generally to the field of semiconductor devices, and particularly to three-dimensional memory devices including backside semiconductor source structure and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure comprises: an alternating stack of insulating layers and electrically conductive layers located on a planar semiconductor layer comprising a first semiconductor material and laterally extending along a horizontal direction; a memory opening vertically extending through the alternating stack; a memory opening fill structure located in the memory opening and comprising a memory film and a vertical semiconductor channel that includes a second semiconductor material; and a backside semiconductor source structure comprising a third semiconductor material and contacting the vertical semiconductor channel and the planar semiconductor layer.

According to another aspect of the present disclosure, a method of forming a semiconductor structure is provided. The method comprises: forming an etch stop material layer over a carrier substrate; forming a planar semiconductor layer over the etch stop material layer; forming an alternating stack of insulating layers and spacer material layers over the planar semiconductor layer, wherein the spacer material layers are formed as, or are subsequently replaced with, electrically conductive layers; forming a memory opening through the alternating stack; forming a memory opening fill structure in the memory opening, wherein the memory opening fill structure comprises a memory film and a vertical semiconductor channel; removing the carrier substrate; removing the etch stop material layer and an end portion of the memory film to expose an end portion of the vertical semiconductor channel and a backside surface of the planar semiconductor layer; and growing a backside semiconductor source structure from physically exposed surfaces of the vertical semiconductor channel and the planar semiconductor layer.

According to yet another aspect of the present disclosure, a semiconductor structure is provided, which comprises: an alternating stack of insulating layers and electrically conductive layers located on a single crystalline semiconductor layer; a memory opening vertically extending through the alternating stack and through the single crystalline semiconductor layer; a memory opening fill structure located in the memory opening and comprising a memory film and a vertical semiconductor channel; and a backside semiconductor source structure comprising a doped semiconductor material, wherein the backside semiconductor source structure comprises an epitaxial doped semiconductor portion in contact with and in epitaxial alignment with a single crystalline structure of the single crystalline semiconductor layer, and a polycrystalline doped semiconductor portion in contact with the vertical semiconductor channel.

According to still another aspect of the present disclosure, a method of forming a semiconductor structure is provided. The method comprises: forming an alternating stack of insulating layers and spacer material layers over a composite substate that includes a carrier substrate, a buried insulating layer, and a single crystalline semiconductor layer, wherein the spacer material layers are formed as, or are subsequently replaced with, electrically conductive layers; forming a memory opening through the alternating stack, the single crystalline semiconductor layer, and the buried insulating layer; forming a memory opening fill structure in the memory opening, wherein the memory opening fill structure comprises a memory film and a vertical semiconductor channel; removing the carrier substrate; removing the buried insulating layer and an end portion of the memory opening fill structure, wherein an end portion of the vertical semiconductor channel and a backside surface of the single crystalline semiconductor layer are exposed; and forming a backside semiconductor source structure on the vertical semiconductor channel and the backside surface of the single crystalline semiconductor layer, wherein the backside semiconductor source structure comprises an epitaxial doped semiconductor portion that is formed in contact with and in epitaxial alignment with a single crystalline structure of the single crystalline semiconductor layer, and a polycrystalline doped semiconductor portion that is formed on the vertical semiconductor channel.

DETAILED DESCRIPTION

Figure 1:
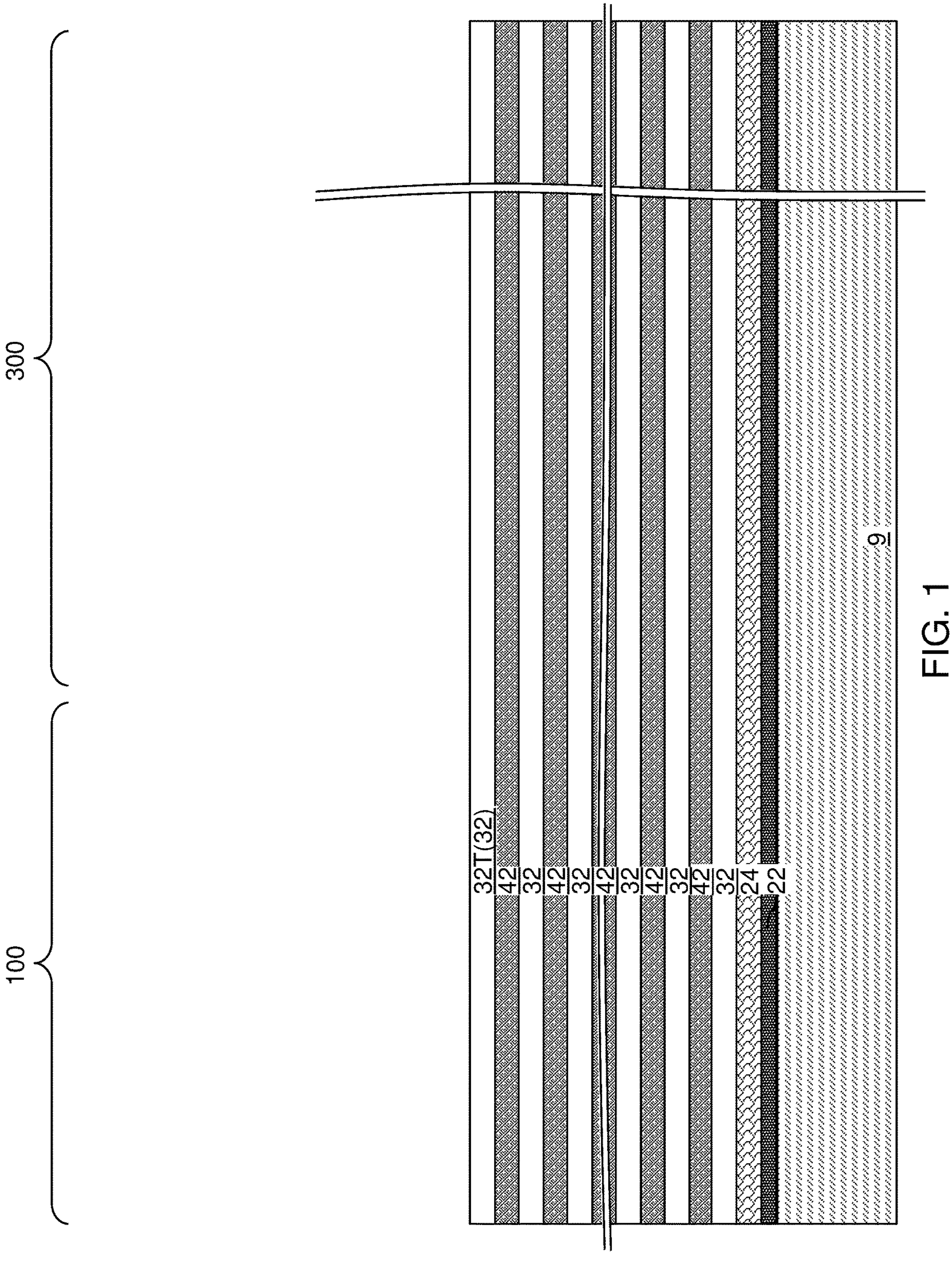
FIG. 1 is a schematic vertical cross-sectional view of a first exemplary structure after formation of an etch stop material layer, a planar semiconductor layer, and an alternating stack of insulating layers and sacrificial material layers over a carrier substrate according to a first embodiment of the present disclosure.

As discussed above, the embodiments of the present disclosure are directed to a three-dimensional memory device including a backside semiconductor source structure and methods for forming the same, the various aspects of which are described below. Embodiments of the disclosure can be employed to form various structures including a multilevel memory structure, non-limiting examples of which include three-dimensional memory devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as “first,” “second,” and “third” are employed merely to identify similar elements, and different ordinals may be employed across the specification and the claims of the instant disclosure. The term “at least one” element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a “contact” between elements refers to a direct contact between elements that provides an edge or a surface shared by the elements. If two or more elements are not in direct contact with each other or among one another, the two elements are “disjoined from” each other or “disjoined among” one another. As used herein, an element located “on” a second element can be located on the exterior side of a surface of the second element or on the interior side of the second element. As used herein, an element is located “directly on” a second element if there exist a physical contact between a surface of the element and a surface of the second element. As used herein, an element is “electrically connected to” a second element if there exists a conductive path consisting of at least one conductive material between the element and the second element. As used herein, a “prototype” structure or an “in-process” structure refers to a transient structure that is subsequently modified in the shape or composition of at least one component therein.

As used herein, a “layer” refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a “semiconducting material” refers to a material having electrical conductivity in the range from $1\times10^{-5}$ S/m to $1\times10^{5}$ S/m. As used herein, a “semiconductor material” refers to a material having electrical conductivity in the range from $1\times10^{-5}$ S/m to 1 S/m in the absence of electrical dopants therein, and is capable of producing a doped material having electrical conductivity in a range from 1 S/m to $1\times10^{7}$ S/m upon suitable doping with an electrical dopant. As used herein, an “electrical dopant” refers to a p-type dopant that adds a hole to a valence band within a band structure, or an n-type dopant that adds an electron to a conduction band within a band structure. As used herein, a “conductive material” refers to a material having electrical conductivity greater than $1\times10^{5}$ S/m. As used herein, an “insulator material” or a “dielectric material” refers to a material having electrical conductivity less than $1\times10^{-5}$ S/m. As used herein, a “heavily doped semiconductor material” refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1\times10^{-5}$ S/m to $1\times10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a first exemplary structure according to a first embodiment of the present disclosure is illustrated. The first exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be removed selective the materials of insulating layers 32 and dielectric material portions to be subsequently formed.

An etch stop material layer 22 can be formed on the top surface of the carrier substrate 9. The etch stop material layer 22 includes a material that can function as an etch stop material during a subsequent anisotropic etch process to be employed to form memory openings through an alternating stack of insulating layers and spacer material layers to be subsequently formed. In one embodiment, the etch stop material layer 22 comprise a carbon-based layer such as a metal-doped carbon layer; a dielectric metal oxide material layer such as a layer of aluminum oxide, hafnium oxide, tantalum oxide, titanium oxide, etc.; or a metal nitride layer, such as a TiN, TaN, WN, or MoN layer. The etch stop material layer 22 may be deposited by chemical vapor deposition or physical vapor deposition. The thickness of the etch stop material layer 22 may be in a range from 10 nm to 60 nm, such as from 15 nm to 40 nm, for example from 20 nm to 30 nm, although lesser and greater thicknesses may also be employed.

A planar semiconductor layer 24 including a first semiconductor material can be formed over the etch stop material layer 22. The first semiconductor material may comprise silicon (e.g., polysilicon or amorphous silicon), germanium or a silicon-germanium compound semiconductor material, and may be formed by chemical vapor deposition, atomic layer deposition or physical vapor deposition. In one embodiment, the first semiconductor material may have a doping of a conductivity type that is the opposite of the conductivity type of doping in vertical semiconductor channels to be subsequently formed. For example, if the vertical semiconductor channels to be subsequently formed comprise a semiconductor material (e.g., silicon) having a doping of a first conductivity type, then the first semiconductor material of the planar semiconductor layer 24 may have a doping of a second conductivity type. If the first conductivity type is p-type, the second conductivity type is n-type, and vice versa. The atomic concentration of dopants of the second conductivity type in the planar semiconductor layer 24 may be in a range from $5\times10^{18}/cm^3$ to $2\times10^{21}/cm^3$, such as from $1\times10^{19}/cm^3$ to $1\times10^{21}/cm^3$, although lesser and greater thicknesses may also be employed. The planar semiconductor layer 24 laterally extends along horizontal directions, may have a uniform thickness throughout, which may be in a range from 10 nm to 100 nm, although lesser and greater thicknesses may also be employed.

An alternating stack of first material layers and second material layers can be formed over the planar semiconductor layer 24. The first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the carrier substrate 9. The insulating layers 32 comprise an insulating material such as undoped silicate glass or a doped silicate glass, and the sacrificial material layers 42 comprise a sacrificial material such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers.

The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the carrier substrate 9 is herein referred to as a bottommost insulating layer 32B.

Each of the insulating layers 32 other than the topmost insulating layer 32 may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32 may have a thickness of about one half of the thickness of other insulating layers 32.

The first exemplary structure comprises a memory array region 100 in which a three-dimensional array of memory elements is to be subsequently formed, and a contact region 300 in which layer contact via structures contacting word lines are to be subsequently formed.

While an embodiment is described in which the spacer material layers are formed as sacrificial material layers 42, the spacer material layers may be formed as electrically conductive layers in an alternative embodiment. Generally, spacer material layers of the present disclosure may be formed as, or may be subsequently replaced at least partly with, electrically conductive layers.

Figure 2:
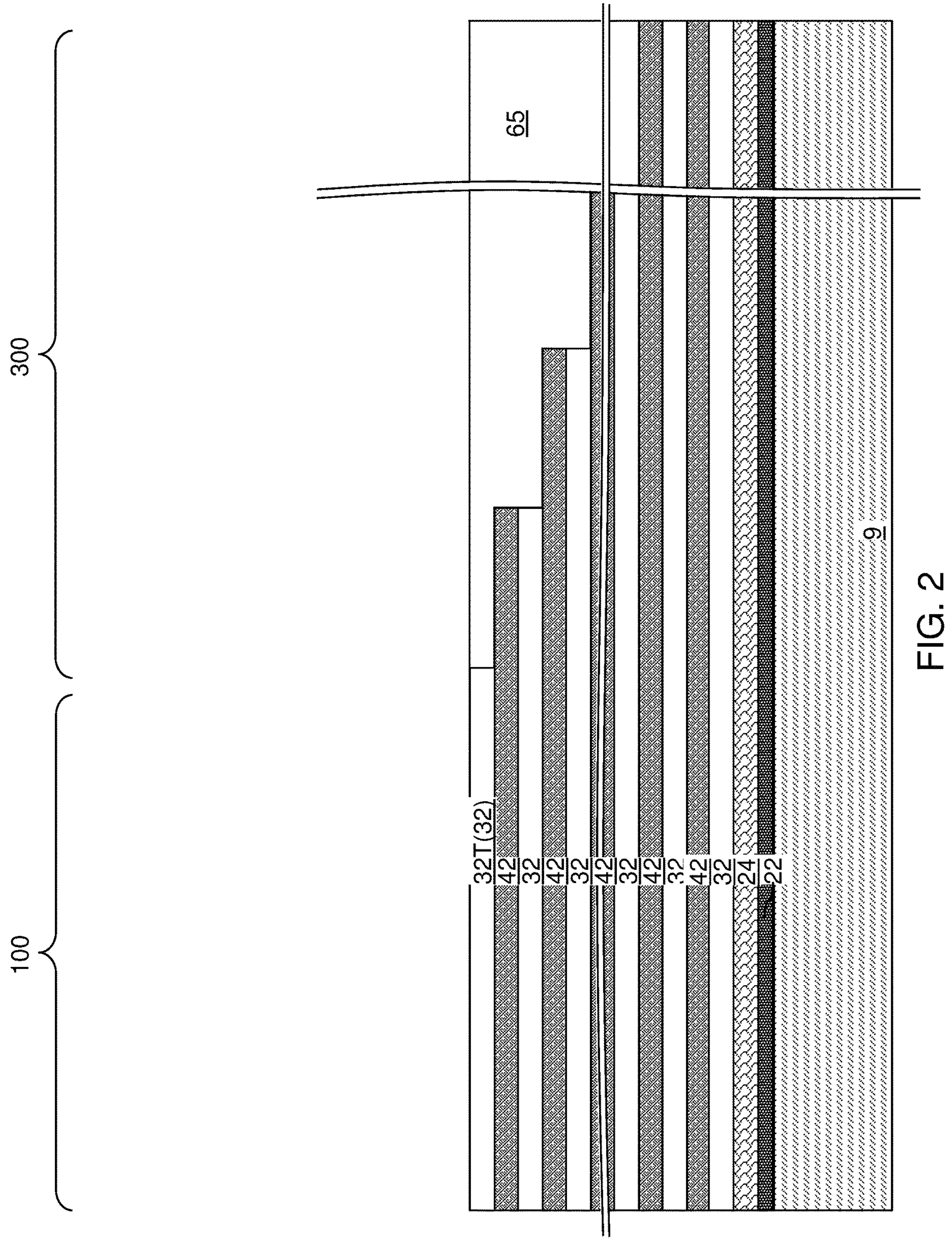
FIG. 2 is a schematic vertical cross-sectional view of the first exemplary structure after formation of stepped surfaces and a stepped dielectric material portion according to the first embodiment of the present disclosure.

Referring to FIG. 2, optional stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the planar semiconductor layer 24. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases or decreases stepwise as a function of a vertical distance from a top surface of a substrate on which the element is present. If silicon oxide is employed for the stepped dielectric material portion 65, the silicon oxide of the stepped dielectric material portion 65 may, or may not, be doped with dopants such as B, P, and/or F.

Figure 3:
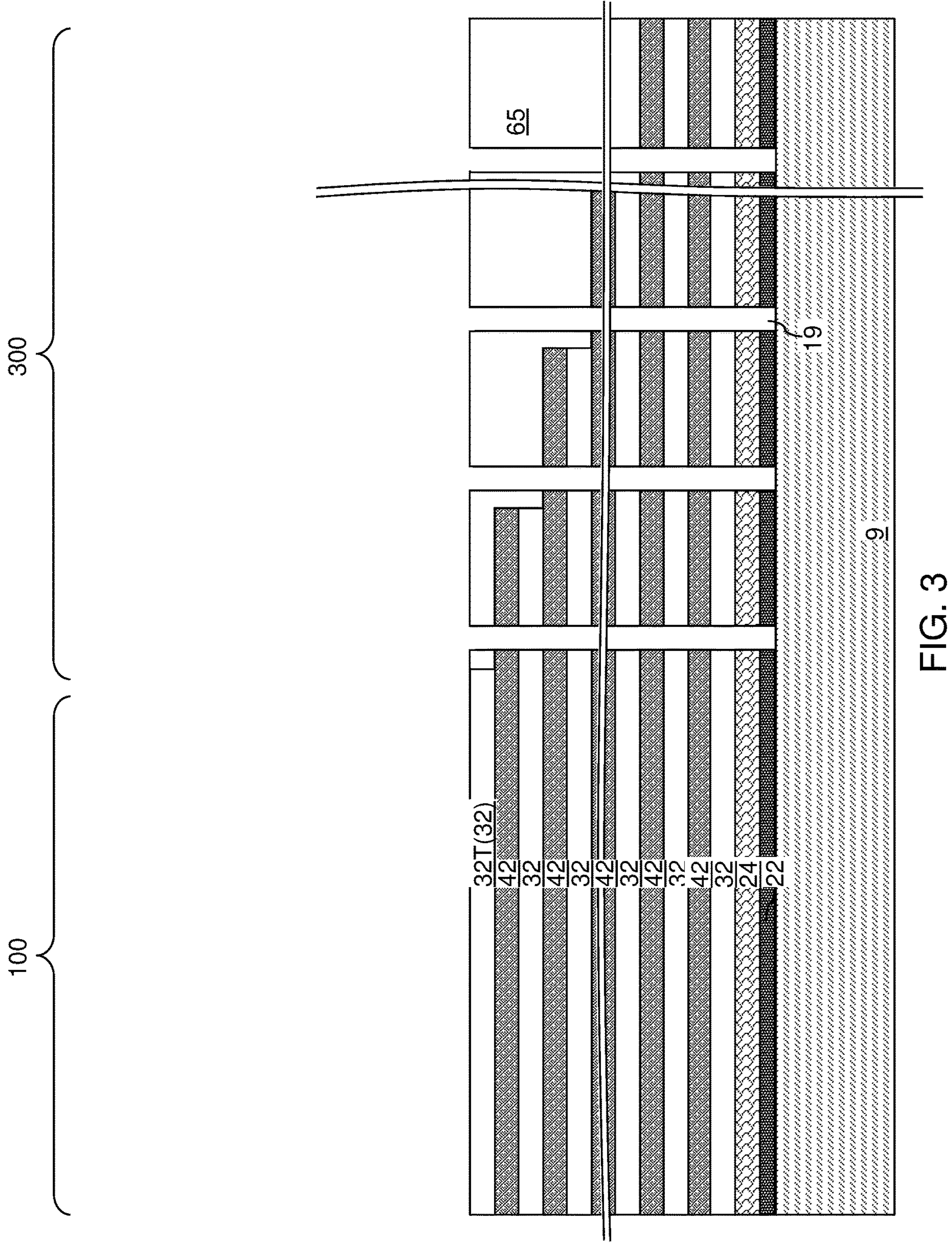
FIG. 3 is a schematic vertical cross-sectional view of the first exemplary structure after formation of support openings according to the first embodiment of the present disclosure.

Referring to FIG. 3, an optional first etch mask layer (such as a photoresist layer) can be formed over the alternating stack (32, 42), and can be lithographically patterned to form openings in the contact region 300. An anisotropic etch process can be performed to transfer the pattern of the openings in the first etch mask layer through the stepped dielectric material portion 65 and the alternating stack (32, 42). Support openings 19 can optionally be formed through the stepped dielectric material portion 65 and the alternating stack (32, 42) in the contact region 300. Each of the support openings 19 can vertically extend into the carrier substrate 9. In one embodiment, bottom surfaces of the support openings 19 may be formed at or below the top surface of the carrier substrate 9. The support openings 19 may have a diameter in a range from 60 nm to 400 nm, such as from 120 nm to 300 nm, although lesser and greater thicknesses may be employed.

Figure 4:
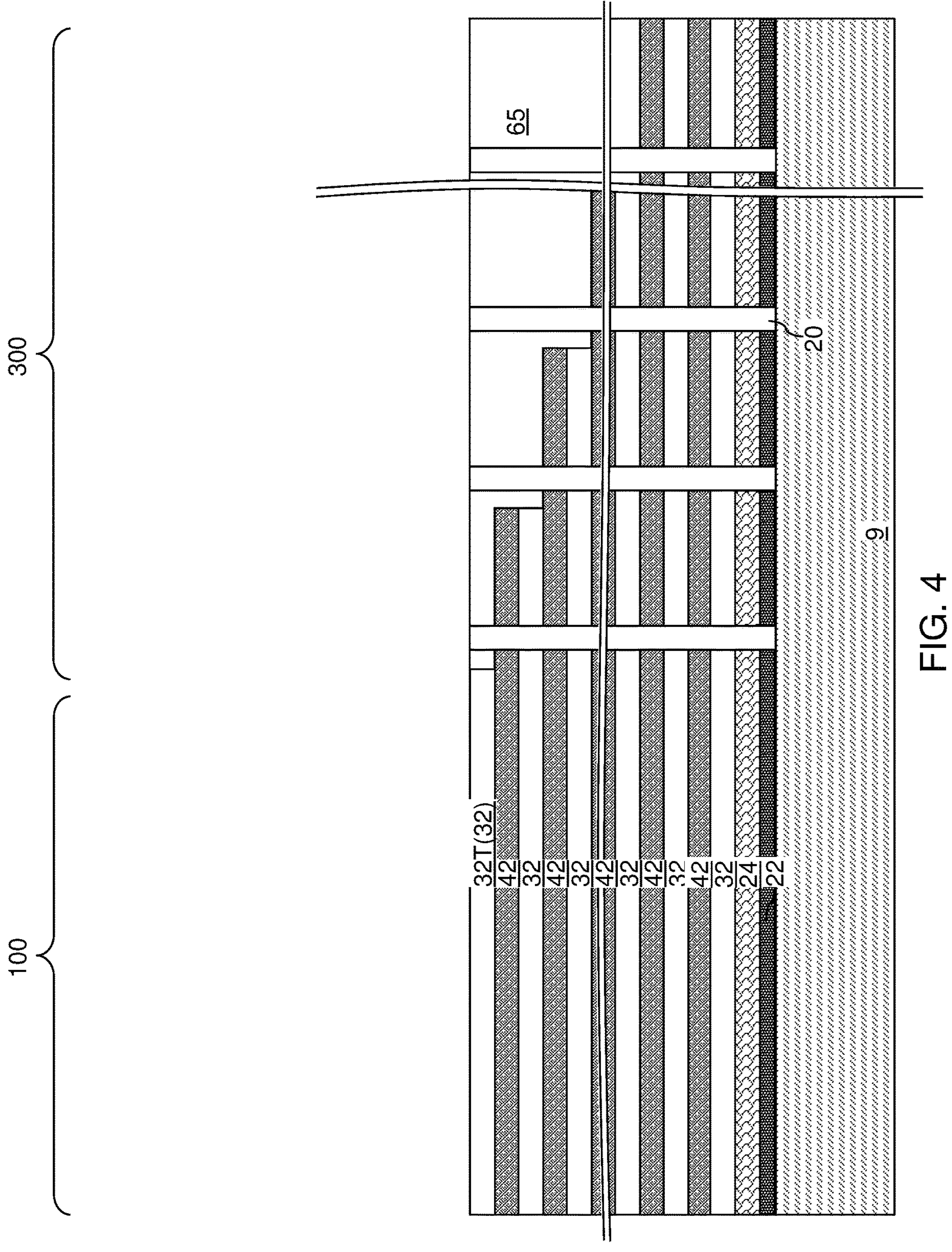
FIG. 4 is a vertical cross-sectional view of the first exemplary structure after formation of support pillar structures according to the first embodiment of the present disclosure.

Referring to FIG. 4, a dielectric fill material, such as silicon oxide, can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the stepped dielectric material portion 65 during replacement of the sacrificial material layers 42 with electrically conductive layers. Alternatively, the support openings 19 can be formed at a later step at the same time as the memory openings, and the support pillar structures 20 can be formed in the support openings 19 at the same time as the memory opening fill structures are formed in the memory openings, as will be described below.

Figure 5A:
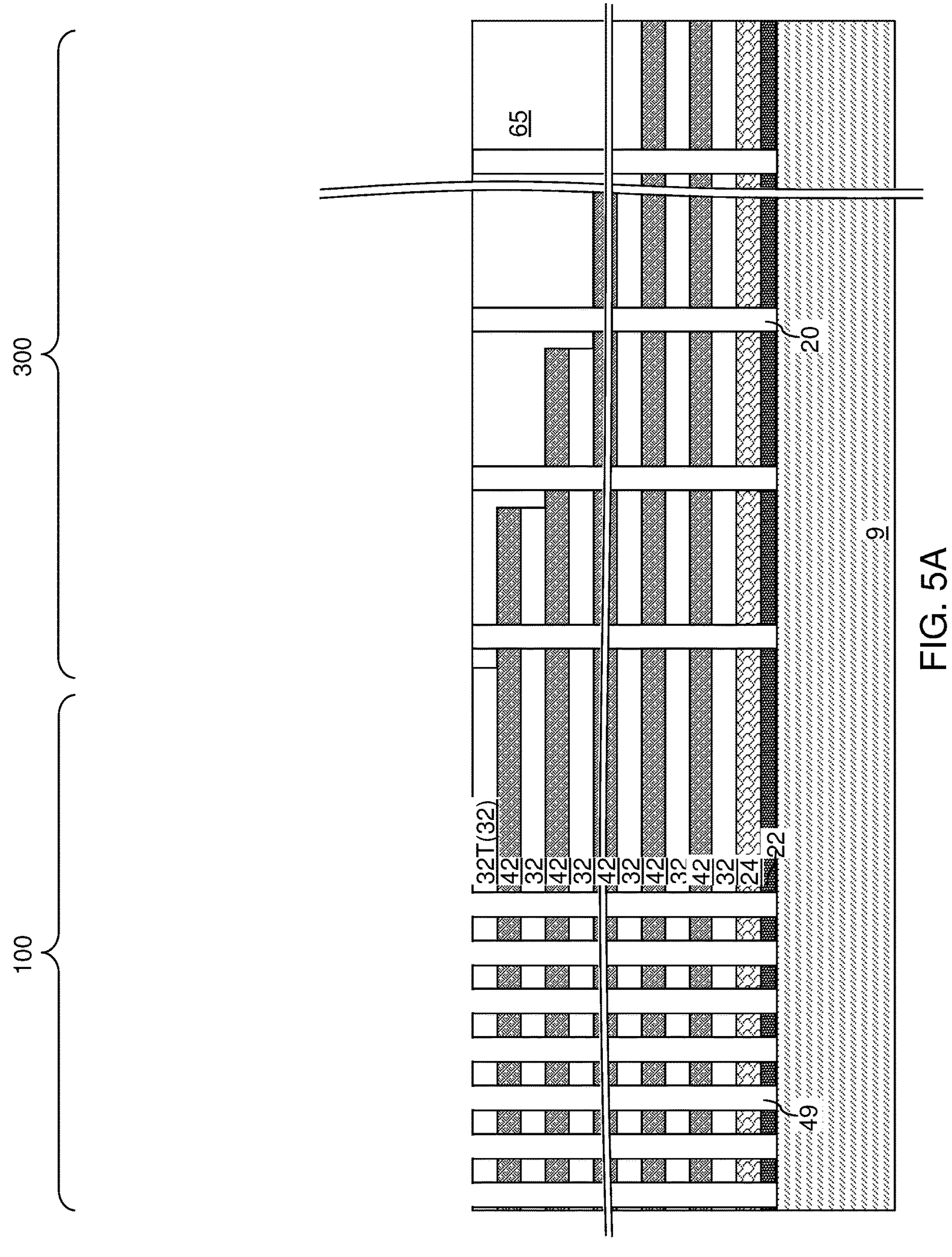
FIG. 5A is a schematic vertical cross-sectional view of the first exemplary structure after formation of memory openings according to the first embodiment of the present disclosure.
Figure 5B:
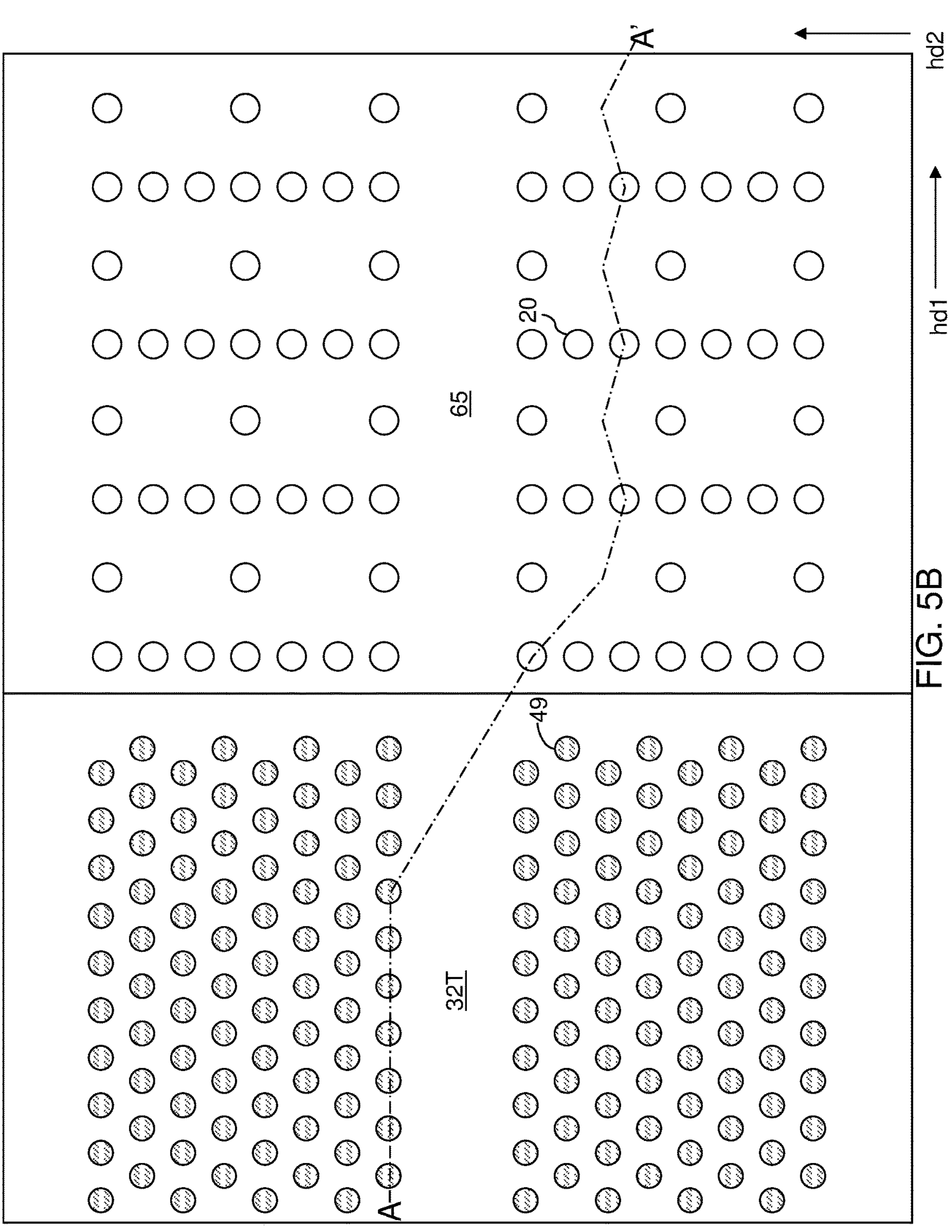
FIG. 5B is a top-down view of the first exemplary structure of FIG. 5A. The vertical plane A-A is the cut plane of the vertical cross-sectional view of FIG. 5A.

Referring to FIGS. 5A and 5B, a second etch mask layer (such as a photoresist layer) can be formed over the alternating stack (32, 42), and can be lithographically patterned to form openings in the memory array region 100. An anisotropic etch process can be performed to transfer the pattern of the openings in the second etch mask layer through the alternating stack (32, 42), the planar semiconductor layer 24, and the etch stop material layer 22. According to an aspect of the present disclosure, the anisotropic etch process may comprise a first anisotropic etch step that etches the materials of the insulating layers 32 and the spacer material layers (such as the sacrificial material layers 42) selective to the first semiconductor material of the planar semiconductor layer 24, a second anisotropic etch step that etches the first semiconductor material selective to the material of the etch stop material layer 22, and a third anisotropic etch process that etches the material of the etch stop material layer 22 selective to the material of the carrier substrate 9.

Memory openings 49 can be formed through the alternating stack (32, 42), the planar semiconductor layer 24, and the etch stop material layer 22 in the memory array region 100. According to an aspect of the present disclosure, sequential use of selective etch chemistries can minimize overetch of the third anisotropic etch step into a top portion of the carrier substrate 9. Thus, bottom surfaces of the memory openings 49 may be formed within or underneath, but in proximity to, a horizontal plane including the bottom surface of the etch stop material layer 22. In one embodiment, recess distance of the bottom surfaces of the memory openings 49 relative to the horizontal plane including the bottom surface of the etch stop material layer 22 may be less than the total thickness of each memory film to be subsequently formed, and may be in a range from 0 nm to 15 nm, such as from 0 nm to 10 nm.

Each cluster of memory openings 49 may comprise a plurality of rows of memory openings 49. Each row of memory openings 49 may comprise a plurality of memory openings 49 that are arranged along the first horizontal direction hd1 with a uniform pitch. The rows of memory openings 49 may be laterally spaced among one another along the second horizontal direction hd2, which may be perpendicular to the first horizontal direction hd2. In one embodiment, each cluster of memory openings 49 may be formed as a two-dimensional periodic array of memory openings 49. The memory openings 49 may have a diameter in a range from 60 nm to 400 nm, such as from 120 nm to 300 nm, although lesser and greater thicknesses may be employed. In the alternative embodiment, the support openings 19 are formed at the same time as the memory openings 49 using the same patterned photoresist layer.

FIGS. 6A-6F are sequential vertical cross-sectional views of a memory opening 49 during formation of a memory opening fill structure 58 according to an embodiments of the present disclosure.

Figures 6A, 6B:
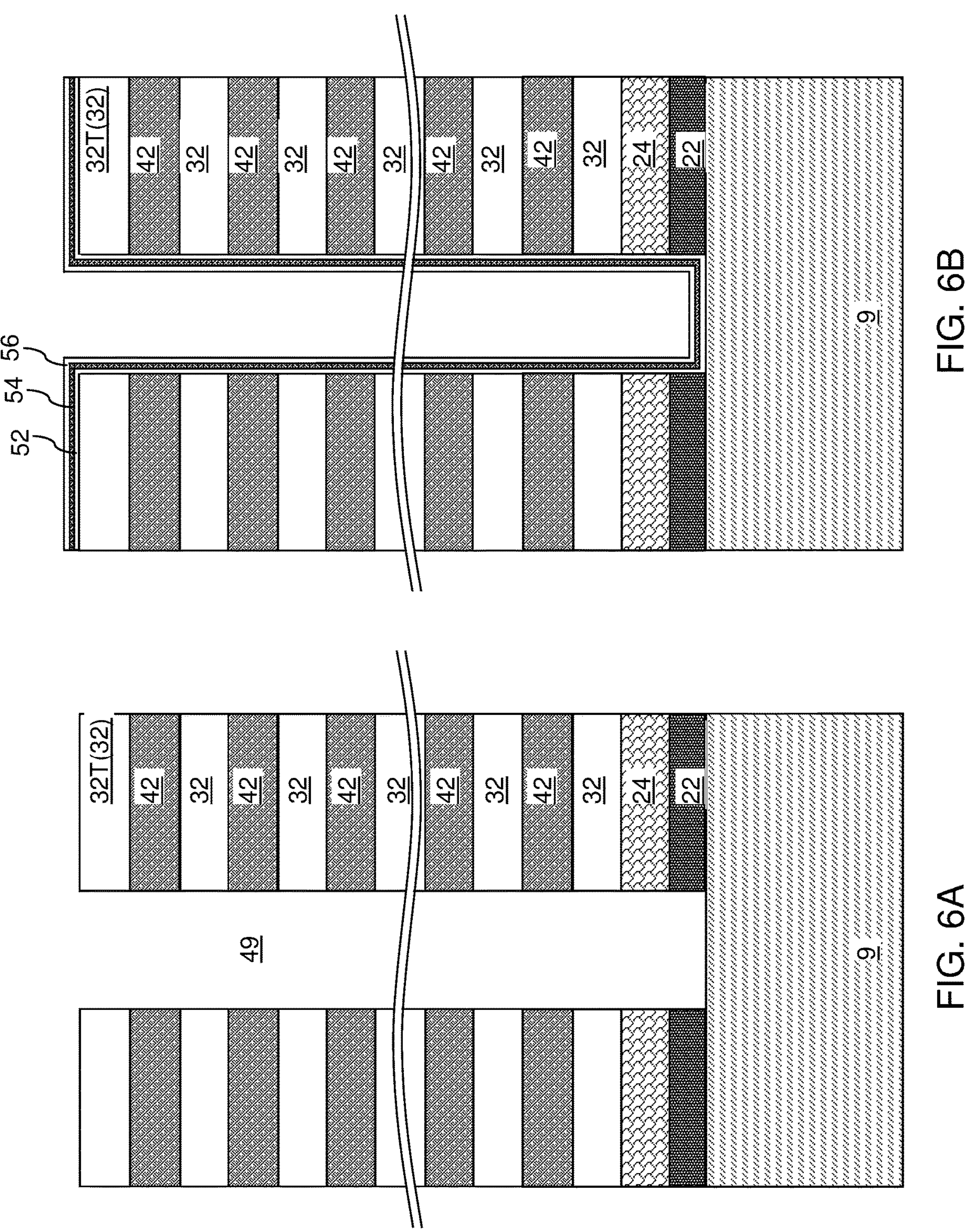
FIGS. 6A-6F are sequential vertical cross-sectional views of a memory opening during formation of a memory opening fill structure according to an embodiments of the present disclosure.

Referring to FIG. 6A, a memory opening 49 is illustrated after the processing steps of FIGS. 5A and 5B.

Referring to FIG. 6B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprises a charge storage material, the optional dielectric liner 56 may comprise a tunneling dielectric layer. The bottom surface of the blocking dielectric layer 52 may be formed at, or below, the horizontal plane including the bottom surface of the etch stop material layer 22. In one embodiment, the memory film 50 may be thinner than the etch stop material layer 22. In this embodiment, the top surface of a horizontally-extending portion of the optional dielectric liner 56 (or the memory material layer 54 in case the dielectric liner is not present) may be formed below the horizontal plane including the top surface of the etch stop material layer 22.

Figures 6C, 6D:
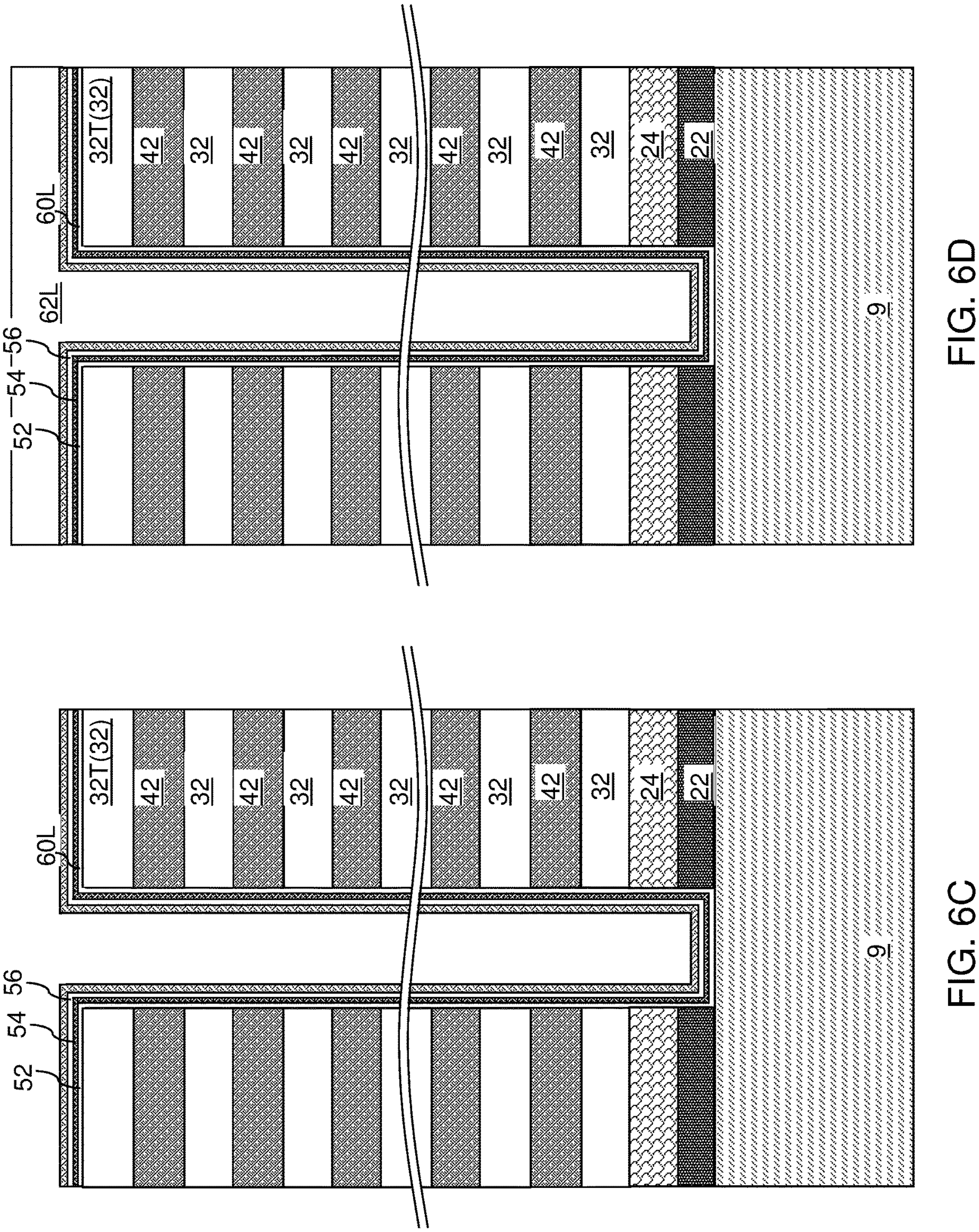

Referring to FIG. 6C, a semiconductor channel material layer 60L can be deposited over each memory film 50 by performing a conformal deposition process. If the semiconductor channel material layer 60L is doped, the semiconductor channel material layer 60L may have a doping of a first conductivity type, which may be p-type or n-type. The thickness of the semiconductor channel material layer 60L may be in a range from 5 nm to 50 nm, such as from 10 nm to 30 nm, although lesser and greater thicknesses may also be employed. In one embodiment, the combination of the memory film 50 and the semiconductor channel material layer 60L may have the same thickness as or be thinner than the etch stop material layer 22. The top surface of a horizontally-extending bottom portion of the semiconductor channel material layer 60L may be formed below, at or above, the horizontal plane including the top surface of the etch stop material layer 22.

Referring to FIG. 6D, a dielectric core layer 62L comprising a dielectric fill material, such as silicon oxide, can be deposited in remaining volumes of the memory openings 49. While the dielectric core layer 62L can be deposited employing a conformal deposition process, such as a chemical vapor deposition process, the conformity of the conformal deposition process may not be perfect. Thus, the thickness of a bottom portion of the dielectric core layer 62L at the bottom of each memory opening 49 may be less than the thickness of an upper portion of the dielectric core layer 62L at the top of each memory opening 49.

Figures 6E, 6F:
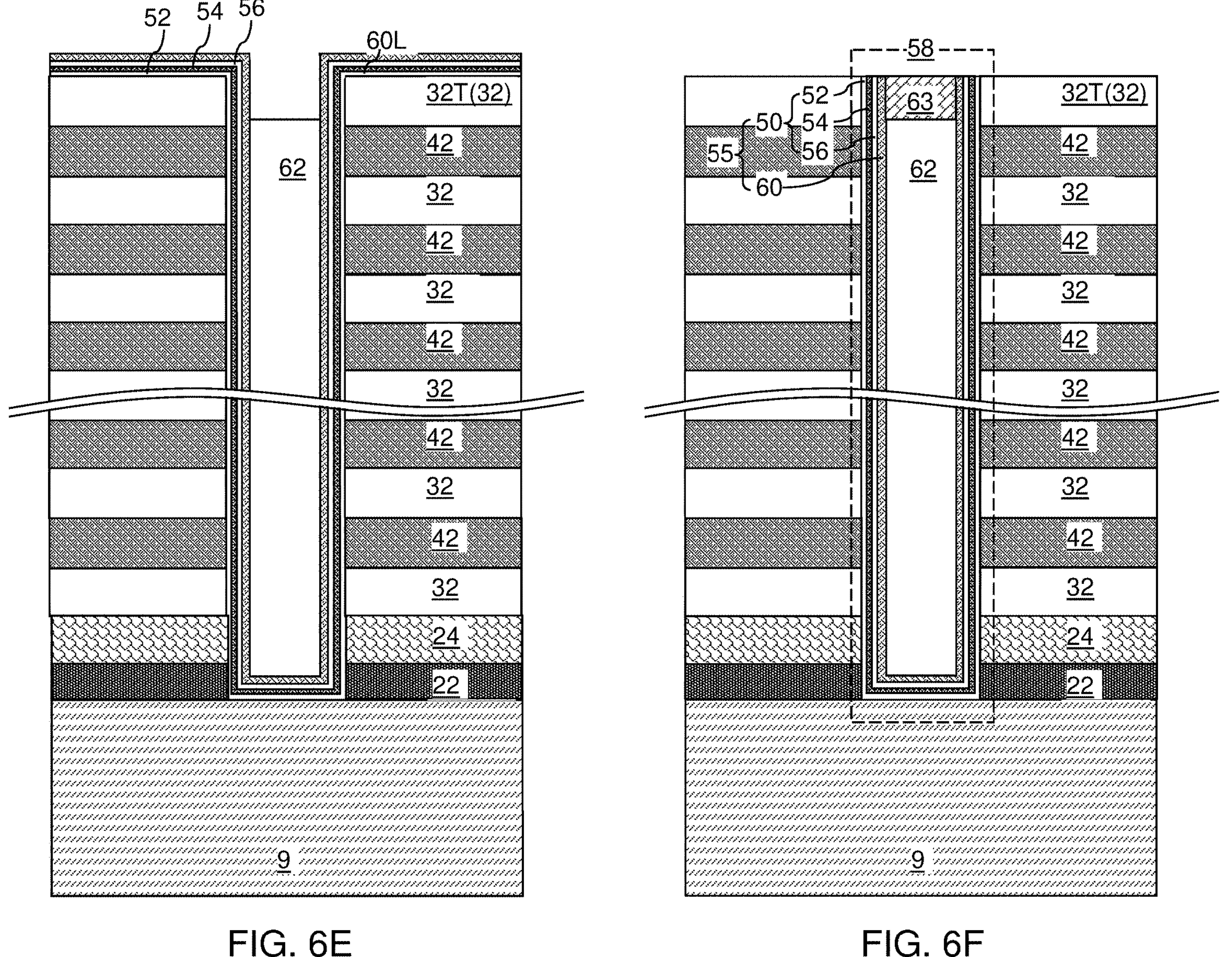

Referring to FIG. 6E, the dielectric core layer 62L can be vertically recessed such that each remaining portion of the dielectric core layer has a top surface at, or about, the horizontal plane including the bottom surface of the topmost insulating layers 32. Each remaining portion of the dielectric core layer constitutes a dielectric core 62.

Referring to FIG. 6F, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5\times10^{18}/cm^3$ to $2\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42, or generally speaking, at levels of spacer material layers that may be formed as, or may be subsequently replaced at least partly with, electrically conductive layers. In the alternative embodiment, the support pillar structures 20 may be formed in the support openings 19 at the same time as the memory opening fill structures 58 are formed in the memory openings 49. In this case, the support pillar structures 20 comprise the same materials as the memory opening fill structures 58.

Figure 7A:
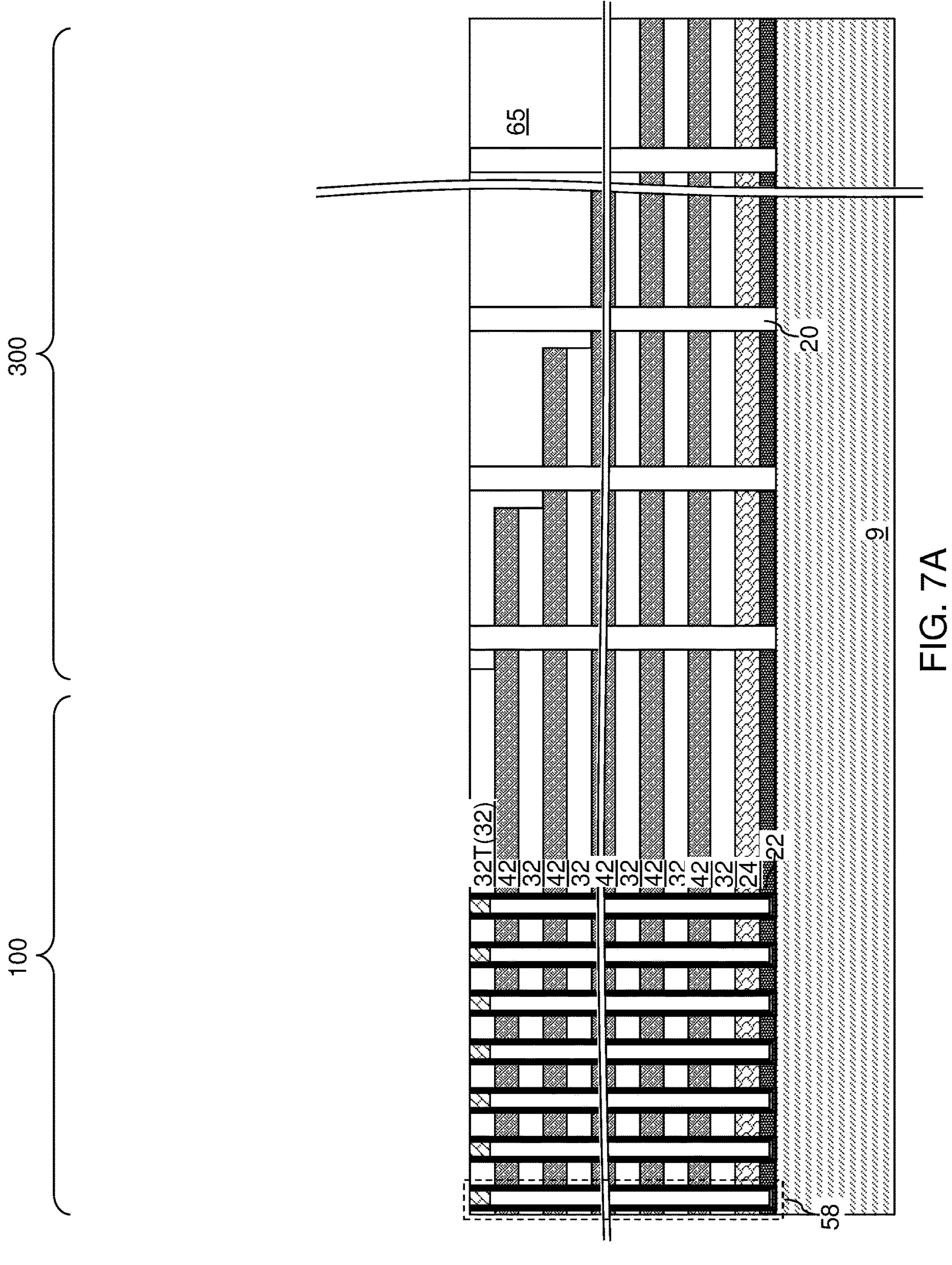
FIG. 7A is a schematic vertical cross-sectional view of the first exemplary structure after formation of memory opening fill structures according to the first embodiment of the present disclosure.
Figure 7B:
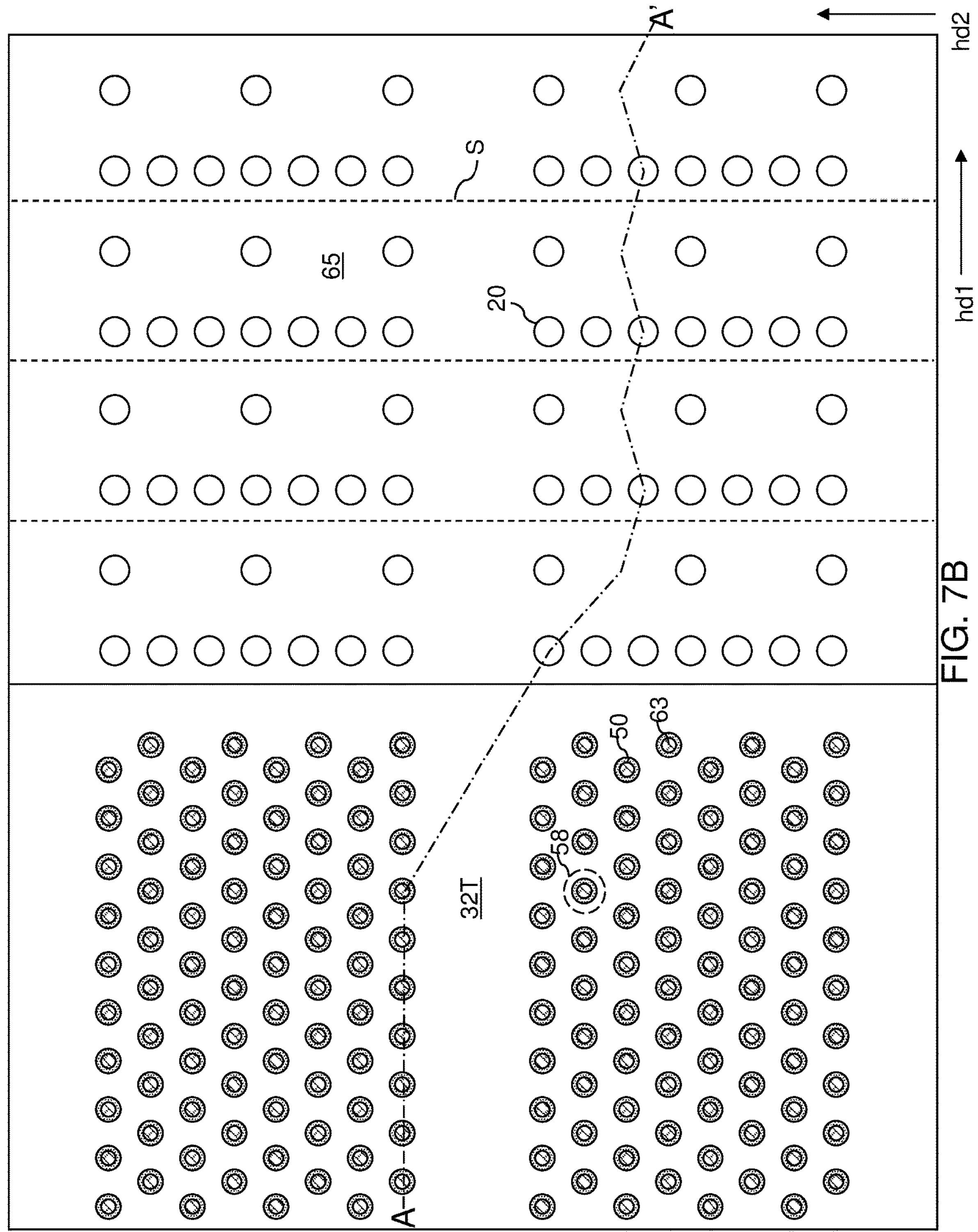
FIG. 7B is a top-down view of the first exemplary structure of FIG. 7A. The vertical plane A-A is the cut plane of the vertical cross-sectional view of FIG. 7A.

Referring to FIGS. 7A and 7B, the first exemplary structure is illustrated after formation of memory opening fill structures 58 within the memory openings 49. The memory opening fill structures 58 are located in the memory openings 49. Each of the memory opening fill structures 58 comprises a respective memory film 50 and a respective vertical semiconductor channel 60.

Figure 8A:
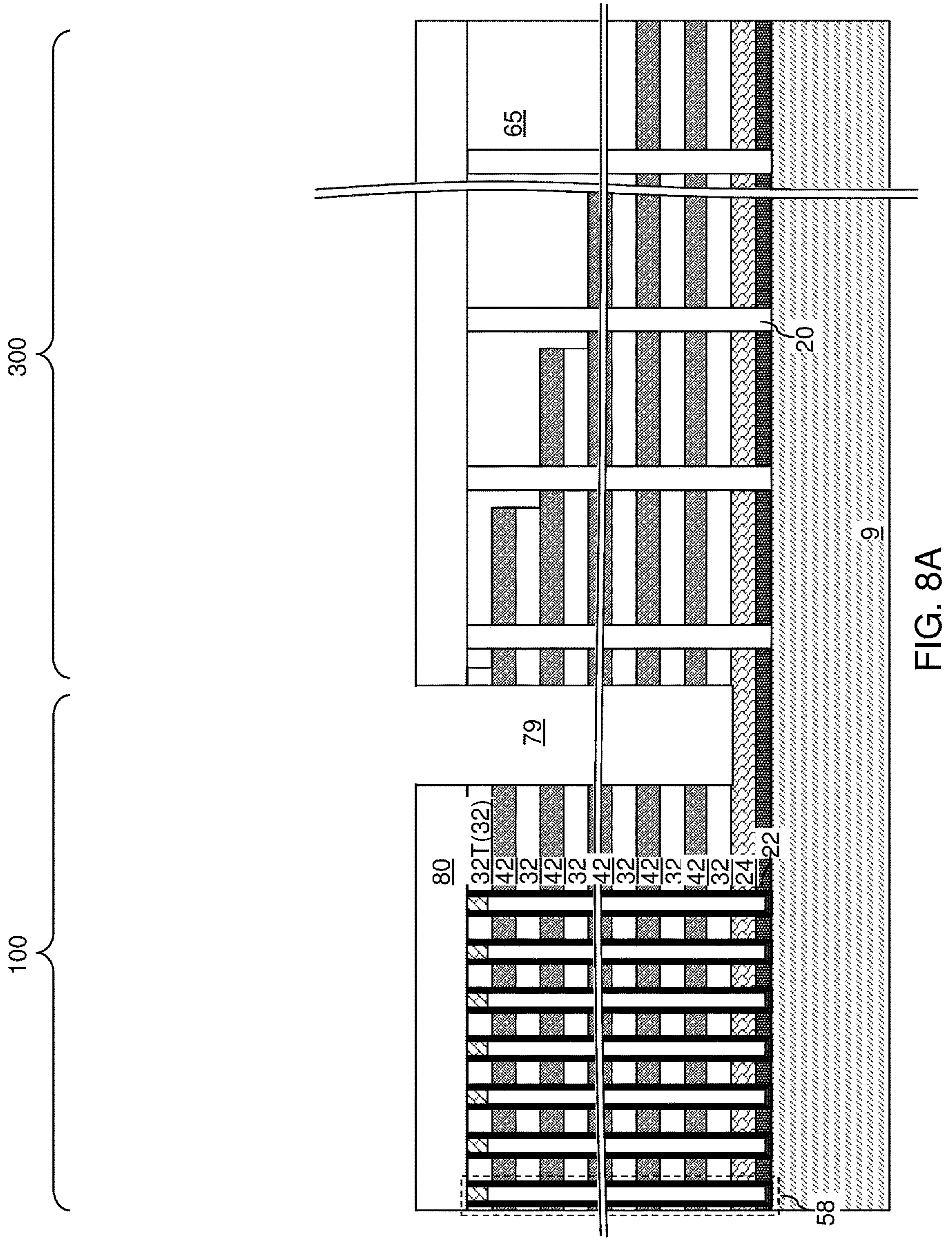
FIG. 8A is a vertical cross-sectional view of the first exemplary structure after formation of lateral isolation trenches according to the first embodiment of the present disclosure.
Figure 8B:
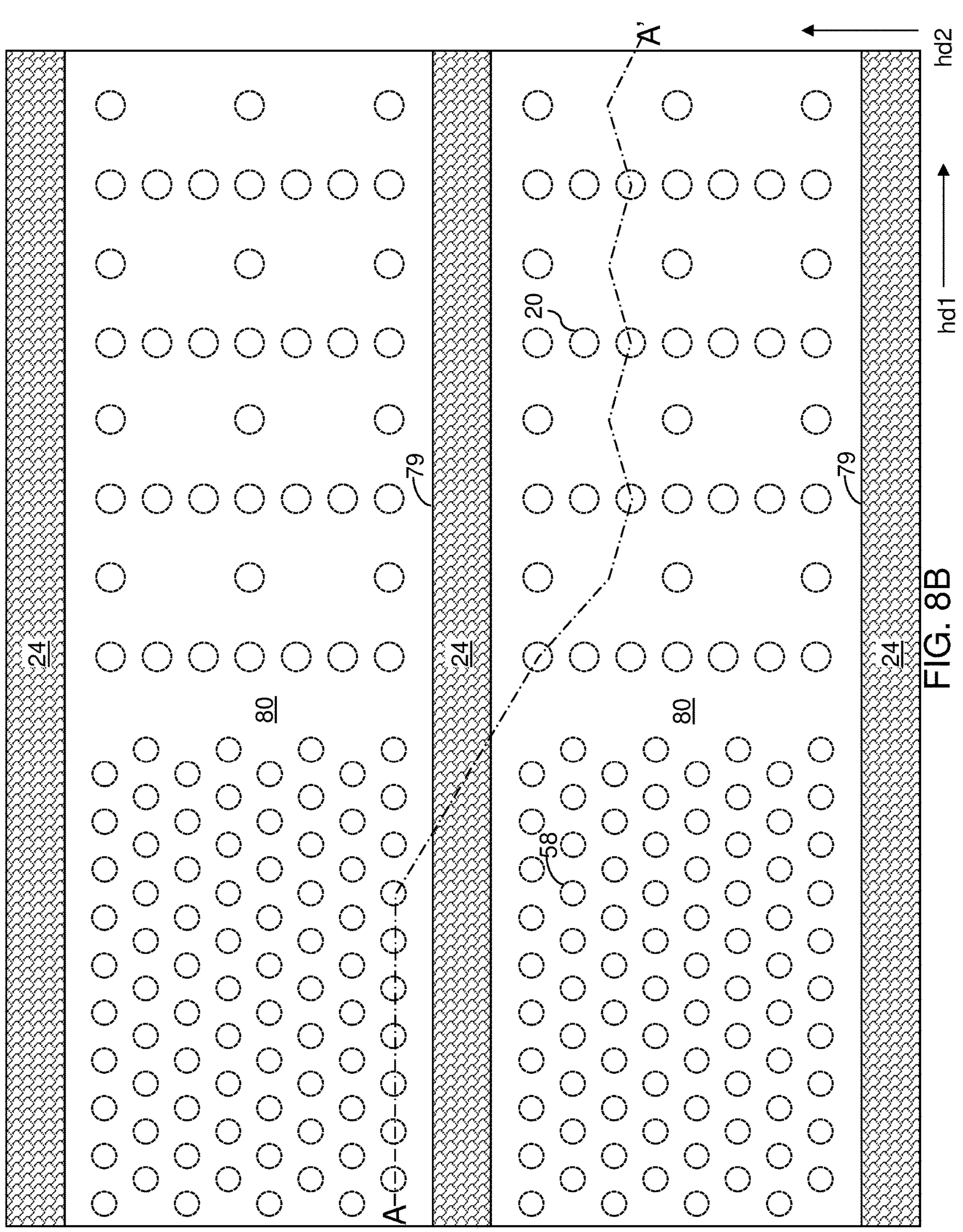
FIG. 8B is a top-down view of the first exemplary structure of FIG. 8A. The vertical plane A-A is the cut plane of the vertical cross-sectional view of FIG. 8A.

Referring to FIGS. 8A and 8B, a dielectric material, such as undoped silicate glass (i.e., silicon oxide) or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), and the stepped dielectric material portion 65, and to a top surface of the planar semiconductor layer 24. Lateral isolation trenches 79 laterally extending along the first horizontal direction hd1 can be formed through the alternating stack (32, 42), the stepped dielectric material portion 65, and the contact-level dielectric layer 80. Each of the lateral isolation trenches 79 may comprise a respective pair of lengthwise sidewalls that are parallel to the first horizontal direction hd1 and vertically extend from the top surface of the contact-level dielectric layer 80 to the top surface of the planar semiconductor layer 24. A surface of the planar semiconductor layer 24 can be physically exposed underneath each lateral isolation trench 79. The photoresist layer can be subsequently removed, for example, by ashing.

Figure 9:
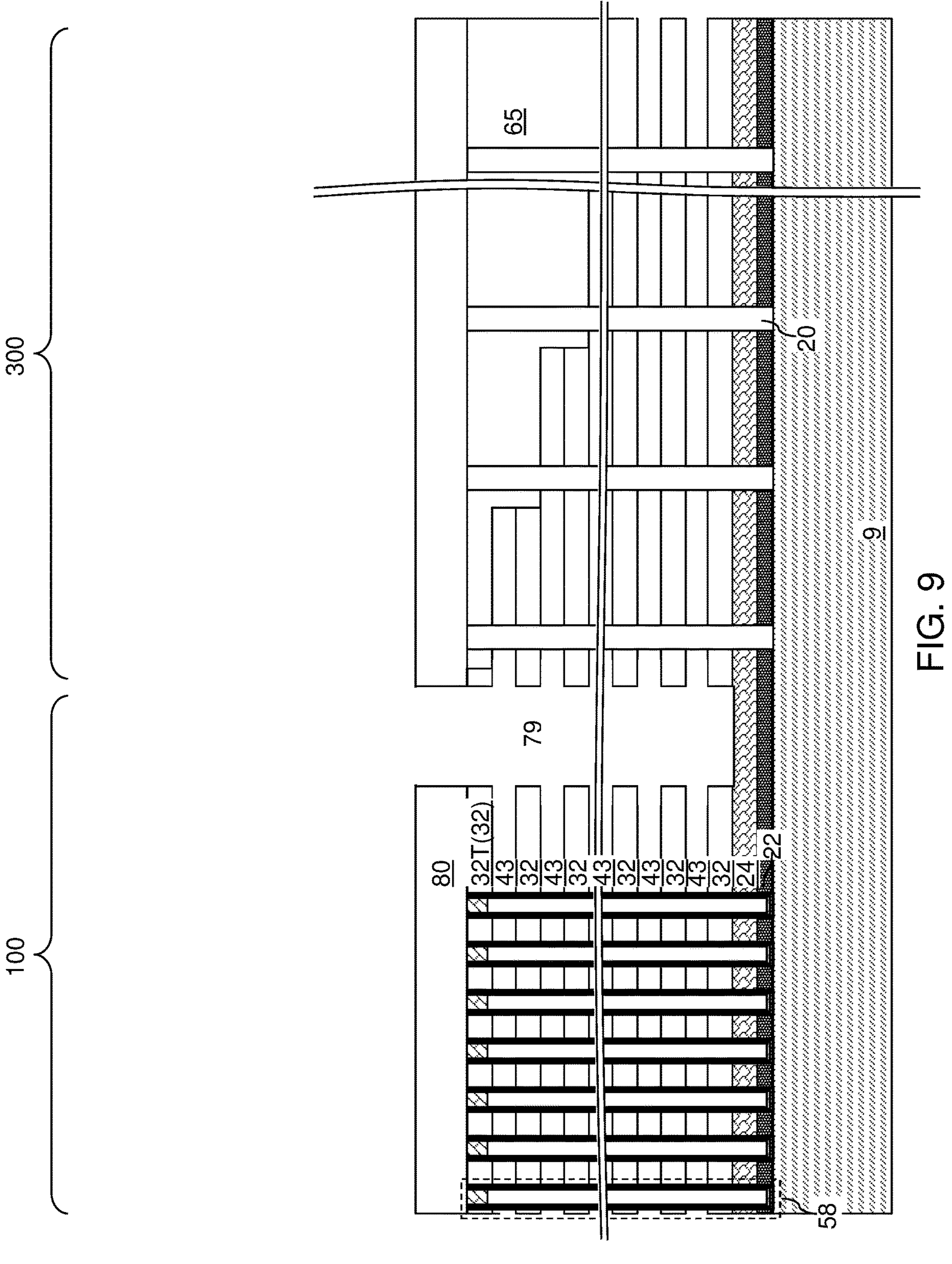
FIG. 9 is a vertical cross-sectional view of the first exemplary structure after formation of laterally-extending cavities according to the first embodiment of the present disclosure.

Referring to FIG. 9, an etchant that selectively etches the material of the sacrificial material layers 42 with respect to the material of the insulating layers 32 can be introduced into the access trenches 79, for example, employing an isotropic etch process. Lateral recesses 43 are formed in volumes from which the sacrificial material layers 42 are removed. The removal of the sacrificial material layers 42 can be selective to the materials of the insulating layers 32, the stepped dielectric material portion 65, and the material of the outermost layer of the memory films 50. In one embodiment, the sacrificial material layers 42 can include silicon nitride, and the materials of the insulating layers 32 and the stepped dielectric material portion 65 can include silicon oxide.

The etch process that removes the second material selective to the first material and the outermost layer of the memory films 50 can be a wet etch process employing a wet etch solution, or can be a gas phase (dry) etch process in which the etchant is introduced in a vapor phase into the access trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the stepped dielectric material portion 65, and the memory stack structures 55 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. The memory openings in which the memory stack structures 55 are formed are herein referred to as front side openings or front side cavities in contrast with the lateral recesses 43.

Each of the plurality of lateral recesses 43 can extend substantially parallel to the top surface of the carrier substrate 9. A lateral recess 43 can be vertically bounded by a top surface of an underlying insulating layer 32 and a bottom surface of an overlying insulating layer 32. In one embodiment, each lateral recess 43 can have a uniform height throughout.

Figure 10:
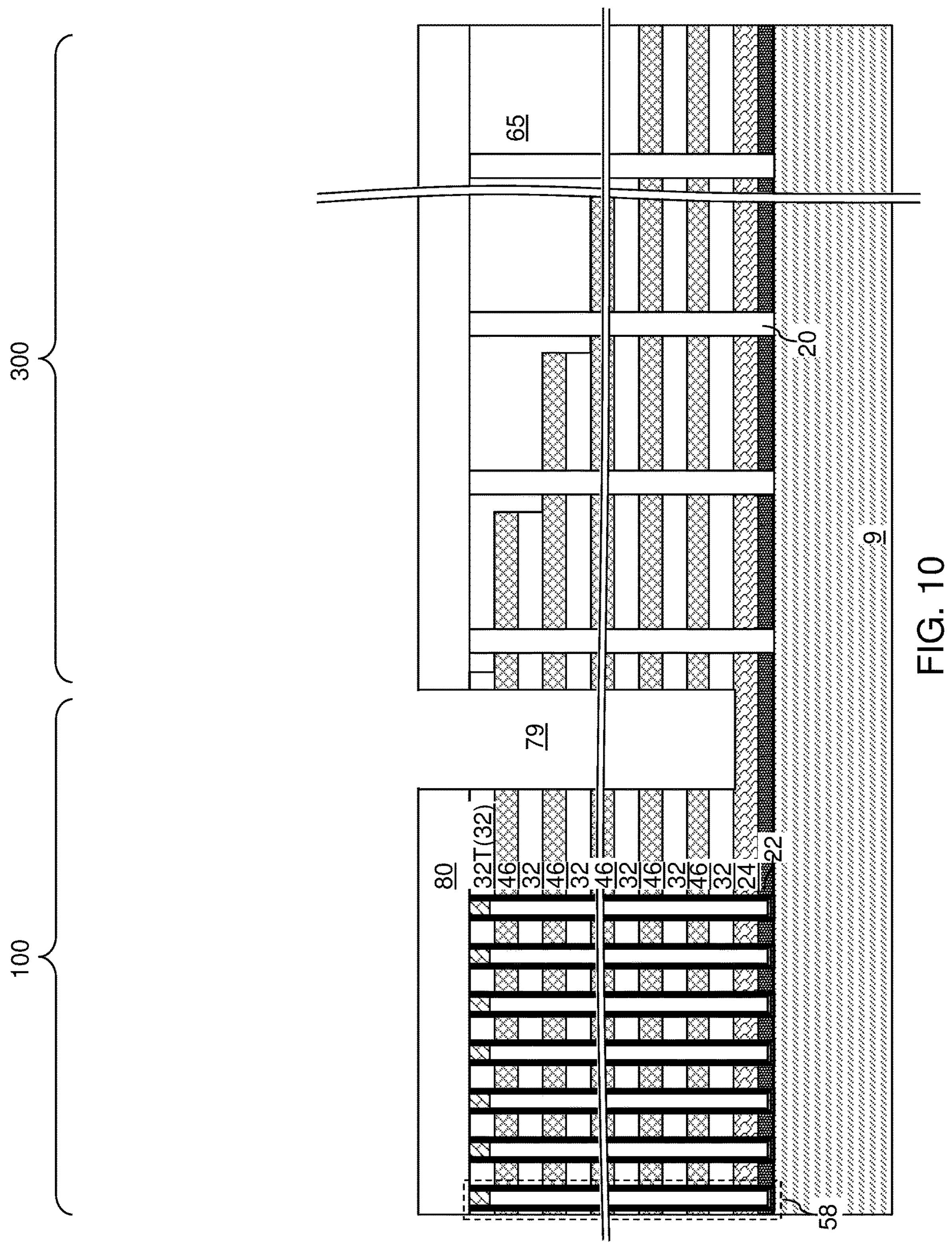
FIG. 10 is a schematic vertical cross-sectional view of the first exemplary structure after formation of electrically conductive layers according to the first embodiment of the present disclosure.

Referring to FIG. 10, an outer blocking dielectric layer (not expressly illustrated in FIG. 10) can be optionally formed. The outer blocking dielectric layer, if present, comprises a dielectric material that functions as a control gate dielectric for the control gates to be subsequently formed in the lateral recesses 43. In case the blocking dielectric layer 52 is present within each memory opening, the outer blocking dielectric layer is optional. In case the blocking dielectric layer 52 is omitted, the outer blocking dielectric layer is present.

At least one conductive material can be deposited in the lateral recesses 43 by providing at least one reactant gas into the lateral recesses 43 through the access trenches 79. A metallic barrier layer can be deposited in the lateral recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of lateral recesses 43, on the sidewalls of the at least one the access trench 79, and over the top surface of the contact-level dielectric layer 80 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of lateral recesses 43, and a continuous metallic material layer can be formed on the sidewalls of each access trench 79 and over the contact-level dielectric layer 80. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the access trenches 79 or above the contact-level dielectric layer 80.

The deposited metallic material of the continuous electrically conductive material layer is etched back from the sidewalls of each access trench 79 and from above the contact-level dielectric layer 80 by performing an isotropic etch process that etches the at least one conductive material of the continuous electrically conductive material layer. Each remaining portion of the deposited metallic material in the lateral recesses 43 constitutes an electrically conductive layer 46. Each electrically conductive layer 46 can be a conductive line structure. Thus, the sacrificial material layers 42 are replaced with the electrically conductive layers 46. Generally, the electrically conductive layers 46 can be formed by providing a metallic precursor gas into the lateral isolation trenches 79 and into the lateral recesses 43.

At least one uppermost electrically conductive layer 46 may comprise a drain side select gate electrode. At least one bottommost electrically conductive layer 46 may comprise a source side select gate electrode. The remaining electrically conductive layers 46 may comprise word lines. Each word line functions as a common control gate electrode for the plurality of vertical NAND strings (e.g., memory opening fill structures 58).

Figure 11A:
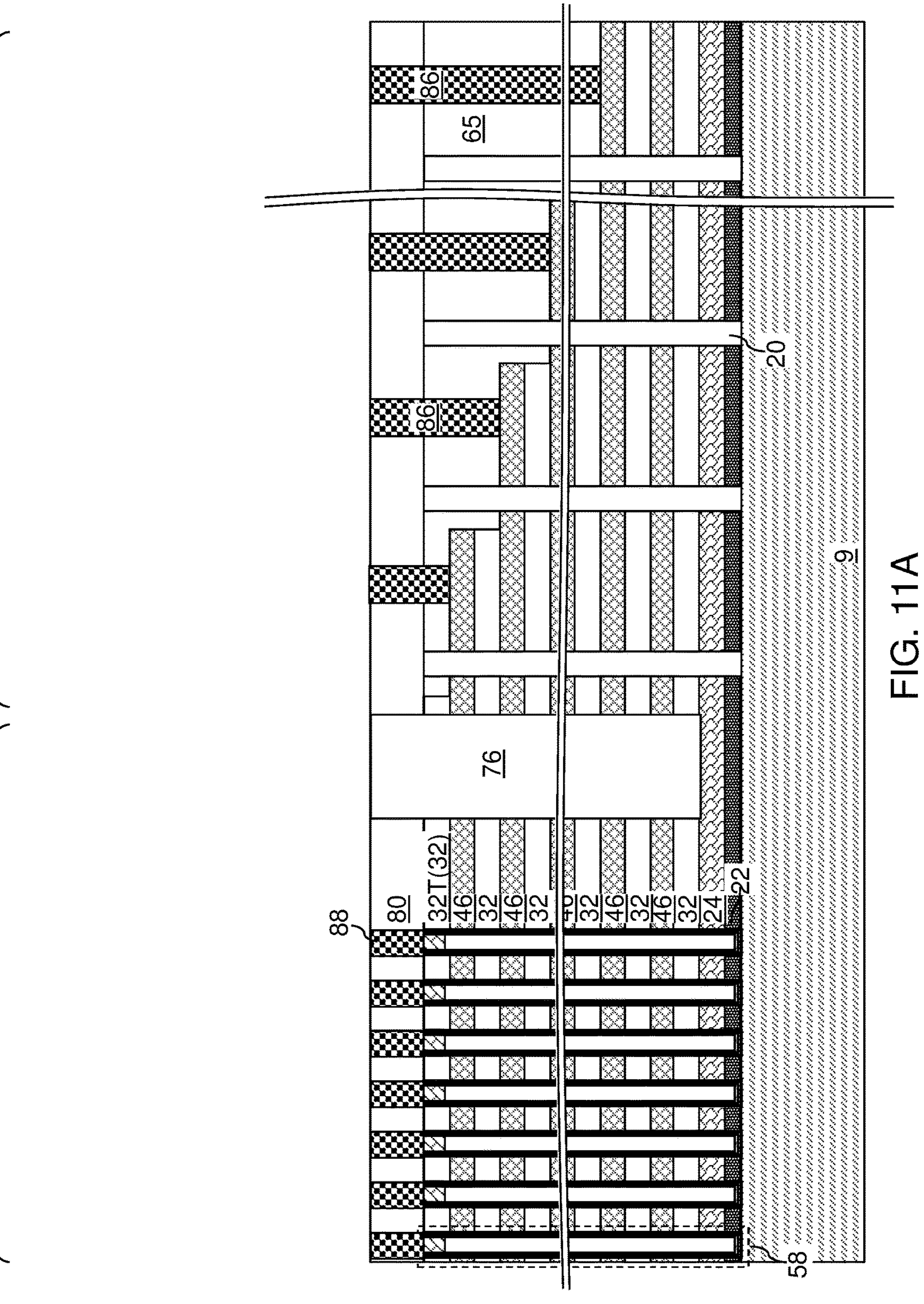
FIG. 11A is a vertical cross-sectional view of the first exemplary structure after formation of lateral isolation trench fill structures, layer contact via structures, and drain contact via structures according to the first embodiment of the present disclosure.
Figure 11B:
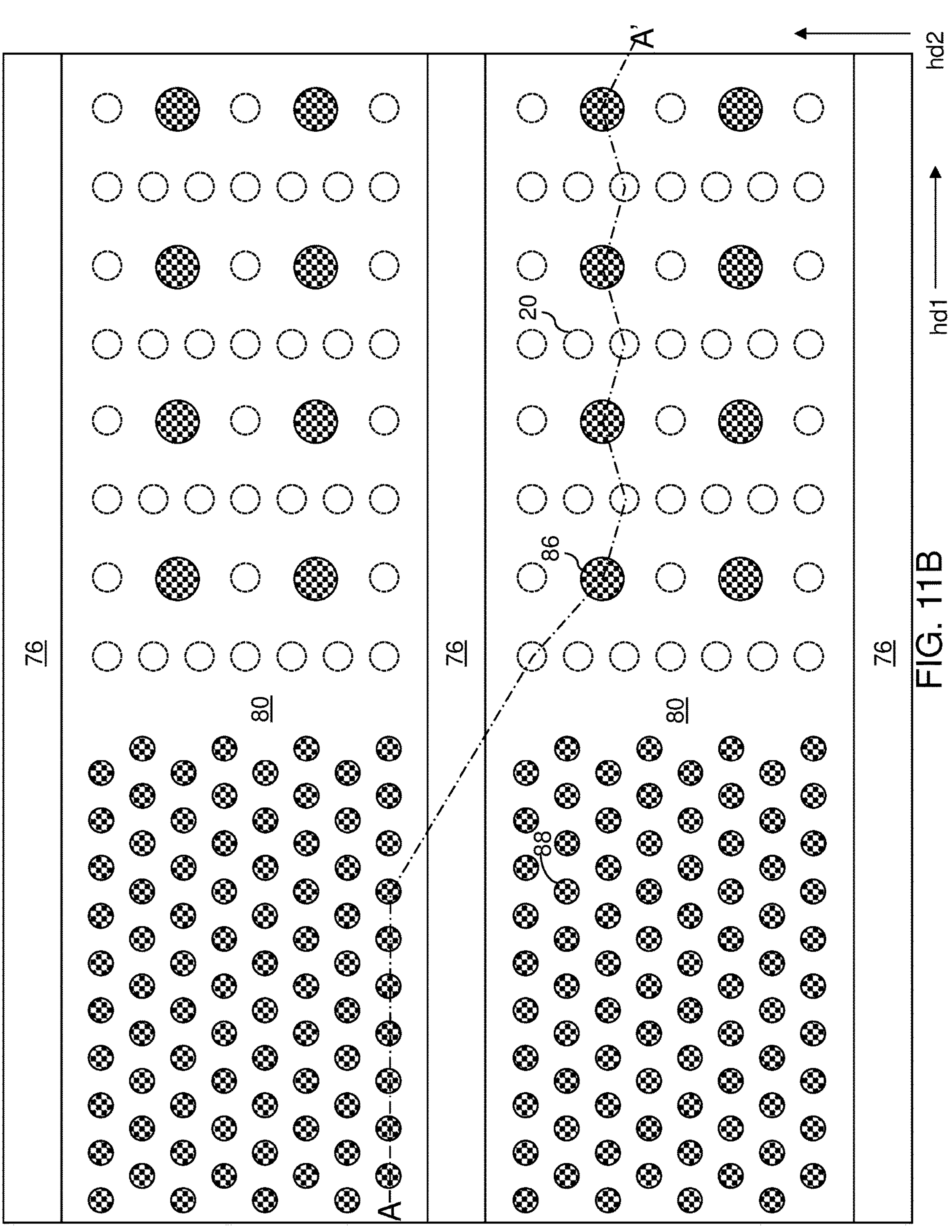
FIG. 11B is a top-down view of the first exemplary structure of FIG. 11A. The vertical plane A-A is the cut plane of the vertical cross-sectional view of FIG. 11A.

Referring to FIGS. 11A and 11B, a dielectric fill material, such as silicon oxide can be deposited in the lateral isolation trenches 79. Excess portions of the dielectric fill material can be removed from above the contact-level dielectric layer 80. Each remaining portion of the dielectric fill material that fills a respective one of the lateral isolation trenches 79 constitutes a lateral isolation trench fill structure 76, which may be a dielectric wall structure. In an alternative embodiment, an insulating spacer having a tubular configuration can be formed in peripheral portions of each of the lateral isolation trenches 79, and a through-stack conductive via structure may be formed within a respective one of the insulating spacers. In this case, each lateral isolation trench fill structure 76 may comprise a combination of a through-stack conductive via structure and an insulating spacer that laterally surrounds the through-stack conductive via structure.

Contact via structures (88, 86) can be formed through the contact-level dielectric layer 80, and optionally through the stepped dielectric material portion 65. For example, drain contact via structures 88 can be formed through the contact-level dielectric layer 80 on each drain region 63. Layer contact via structures 86 can be formed on the electrically conductive layers 46 through the contact-level dielectric layer 80, and through the stepped dielectric material portion 65.

Figure 12:
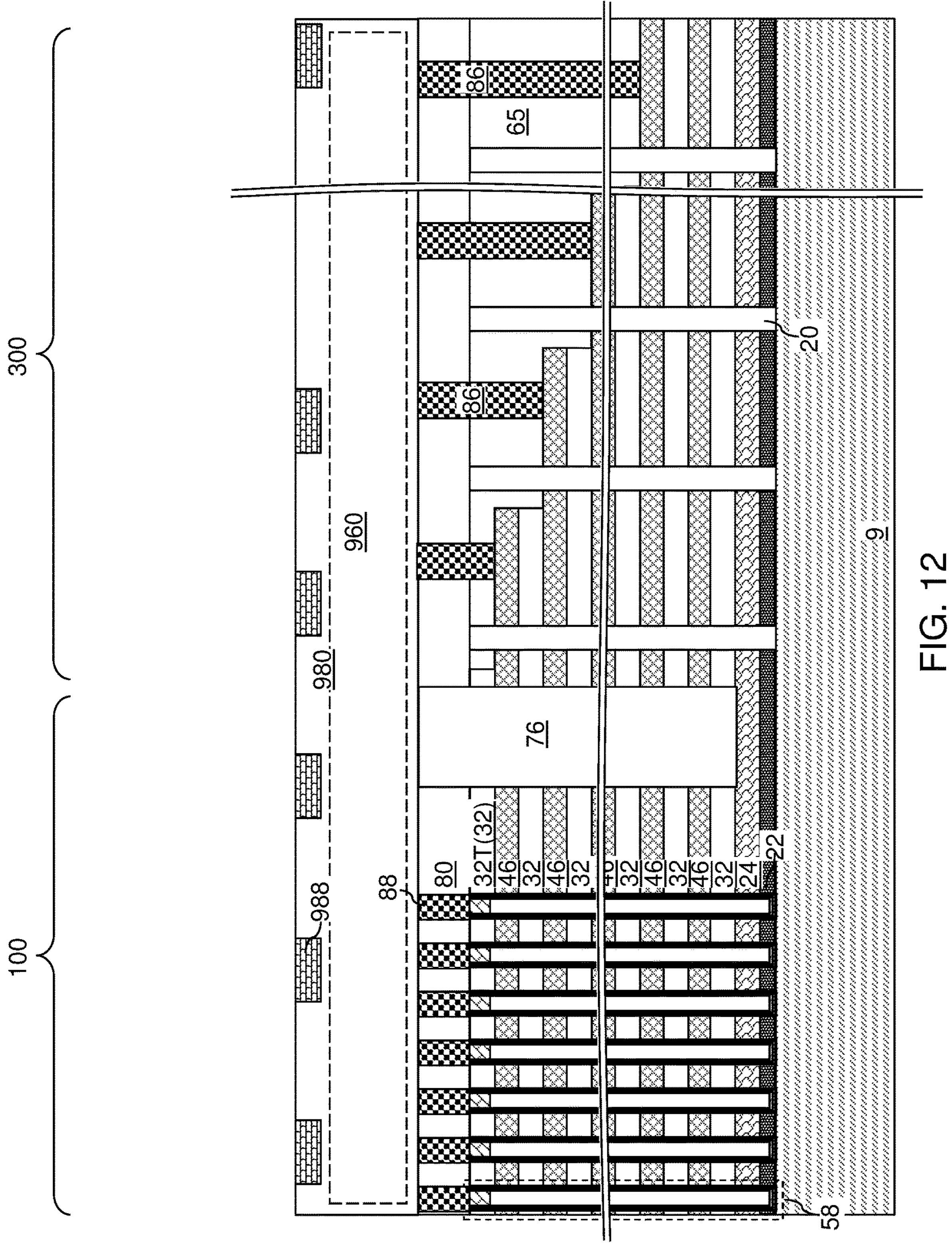
FIG. 12 is a vertical cross-sectional view of the first exemplary structure after formation of a memory die according to the first embodiment of the present disclosure.

Referring to FIG. 12, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding bit lines, which are a subset of the memory-side metal interconnect structures 980.

Metal bonding pads, which are herein referred to as upper bonding pads 988 or memory-side bonding pads 988, may be formed at the topmost level of the memory-side dielectric material layers 960. The upper bonding pads 988 may be electrically connected to the memory-side metal interconnect structures 980 and various nodes of the three-dimensional memory array including the electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array underlying the first dielectric material layer 110 and comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; and a two-dimensional array of contact via structures (such as the drain contact via structures 88) overlying the three-dimensional memory array and electrically connected to a respective one of the vertical semiconductor channels 60.

Figure 13:
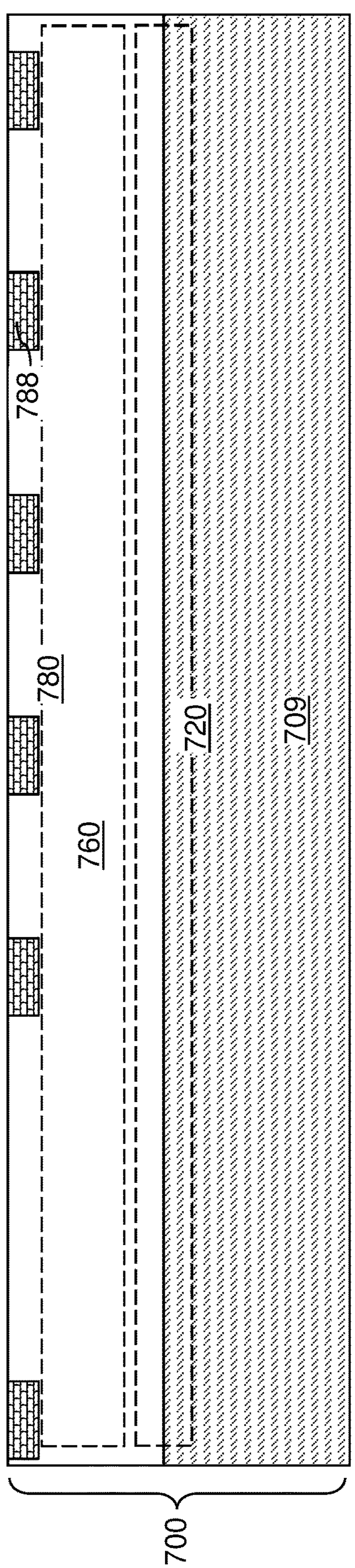
FIG. 13 is a vertical cross-sectional view of a logic die according to the first embodiment of the present disclosure.

Referring to FIG. 13, a logic die 700 can be provided. The logic die 700 includes a logic-side substrate 709, a peripheral circuit 720 located on the logic-side substrate 709 and comprising logic-side semiconductor devices (such as field effect transistors), logic-side metal interconnect structures 780 embedded within logic-side dielectric material layers 760, and logic-side bonding pads 778. The peripheral circuit 720 can be configured to control operation of the memory array within the memory die 900. Specifically, the peripheral circuit 720 can be configured to drive various electrical components within the memory array including, but not limited to, the electrically conductive layers 46, the drain regions 63, and a source contact structure to be subsequently formed. The peripheral circuit 720 can be configured to control operation of the vertical stack of memory elements in the memory array in the memory die 900.

Figure 14:
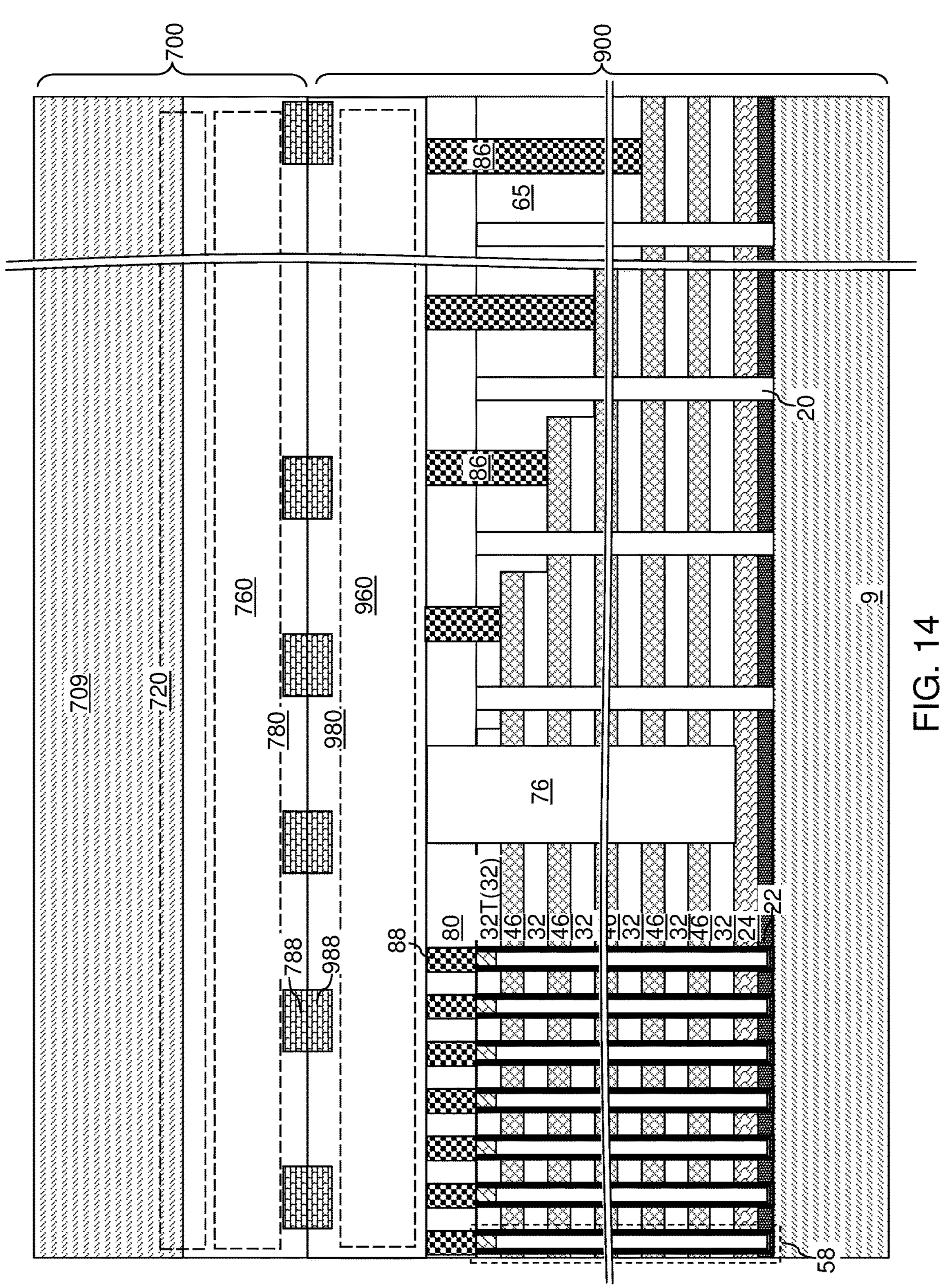
FIG. 14 is a vertical cross-sectional view of the first exemplary structure after attaching the logic die to the memory die according to the first embodiment of the present disclosure.

Referring to FIG. 14, the logic die 700 can be attached to the memory die 900, for example, by bonding the logic-side bonding pads 788 to the memory-side bonding pads 988 at a bonding interface. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 15A:
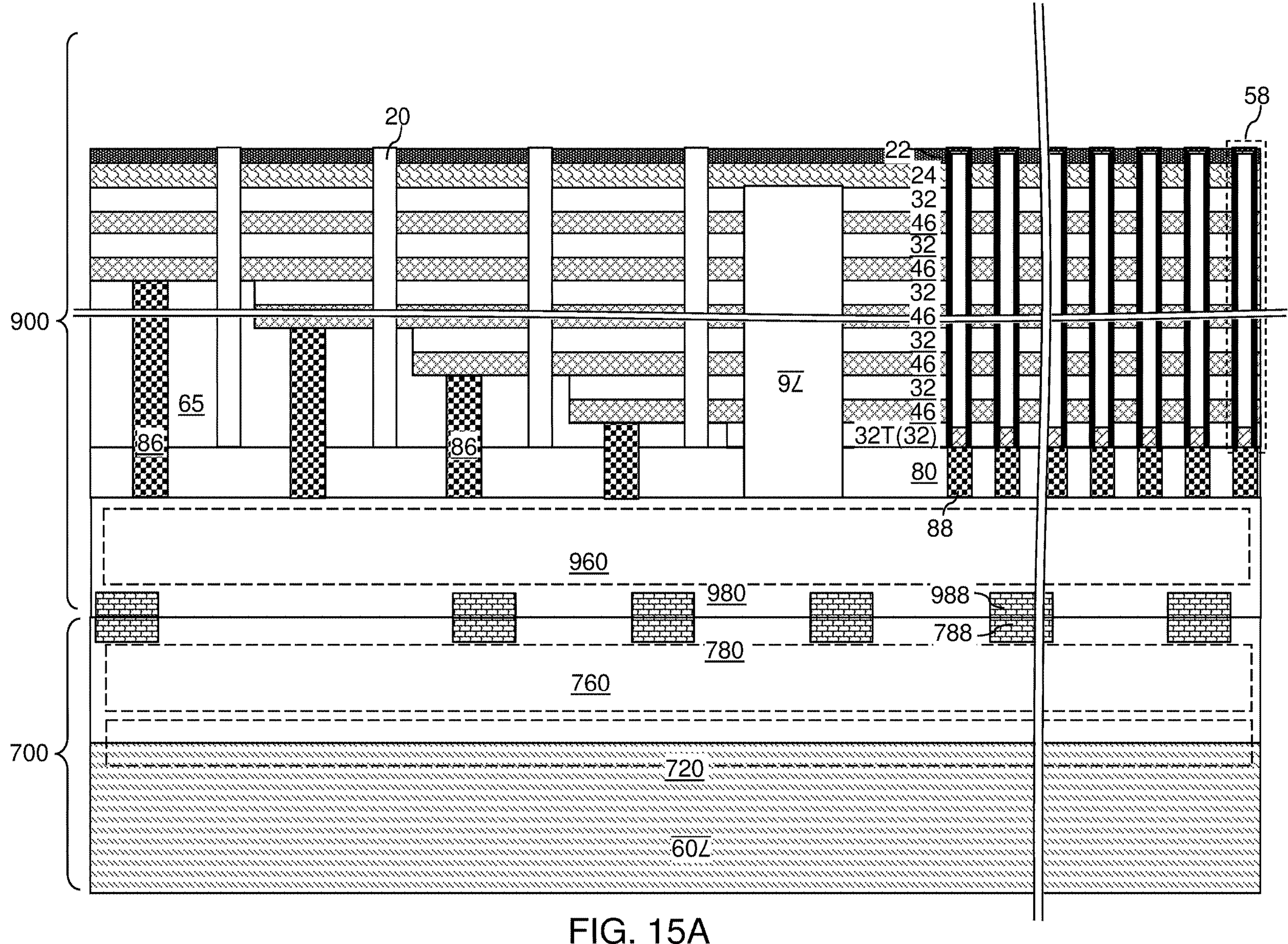
FIG. 15A is a vertical cross-sectional view of the first exemplary structure after removal of the carrier substrate according to the first embodiment of the present disclosure.
Figure 15B:
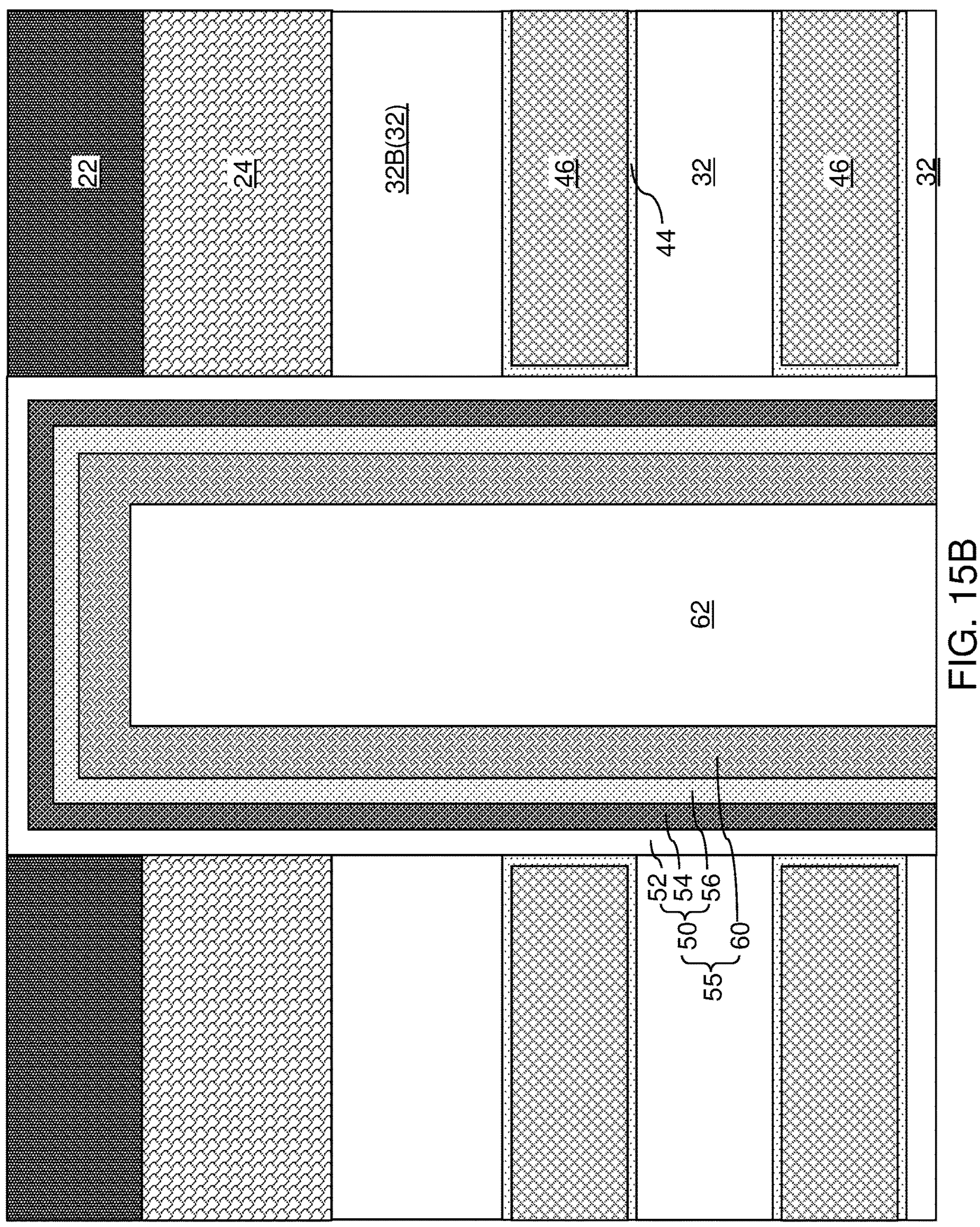
FIG. 15B is a magnified view of region B of FIG. 15A.

Referring to FIGS. 15A and 15B, the carrier substrate 9 can be removed, for example, by grinding, polishing, cleaving, an isotropic etch process, an anisotropic etch process, and/or a combination thereof. If a chemical mechanical polishing process or an etch process is employed as a terminal step for removing the carrier substrate 9, the etch stop material layer 22 may be employed as a polish stop or etch stop, respectively.

In one embodiment, at least a terminal step of at least one removal process that is employed to remove the carrier substrate 9 may comprise a selective wet etch process that etches the material of the carrier substrate 9 (such as a semiconductor material of the carrier substrate 9) selective to dielectric materials of the memory films 50. In an illustrative example, if the carrier substrate 9 comprises a semiconductor material, the terminal step of the at least one removal process may comprise a wet etch process using hot trimethyl-2 hydroxyethyl ammonium hydroxide ("hot TMY") or tetramethyl ammonium hydroxide (TMAH). The entirety of the carrier substrate 9 can be removed by the selective wet etch process. Backside end surfaces of the support pillar structures 20 can be physically exposed upon removal of the carrier substrate 9. Optional outer blocking dielectric layers 44 are illustrated in FIG. 15B, each of which embeds a respective electrically conductive layer 46. Alternatively, the optional outer blocking dielectric layers 44 may be omitted.

FIGS. 16A-16D are sequential vertical cross-sectional views of a region of a first configuration of the first exemplary structure during formation of a backside semiconductor source structure according to the first embodiment of the present disclosure.

Figure 16A:
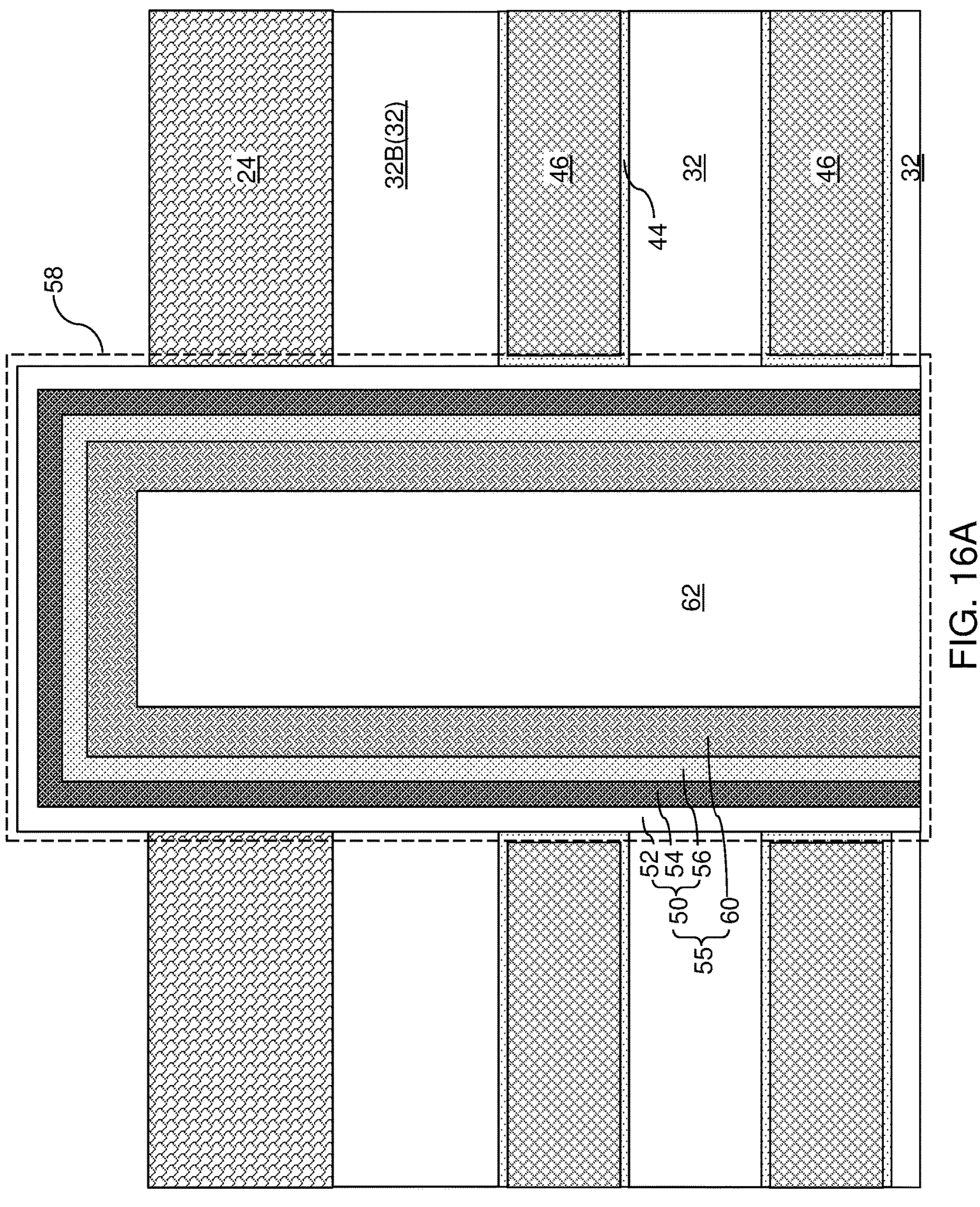
FIGS. 16A-16D are sequential vertical cross-sectional views of a region of a first configuration of the first exemplary structure during formation of a backside semiconductor source structure according to the first embodiment of the present disclosure.

Referring to FIG. 16A, the etch stop material layer 22 can be removed selective to the material of the planar semiconductor layer 24 by performing an ashing process (if the etch stop material layer 22 comprises a carbon layer), a selective wet etch process or a selective atomic layer etch (ALE) process. The etch chemistry of the selective wet etch process or the selective ALE process may be selected depending on the material of the etch stop material layer 22 and the planar semiconductor layer 24. In one embodiment, the selective wet etch process or the selective ALE process may etch the etch stop material layer 22 selective to at least one material of the memory film 50, such as the material of the blocking dielectric layer 52. In one embodiment, the etch stop material layer 22 may be removed without physically exposing any portion of the vertical semiconductor channel 60.

Figure 16B:
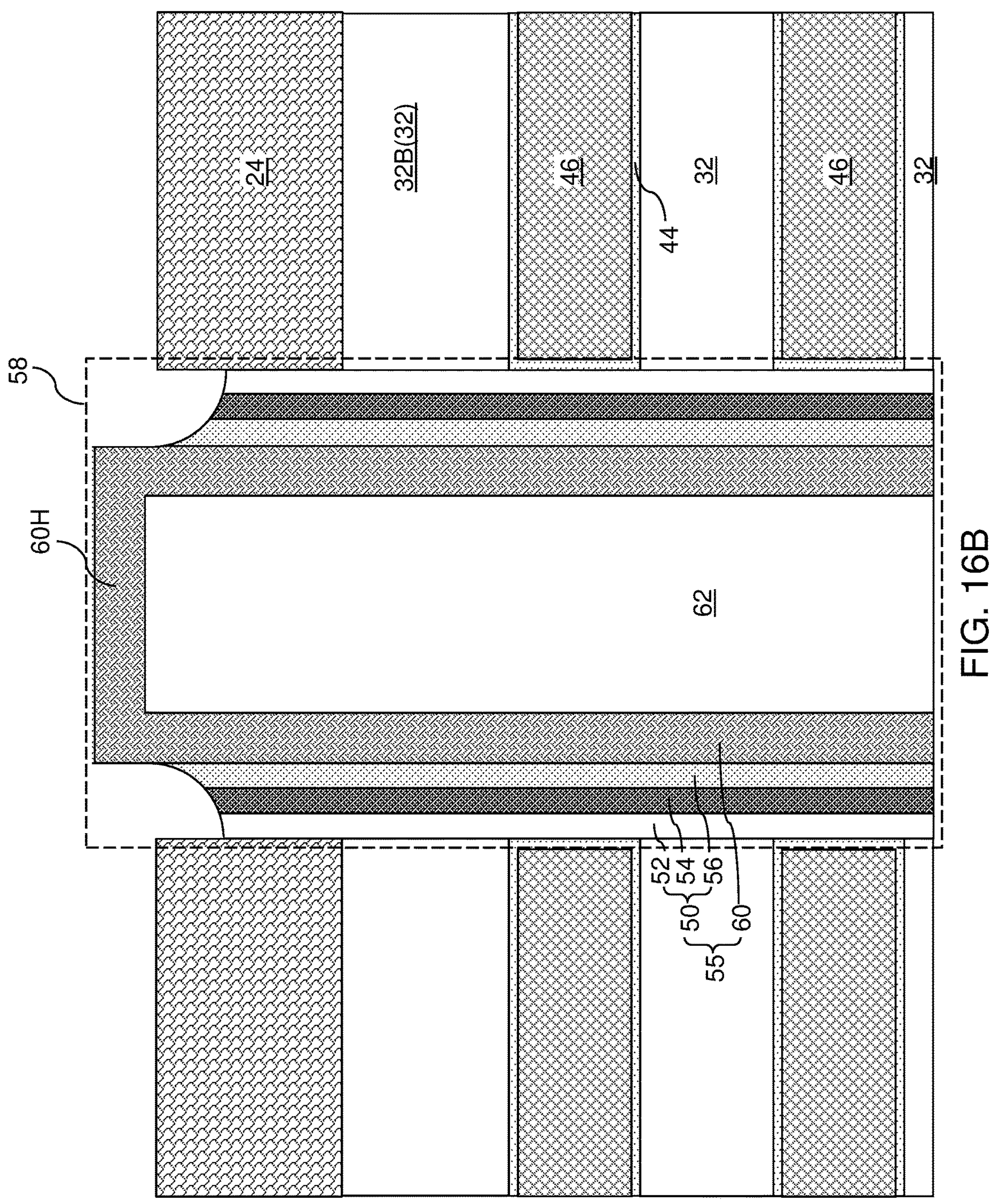

Referring to FIG. 16B, an end portion of each memory opening fill structure 58 can be removed. In one embodiment, an end portion of each memory film 50 may be removed by performing a sequence of wet etch processes. A horizontal end portion 60H of each vertical semiconductor channel 60 may be physically exposed. In one embodiment, the sequence of wet etch processes may be selective to the material of the vertical semiconductor channels 60. In summary, the horizontal surface the horizontal end portion 60H of each vertical semiconductor channel 60 may be physically exposed by removing an end portion of the memory film 50 selective to the vertical semiconductor channels 60.

Figure 16C:
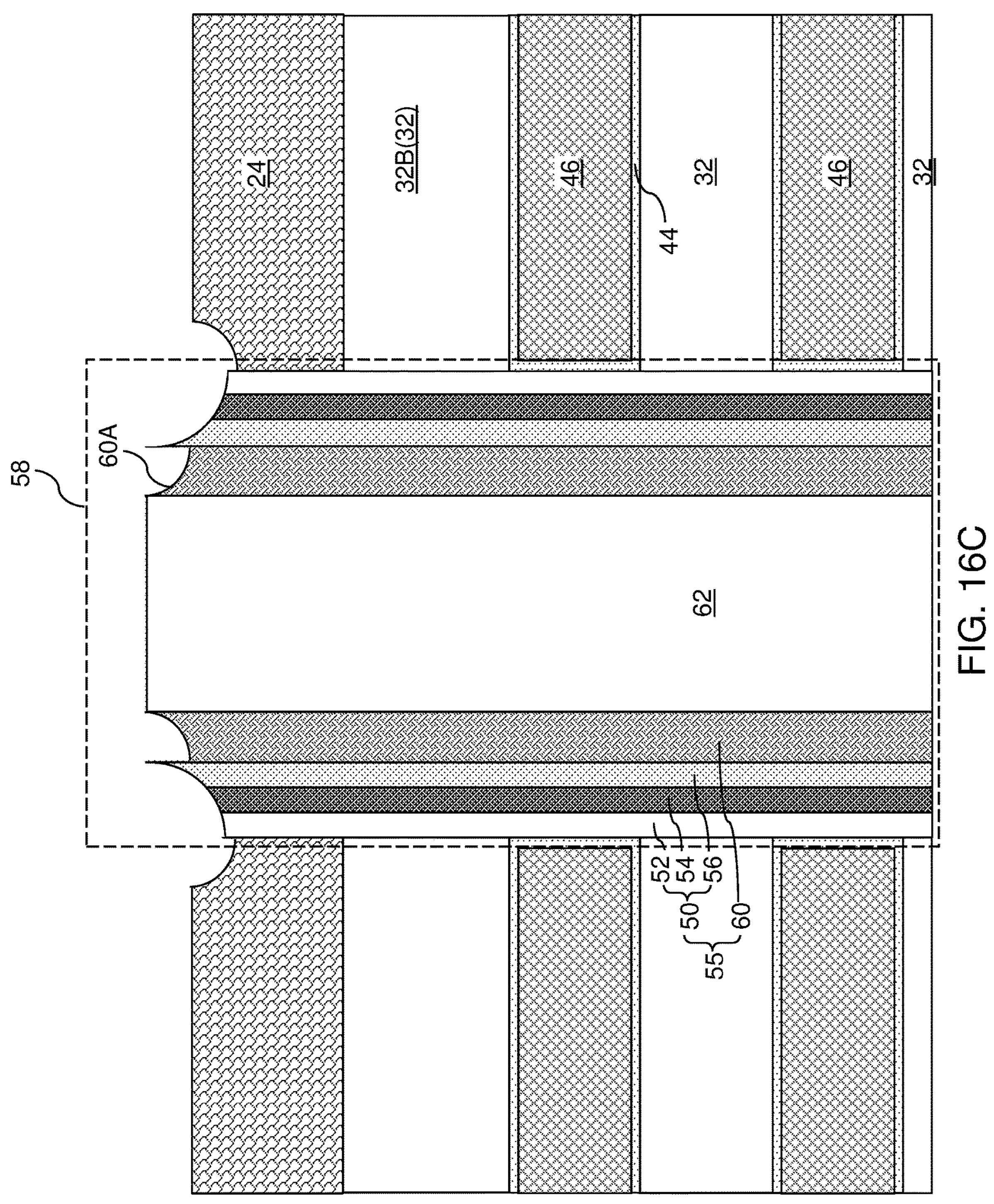

Referring to FIG. 16C, a selective wet etch process may be optionally performed to remove the physically exposed horizontal end portions 60H of the vertical semiconductor channels 60 and to reduce a thickness of the planar semiconductor layer 24. Thus, the thickness of the planar semiconductor layer 24 may decrease during the selective wet etch process. An end surface of each dielectric core 62 can be physically exposed after the selective wet etch process. Further, each of the vertical semiconductor channels 60 may have a tubular configuration after the selective wet etch process. Generally, an end surface of each vertical semiconductor channel 60 and a backside surface of the planar semiconductor layer 24 can be physically exposed. In one embodiment, each physically exposed end surface of the vertical semiconductor channels 60 may comprise an annular surface 60A. In the first configuration illustrated in FIGS. 16A-16C, the etch stop material layer 22 can be removed by performing an etch process that etches the etch stop material layer 22 selective to the vertical semiconductor channel 60 and the planar semiconductor layer 24 before the horizontal end portion 60H of each vertical semiconductor channel 60 is removed. In one embodiment, the horizontal end portion 60H of each vertical semiconductor channel 60 may be removed after physically exposing the horizontal end surface of each vertical semiconductor channel 60 after the step of FIG. 16B. Then, the annular surface 60A of each vertical semiconductor channel 60 is formed and is physically exposed around a sidewall of a respective dielectric core 62 after the step of FIG. 16C.

Figure 16D:
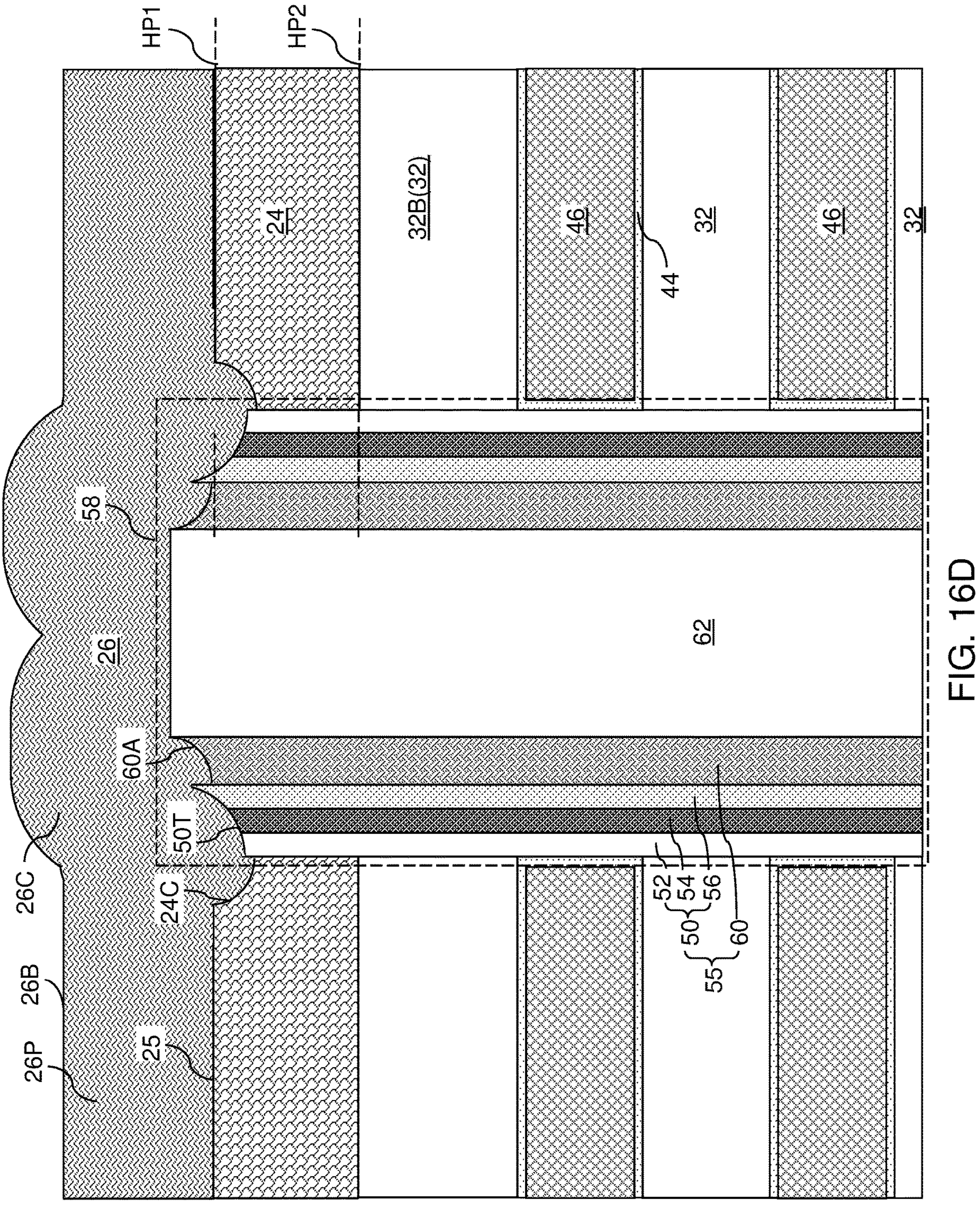

Referring to FIG. 16D, a backside semiconductor source structure 26 can be selectively grown from physically exposed surfaces (e.g., from the annular surface 60A) of the vertical semiconductor channels 60 and the planar semiconductor layer 24. In one embodiment, the backside semiconductor source structure 26 may be selectively grown laterally (e.g., in the horizontal direction) over the exposed surfaces of memory film 50 and the dielectric core 62 using the annular surface 60A of the vertical semiconductor channels 60 and the planar semiconductor layer 24 as a seed (e.g., as seed layers for selective growth).

In one embodiment, the backside semiconductor source structure 26 may be deposited by a chemical vapor deposition process employing a semiconductor precursor gas containing a plurality of atoms of a semiconductor element per molecule, in order to deposit the backside semiconductor source structure 26 at a lower temperature. For example, if the backside semiconductor source structure 26 comprises a silicon layer, then the semiconductor precursor gas contains at least two silicon atoms per molecule. Examples of such gases include disilane, trisilate, tetrasilane, isotetrasilane and neopentasilane. In contrast, silane ($SiH_4$) includes only one silicon atom per molecule.

According to an aspect of the present disclosure, the chemical vapor deposition may be performed at a temperature that does not significantly degrade the copper bonding pads and interconnects in the bonded assembly of the memory die 900 and the logic die 700, such as a temperature of 500 degrees Celsius or less. For example, the chemical vapor deposition process may be performed at a temperature in a range from 300 degrees Celsius to 425 degrees Celsius, such as from 350 degrees Celsius to 400 degrees Celsius for germanium containing layers and at a temperature in a range from 400 degrees Celsius to 500 degrees Celsius, such as from 400 degrees Celsius to 450 degrees Celsius for silicon layers.

In one embodiment, the backside semiconductor source structure 26 comprises, and/or consists of a silicon-based semiconductor material, a germanium-based semiconductor material, a silicon-germanium compound semiconductor material, or a stack thereof. Silicon precursor gases including a single silicon atom per molecule are typically used in higher temperature silicon deposition processes. For example, silicon layers deposited using silane, dichlorosilane, trichlorosilane, or silicon tetrachloride are deposited by CVD at temperatures higher than 500 degrees Celsius. According to an aspect of the present disclosure, a high order silicon-precursor gas, such as $Si_2H_6$, $Si_3H_8$, $Si_4H_{10}$, $SiH(SiH_3)_3$, and/or $Si(SiH_3)_4$ may be employed to deposit a silicon layer at a temperature of 500 degrees Celsius or less. Furthermore, germanium hydride precursor gases such as $GeH_4$, $Ge_2H_6$, and $Ge_3H_8$ are conducive to low-temperature nucleation. Higher order germane gases, such as $Ge_2H_6$ and $Ge_3H_8$ may be used to deposit a germanium-based material at a lower temperature than a temperature required for a germanium deposition process employing $GeH_4$. Both silicon-precursor gas and germanium-precursor gas may be used to deposit silicon-germanium compound semiconductor layers.

Generally, the backside semiconductor source structure 26 is doped with electrical dopants of the second conductivity type either through in-situ doping during deposition or by performing an ion implantation process after a semiconductor deposition process that deposits an undoped semiconductor material. The backside semiconductor source structure 26 as deposited may comprise and/or may consist essentially of undoped silicon, undoped germanium or undoped silicon-germanium; doped silicon, doped germanium or doped silicon-germanium including dopants of the second conductivity type; a layer stack including an undoped or doped silicon, germanium or silicon-germanium layer in contact with the vertical semiconductor channels 60 and an undoped or doped silicon, germanium or silicon-germanium layer that is spaced from the vertical semiconductor channels 60. For example, the layer stack may include a lower undoped semiconductor layer in contact with the vertical semiconductor channels 60 and an upper doped semiconductor layer that is spaced from the vertical semiconductor channels 60. If the layer stack includes both silicon and germanium layers, then an optional silicon-germanium layer may be located between them. If present in the backside semiconductor source structure 26, the silicon-germanium alloy layer may optionally include grading in the atomic percentage of germanium that decreases or increases with a distance from the vertical semiconductor channels.

In one embodiment, the backside semiconductor source structure 26 as deposited may comprise an amorphous semiconductor material. In this case, the backside semiconductor source structure 26 is converted into a polycrystalline semiconductor material in a subsequent laser anneal process that electrically actives electrical dopants (such as dopants of the second conductivity type). Alternatively, the backside semiconductor source structure 26 may be deposited as a polycrystalline semiconductor material. In this case, the average grain size of the polycrystalline semiconductor material in the backside semiconductor source structure 26 may increase during a subsequently laser anneal process that activates the electrical dopants in the backside semiconductor source structure 26.

Generally, the backside semiconductor source structure 26 may be deposited directly on an end surface of each vertical semiconductor channel 60 that is not vertical. The semiconductor material of the backside semiconductor source structure 26 is herein referred to as a third semiconductor material. The backside semiconductor source structure 26 contacts each of the vertical semiconductor channels 60, and contacts the planar semiconductor layer 24. The thickness of the horizontally-extending portion of the backside semiconductor source layer 26 may be in a range from 30 nm to 300 nm, although lesser and greater thicknesses may also be employed. The atomic concentration of dopants of the second conductivity type in the backside semiconductor source structure 26 may be in a range from $5\times10^{18}/cm^3$ to $2\times10^{21}/cm^3$, such as from $1\times10^{19}/cm^3$ to $1\times10^{21}/cm^3$, although lesser and greater atomic concentrations may also be employed.

In one embodiment, each dielectric core 62 may comprise an end portion that protrudes farther away from the alternating stack (32, 46) than a first horizontal plane HP1 including a horizontal interface 25 between the planar semiconductor layer 24 and the backside semiconductor source structure 26. Alternatively, each dielectric core 62 may comprise an end surface that is more proximal to the alternating stack (32, 46) than the first horizontal plane HP1 including the horizontal interface 25 between the planar semiconductor layer 24 and the backside semiconductor source structure 26 is to the alternating stack (32, 46). Yet alternatively, each dielectric core 62 may comprise an end surface contained within the first horizontal plane HP1 including the horizontal interface 25 between the planar semiconductor layer 24 and the backside semiconductor source structure 26.

The horizontal interface 25 may comprise a horizontal discontinuity in the grain structure between the polycrystalline semiconductor materials of the planar semiconductor layer 24 and the backside semiconductor source structure 26, a horizontal plane delineating a difference in doping concentration between the semiconductor materials of the planar semiconductor layer 24 and the backside semiconductor source structure 26, and/or a horizontal plane between different semiconductor material compositions of the planar semiconductor layer 24 and the backside semiconductor source structure 26 (e.g., if one semiconductor material comprises silicon and the other semiconductor material comprises germanium or silicon-germanium, etc.).

In one embodiment, the backside semiconductor source structure 26 may be formed on an annular surface 60A of each vertical semiconductor channel 60. In one embodiment, the backside semiconductor source structure 26 comprises a planar portion 26P in contact with the planar semiconductor layer 24 and having a backside surface 26B that is spaced from the first horizontal plane HP1 by a uniform vertical spacing (i.e., a uniform thickness of the backside semiconductor source structure 26), and a cap portion 26C in contact with the vertical semiconductor channel 60 and having an areal overlap with the memory opening fill structure 58 and vertically protruding farther from the alternating stack (32, 46) than a backside surface 26B of the planar portion 26P. In one embodiment, the cap portion 26C may protrude farther outward from a second horizontal plane HP2 including an interface between the alternating stack (32, 46) and the planar semiconductor layer 24 than the planar portion 24P. In one embodiment, the backside semiconductor source structure 26 may contact concave annular surface segments 24C of the planar semiconductor layer 24 around each memory opening fill structure 58.

In one embodiment, the backside semiconductor source structure 26 contacts an entirety of an end surface of each memory film 50. The end surface of the memory film 50 is not vertical, and may comprise a tapered concave annular surface 50T. In one embodiment, the backside semiconductor source structure 26 may be in contact with a non-vertical end surface of the vertical semiconductor channel 60, which may comprise a tapered concave annular surface 60A. In one embodiment, the backside semiconductor source structure 26 may be in contact with each dielectric core 62.

Figure 16E:
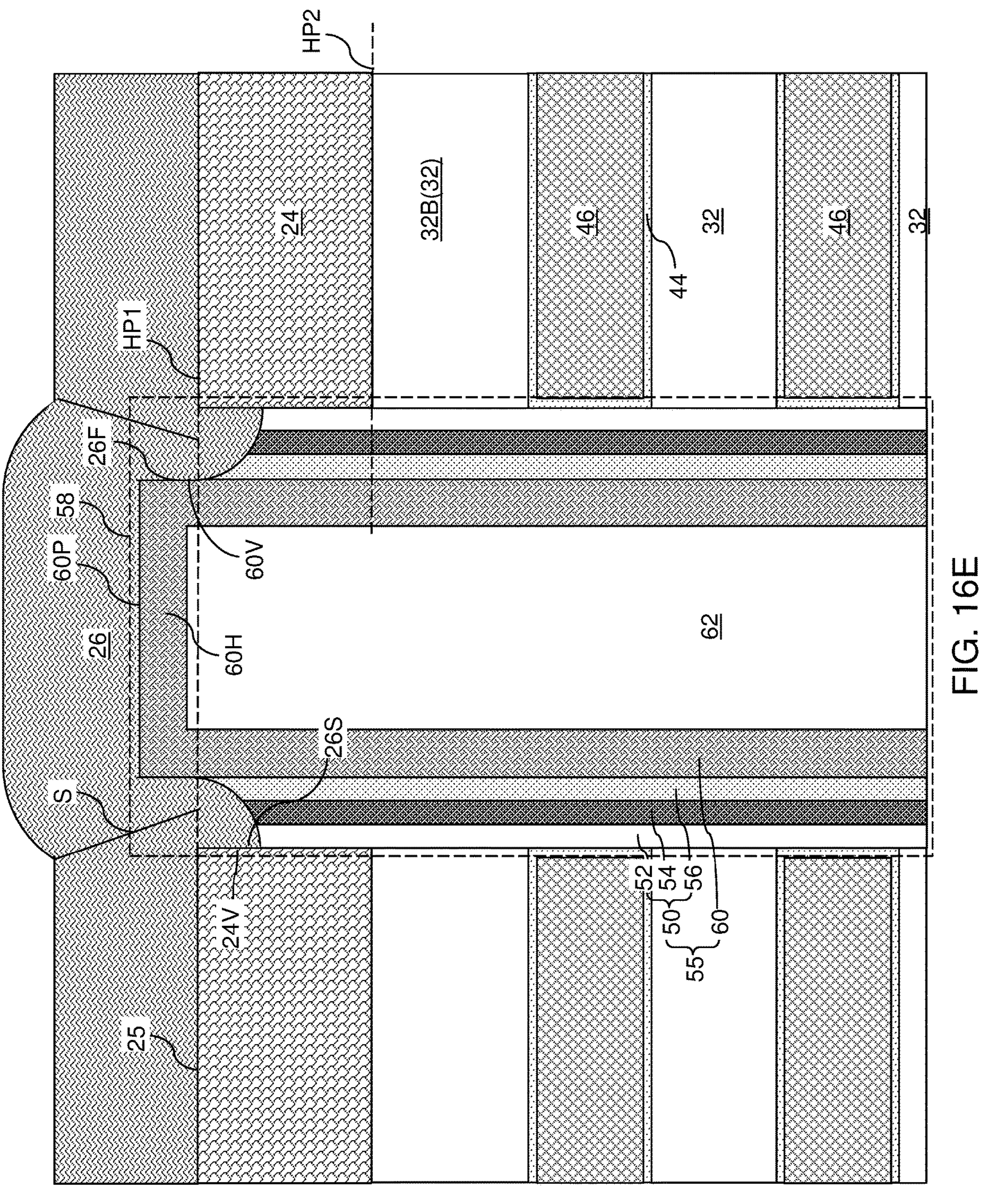
FIG. 16E is a vertical cross-sectional view of a region of an alternative embodiment for the first configuration of the first exemplary structure.

Referring to FIG. 16E, an alternative embodiment of the first configuration of the exemplary structure is illustrated, which may be derived from the first configuration of the exemplary structure illustrated in FIGS. 16A-16D by omitting the processing steps described with reference to FIG. 16C. In other words, a selective etch process that removes physically exposed end portion of each vertical semiconductor channel 60 and a backside surface portion of the planar semiconductor layer 24 can be omitted. In this case, the backside semiconductor source structure 26 may contact vertical cylindrical surface segments 24V of the planar semiconductor layer 24 around each memory opening fill structure 58, and may contact a planar horizontal end surface 60P of and a cylindrical vertical outer sidewall segment 60V of the horizontal end portion 60H each of the vertical semiconductor channels 60. In one embodiment, the backside semiconductor source structure 26 may comprise: a first vertical sidewall 26F in contact with the cylindrical vertical outer sidewall segment 60V of the vertical semiconductor channel 60, and a second vertical sidewall 26S in contact with the vertical cylindrical surface segments 24V of the planar semiconductor layer 24 and laterally offset outward from the first vertical sidewall 26F.

Alternatively, the backside semiconductor source structure 26 may have other alternative configurations. FIGS.

17A-17J, 18A, and 18B illustrate non-limiting examples of such alternative configurations.

Figure 17A:
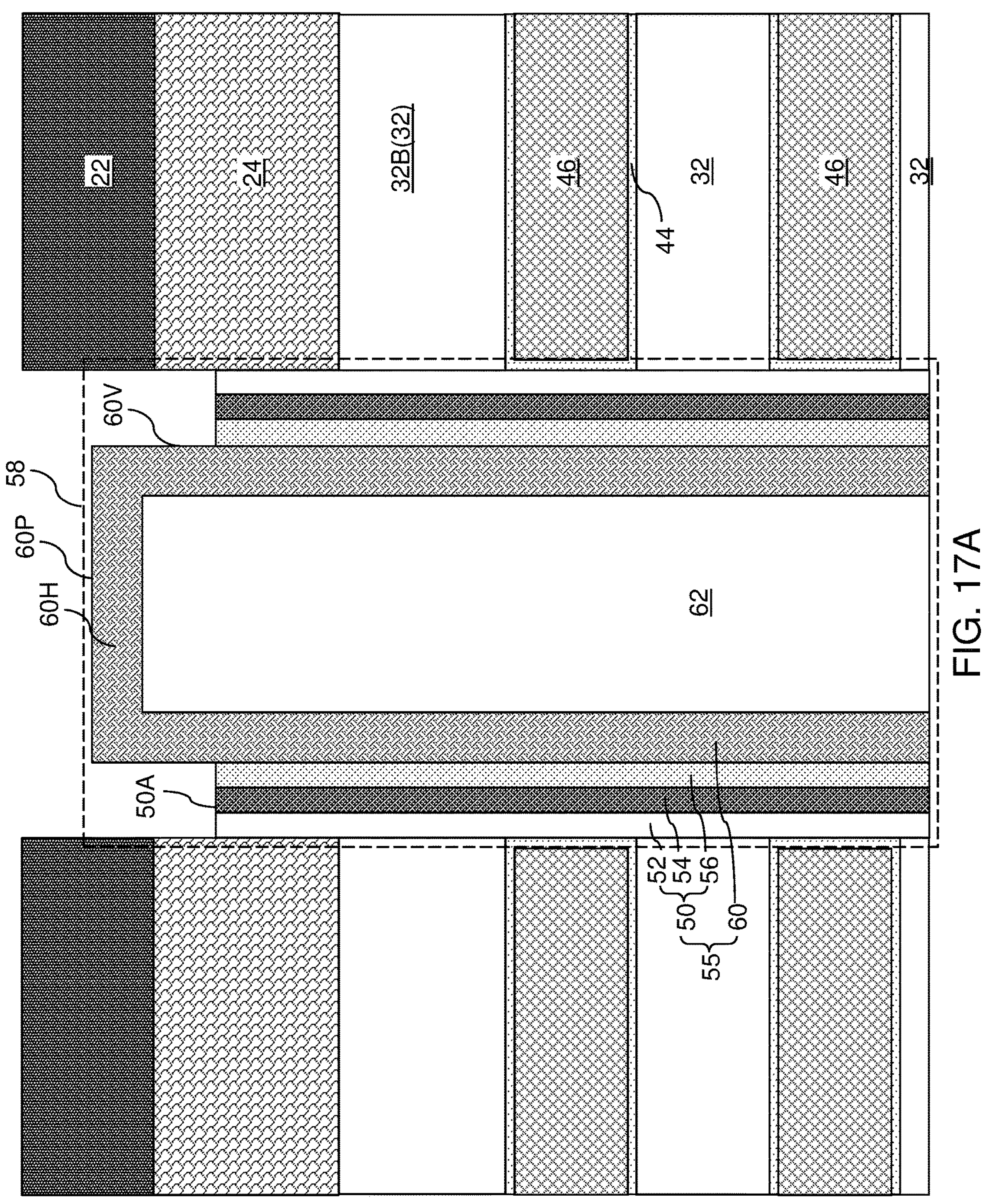
FIGS. 17A-17C are sequential vertical cross-sectional views of a region of a second configuration of the first exemplary structure during formation of a backside semiconductor source structure according to the first embodiment of the present disclosure.
Figure 17B:
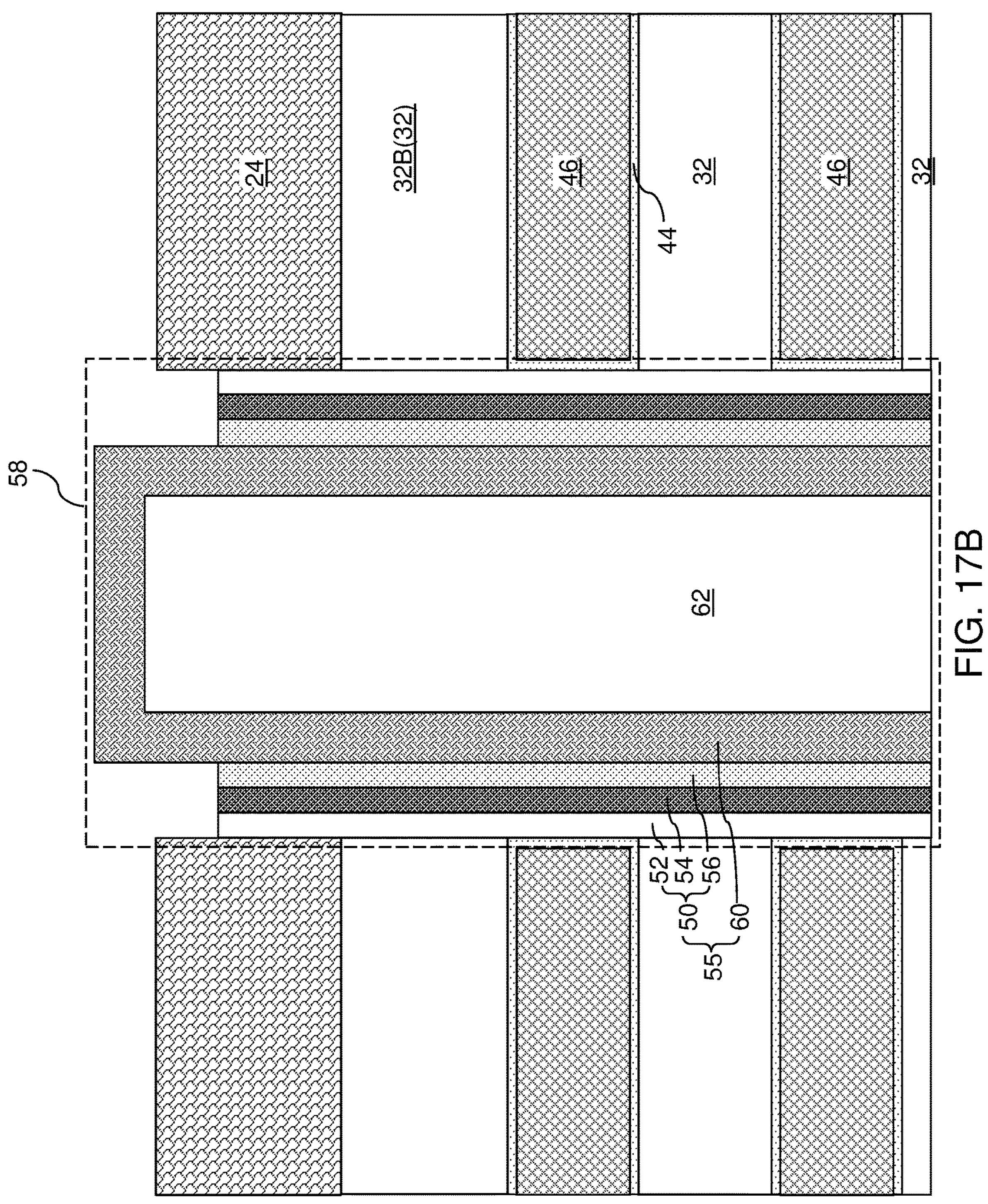
Figure 17C:
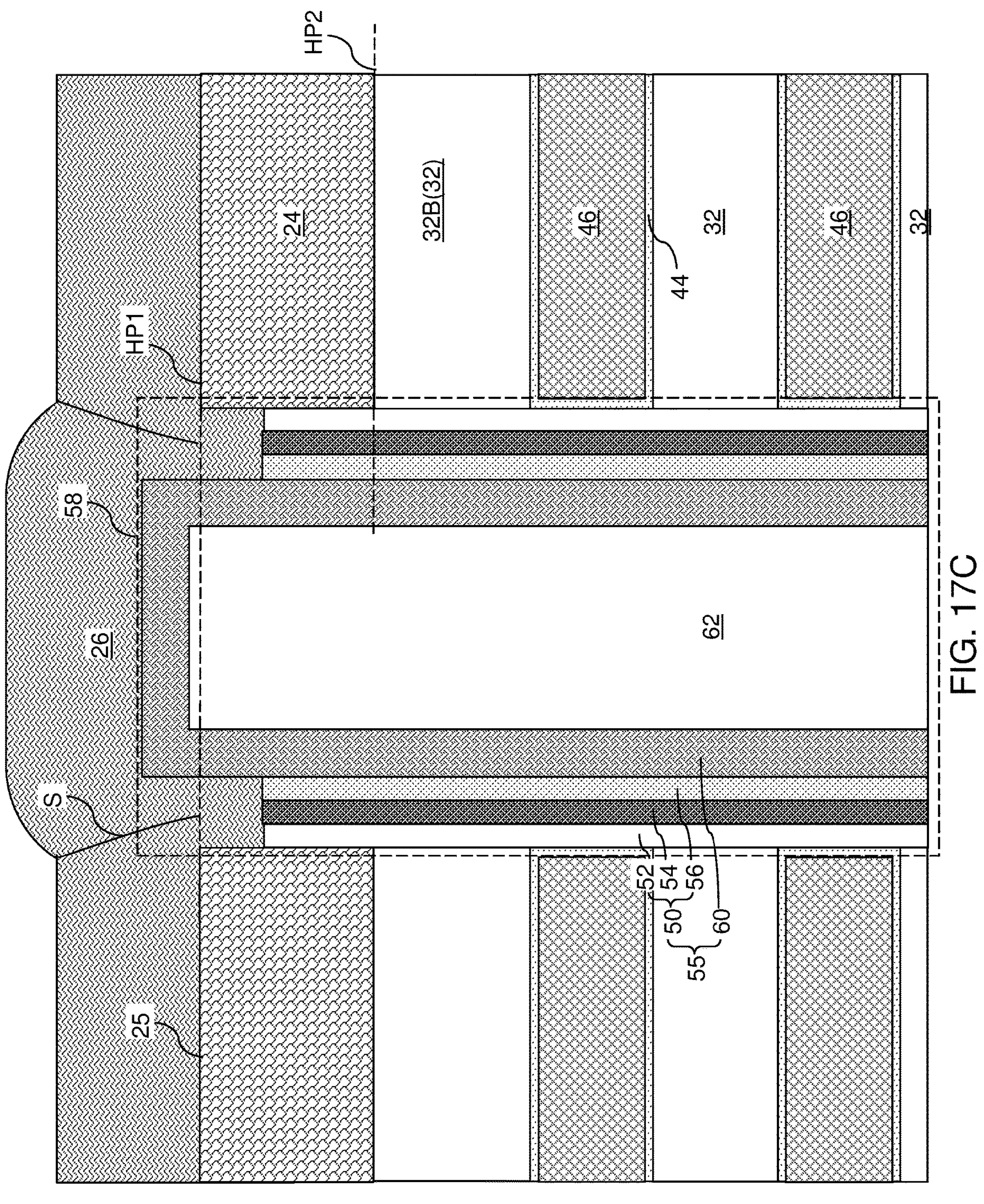

FIGS. 17A-17C are sequential vertical cross-sectional views of a region of a second configuration of the first exemplary structure during formation of a backside semiconductor source structure 26 according to the first embodiment of the present disclosure.

Referring to FIG. 17A, the second configuration of the first exemplary structure may be derived from the first exemplary structure illustrated in FIGS. 15A and 15B by removing an end portion of each memory film 50. Specifically, an end portion of each memory film 50 may be removed by performing a selective wet etch process or a sequence of wet etch processes. The horizontal end portion 60H of each vertical semiconductor channel 60 may be physically exposed after the etching. In one embodiment, the sequence of wet etch processes may be selective to the material of the vertical semiconductor channels 60, the material of the planar semiconductor layer 24, and the material of the etch stop material layer 22. In one embodiment, the planar horizontal end surface 60P and the cylindrical vertical outer sidewall segment 60V of each vertical semiconductor channel 60 may be physically exposed by removing an end portion of the memory film 50 selective to the vertical semiconductor channels 60. The memory film 50 may have an annular end surface 50A that is recessed relative to a physically exposed planar horizontal end surface 60P of the vertical semiconductor channel 60.

Referring to FIG. 17B, the etch stop material layer 22 may be removed selective to the materials of the vertical semiconductor channels 60 and the planar semiconductor layer 24 by performing an ashing process, a selective wet etch process or a selective atomic layer etch (ALE) process. The etch chemistry of the selective wet etch process or the selective ALE process may be selected depending on the material of the etch stop material layer 22 and the planar semiconductor layer 24. In one embodiment, the etch stop material layer 22 may be removed while each vertical semiconductor channel 60 comprises a respective physically exposed surface portion (e.g., portion 60H).

Referring to FIG. 17C, the processing steps described with reference to FIG. 16D may be performed to form the backside semiconductor source structure 26. In this configuration, the backside semiconductor source structure 26 is not in direct contact with the dielectric cores 62, and are spaced from the dielectric cores 62 by the planar horizontal portion 60H of the vertical semiconductor channels 60. In one embodiment, the backside semiconductor source structure 26 may comprise the first vertical sidewall 26F in contact with the cylindrical vertical outer sidewall segment 60V of the vertical semiconductor channel 60, and a second vertical sidewall 26S in contact with the vertical cylindrical surface segments 24V of the planar semiconductor layer 24 and laterally offset outward from the first vertical sidewall 26F, as described above with respect to FIG. 16E.

Figure 17D:
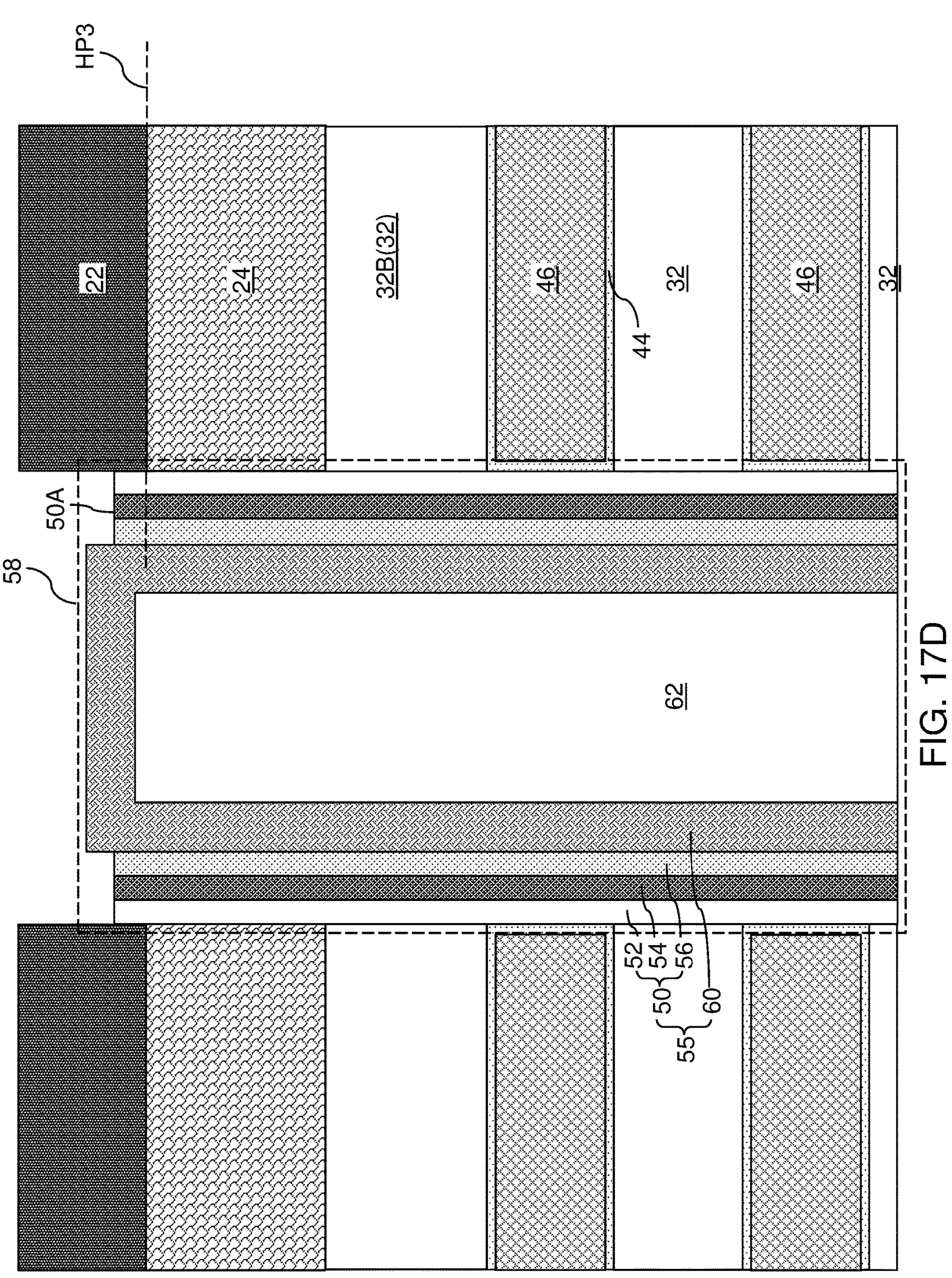
FIGS. 17D-17F are sequential vertical cross-sectional views of a region of a third configuration of the first exemplary structure during formation of a backside semiconductor source structure according to the first embodiment of the present disclosure.
Figure 17E:
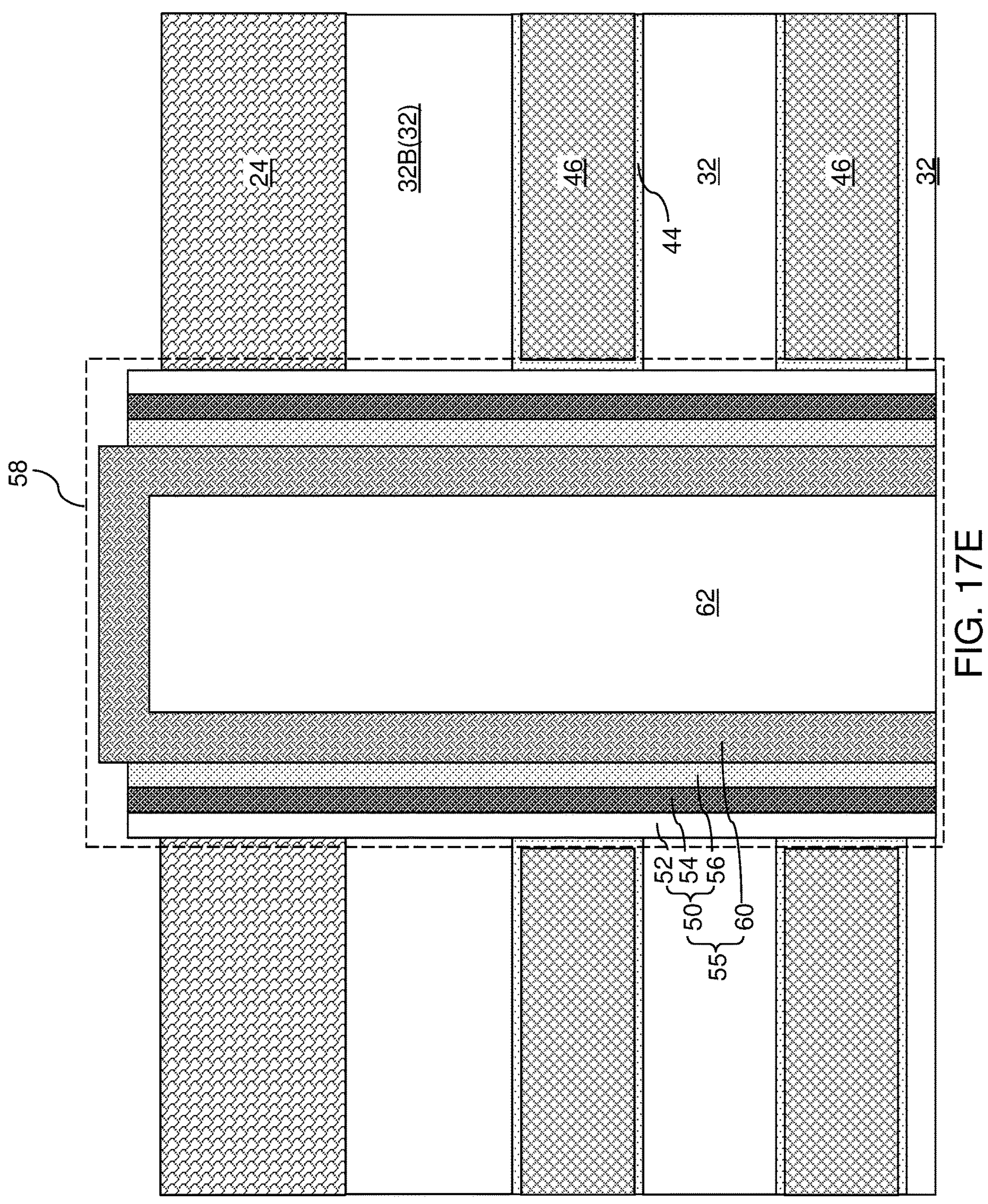
Figure 17F:
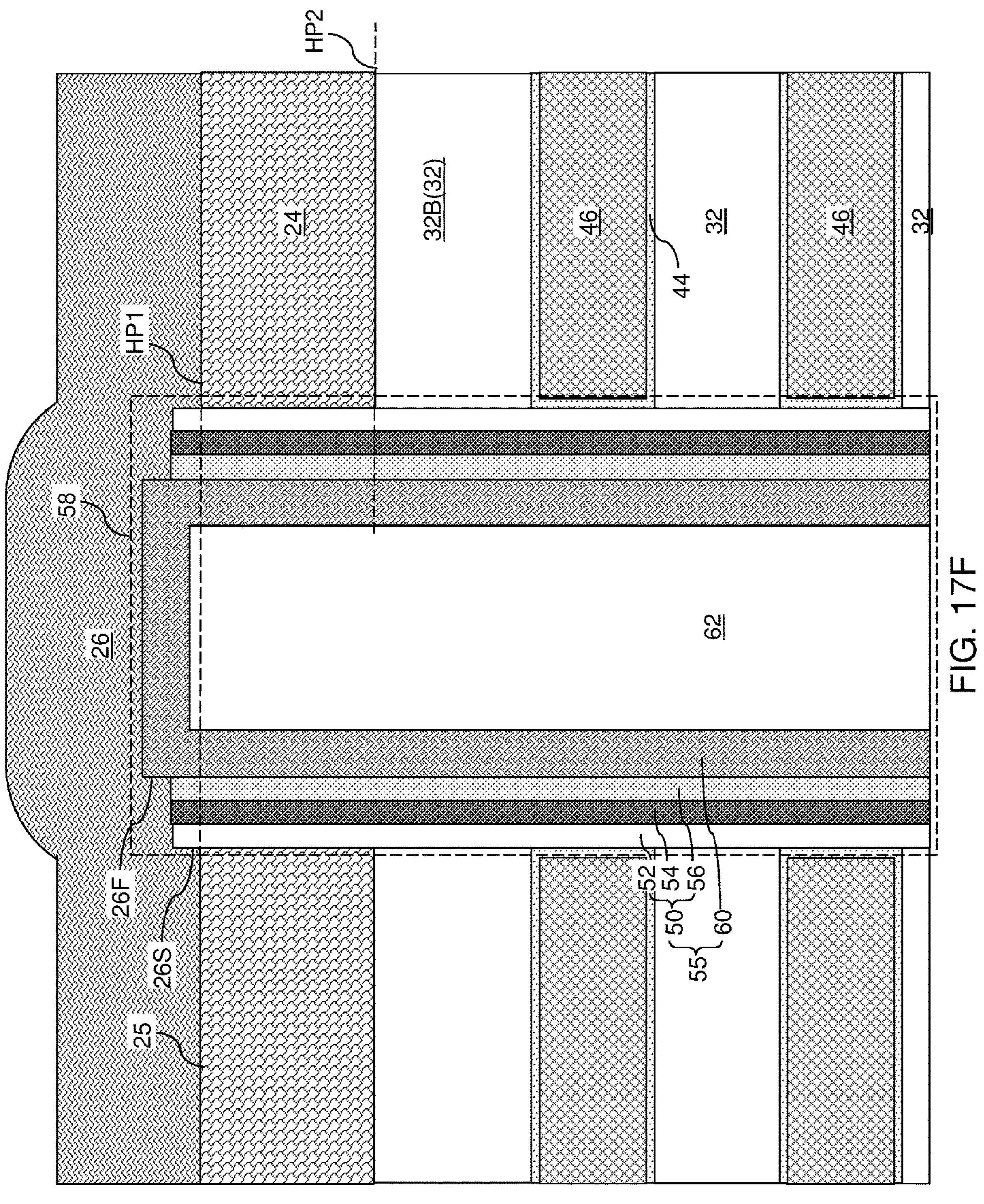

FIGS. 17D-17F are sequential vertical cross-sectional views of a region of a third configuration of the first exemplary structure during formation of a backside semiconductor source structure 26 according to the first embodiment of the present disclosure.

Referring to FIG. 17D, the third configuration of the first exemplary structure may be derived from the second configuration of the first exemplary structure by reducing the duration of the wet etch processes within the sequence of wet etch processes. In this case, the recessed annular end surface 50A of each memory film 50 may be located above or at the third horizontal plane HP3 than the interface between the planar semiconductor layer 24 and the etch stop material layer 22.

Referring to FIG. 17E, the etch stop material layer 22 may be removed selective to the materials of the vertical semiconductor channels 60 and the planar semiconductor layer 24 as described above.

Referring to FIG. 17F, the processing steps described with reference to FIG. 16D may be performed to form the backside semiconductor source structure 26. In this configuration, the backside semiconductor source structure 26 is also not in direct contact with the dielectric cores 62, and is spaced from the dielectric cores 62 by vertical semiconductor channels 60. In one embodiment, the backside semiconductor source structure 26 may comprise a first vertical sidewall 26F in contact with the vertical semiconductor channel 60, and a second vertical sidewall 26S in contact with the memory film 50 and laterally offset outward from the first vertical sidewall 26F. In one embodiment, the second vertical sidewall 26S of the backside semiconductor source structure 26 may be in contact with a vertical end portion of an outer sidewall of the memory film 50.

FIGS. 17G-17J are sequential vertical cross-sectional views of a region of a fourth configuration of the first exemplary structure during formation of a backside semiconductor source structure 26 according to the first embodiment of the present disclosure.

Figure 17G:
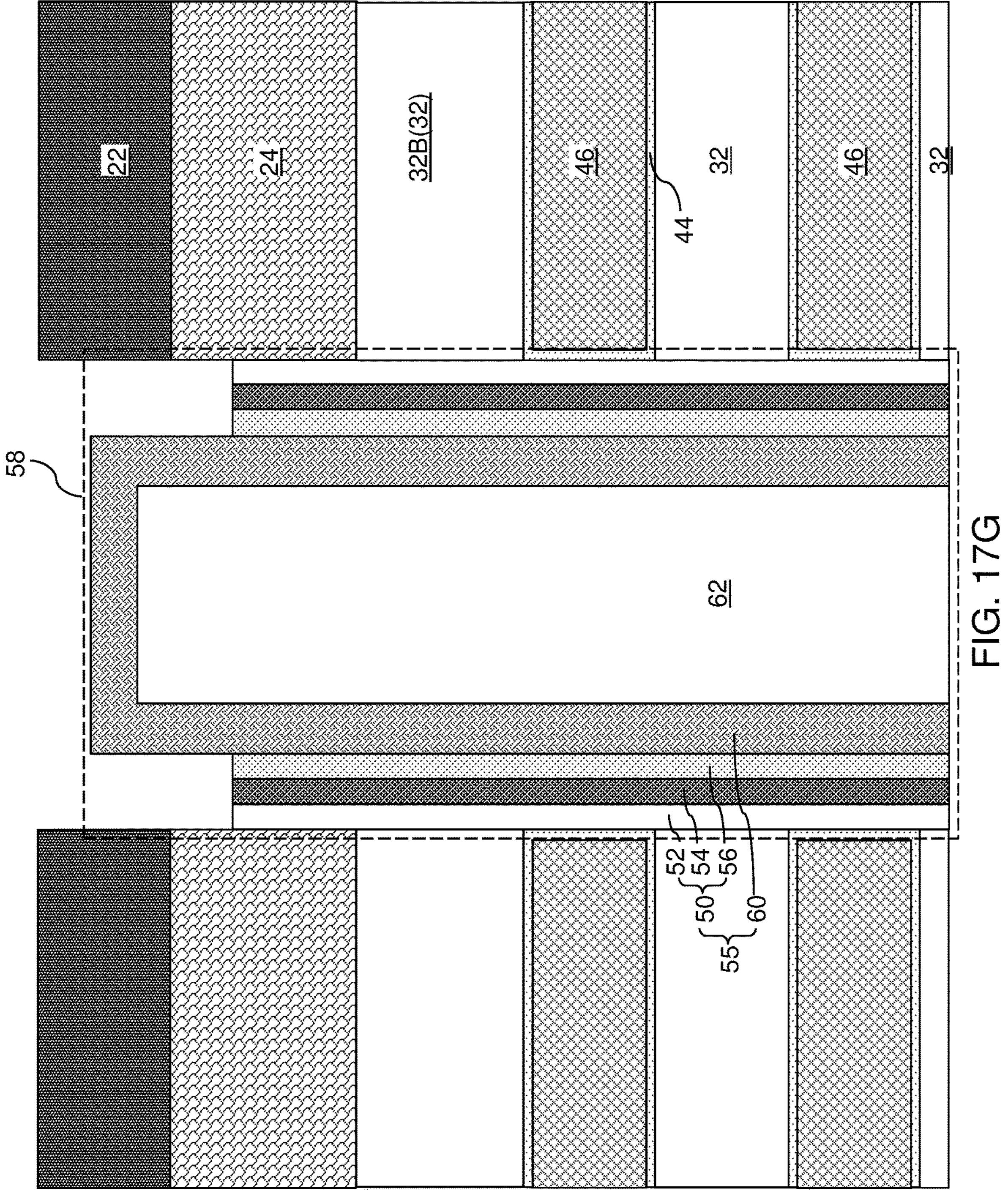
FIGS. 17G-17J are sequential vertical cross-sectional views of a region of a fourth configuration of the first exemplary structure during formation of a backside semiconductor source structure according to the first embodiment of the present disclosure.

Referring to FIG. 17G, the fourth configuration of the first exemplary structure may be the same as the second configuration of the first exemplary structure illustrated in FIG. 17A.

Figure 17H:
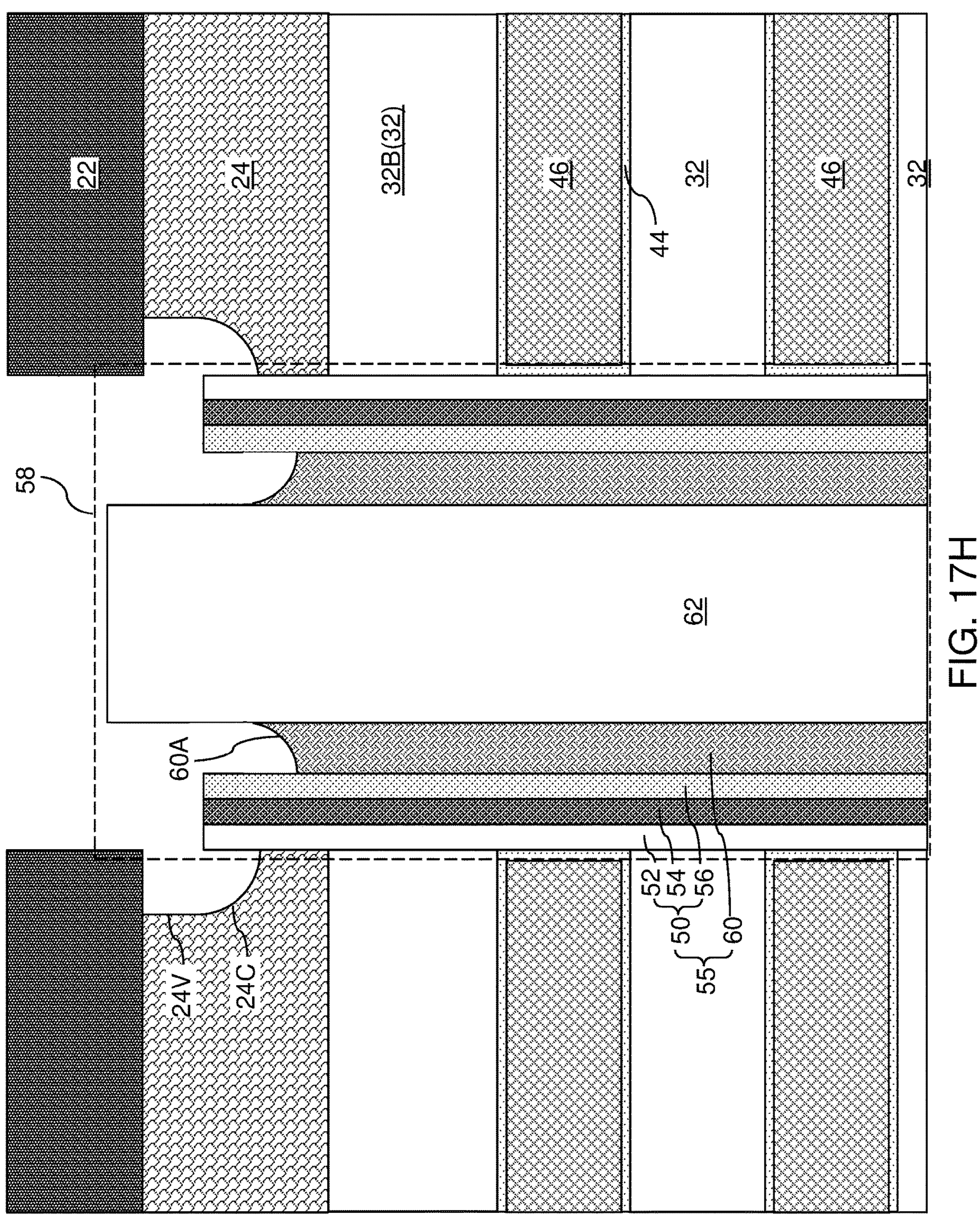

Referring to FIG. 17H, a selective isotropic etch process may be performed to isotropically recess the vertical semiconductor channels 60 and surface portions of the planar semiconductor layer 24 around each memory opening 49. The recess distance can be greater than the thickness of the vertical semiconductor channel 60. The remaining portion of each vertical semiconductor channel 60 may comprise an annular concave surface 60A. An annular portion of the planar semiconductor layer 24 is collaterally removed during removal of the end portion of the vertical semiconductor channel 60. A recessed contoured sidewall of the planar semiconductor layer 24 is formed around each memory opening fill structure 58. Each physically exposed recessed contoured sidewall of the planar semiconductor layer 24 may comprise a respective vertical cylindrical surface segment 24V and a respective annular concave surface segment 24C.

Figure 17I:
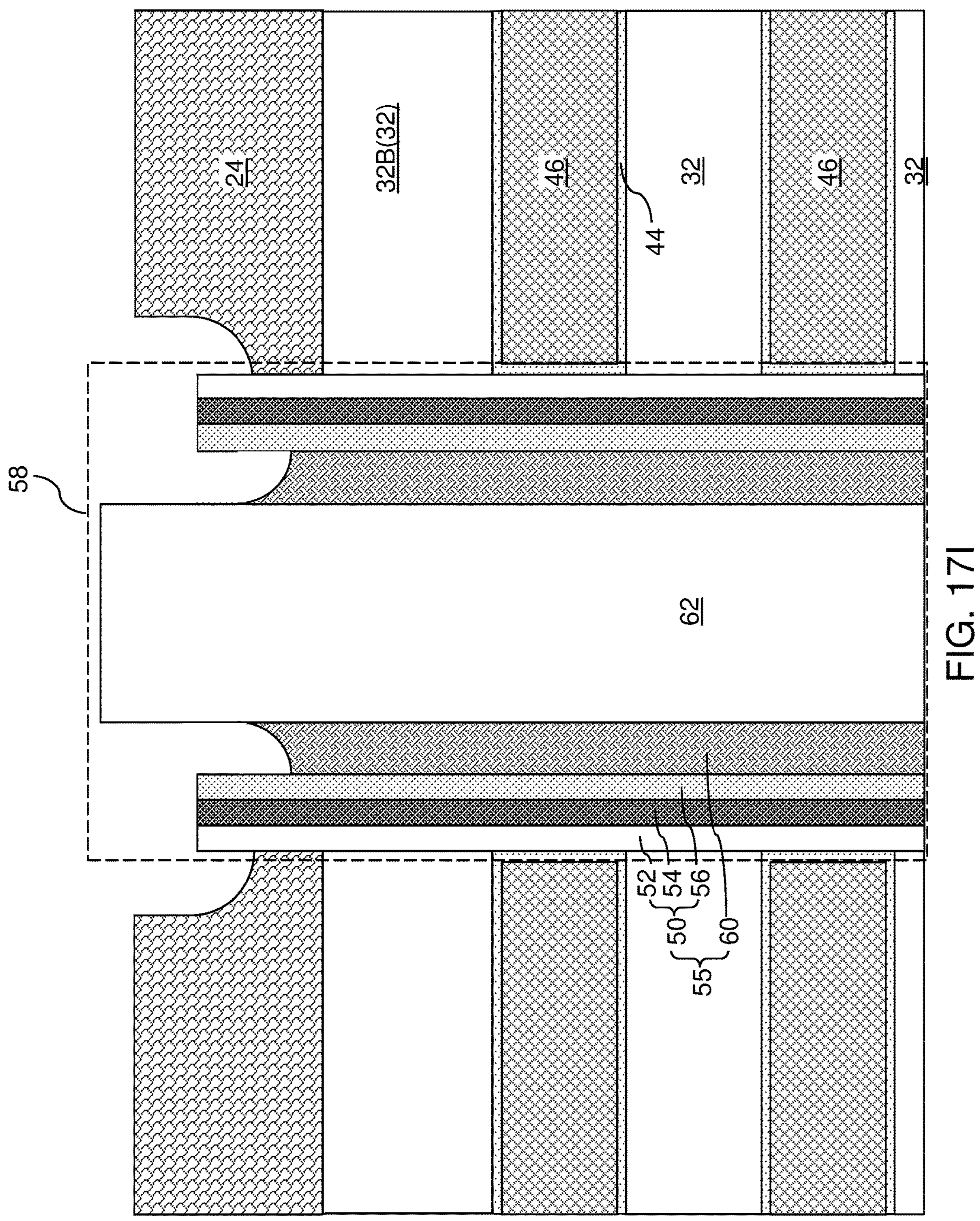

Referring to FIG. 17I, the etch stop material layer 22 may be removed selective to the materials of the vertical semiconductor channels 60 and the planar semiconductor layer 24 as described above.

Figure 17J:
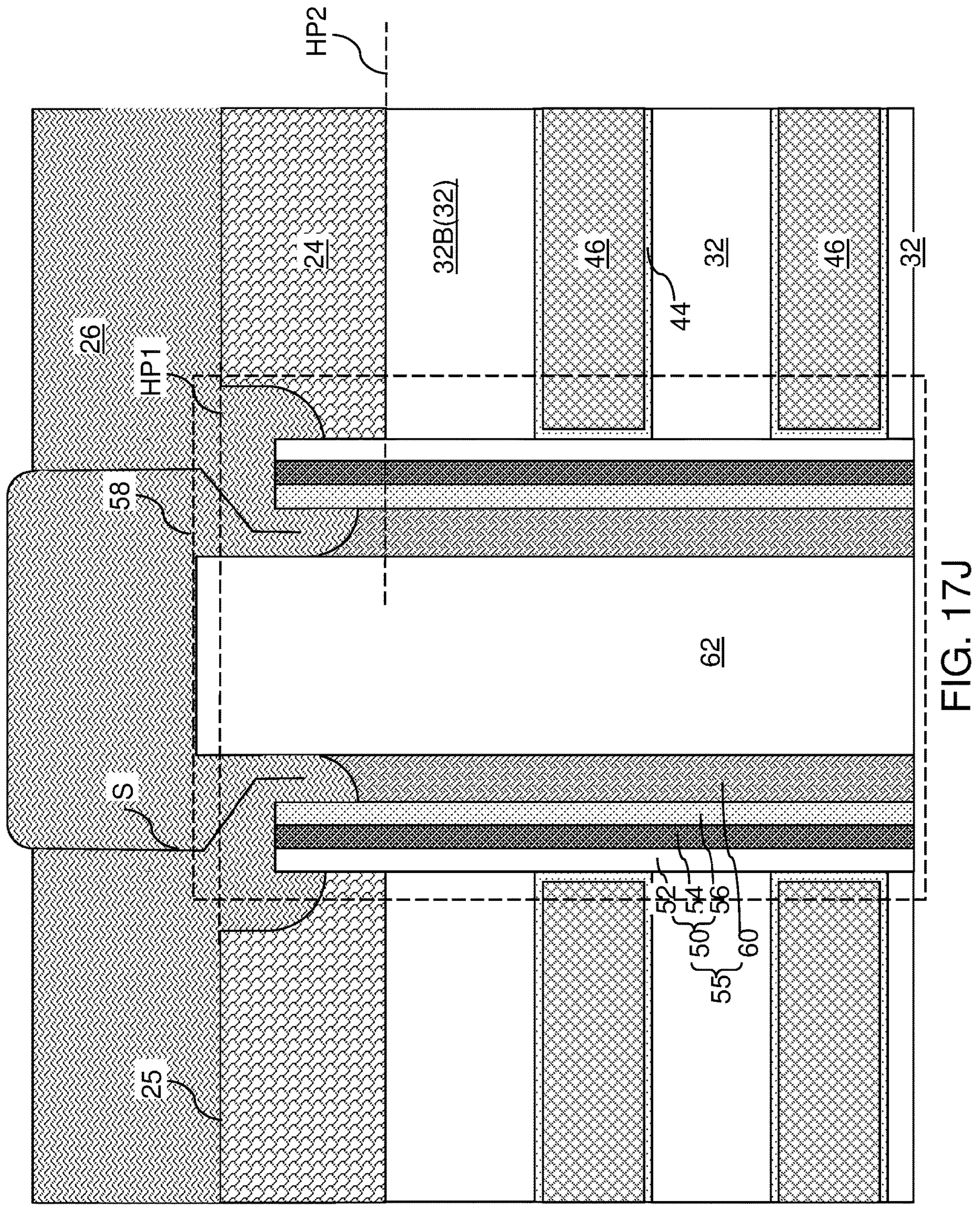

Referring to FIG. 17J, the processing steps described with reference to FIG. 16D may be performed to form the backside semiconductor source structure 26. The backside semiconductor source structure 26 is in direct contact with the dielectric cores 62. In one embodiment, the backside semiconductor source structure 26 may be in contact with the vertical semiconductor channel 60 and with the planar semiconductor layer 24. In one embodiment, the backside semiconductor source structure 26 may be in contact with a vertical end portion of an outer sidewall of the memory film 50 (e.g., of the blocking dielectric 52), and may be in contact with a vertical end portion of an inner sidewall of the memory film 50 (e.g., of the liner 56). In the fourth configuration of the first exemplary structure, the backside semiconductor source structure 26 may be formed on the recessed contoured sidewall of the planar semiconductor layer 24.

Figure 18A:
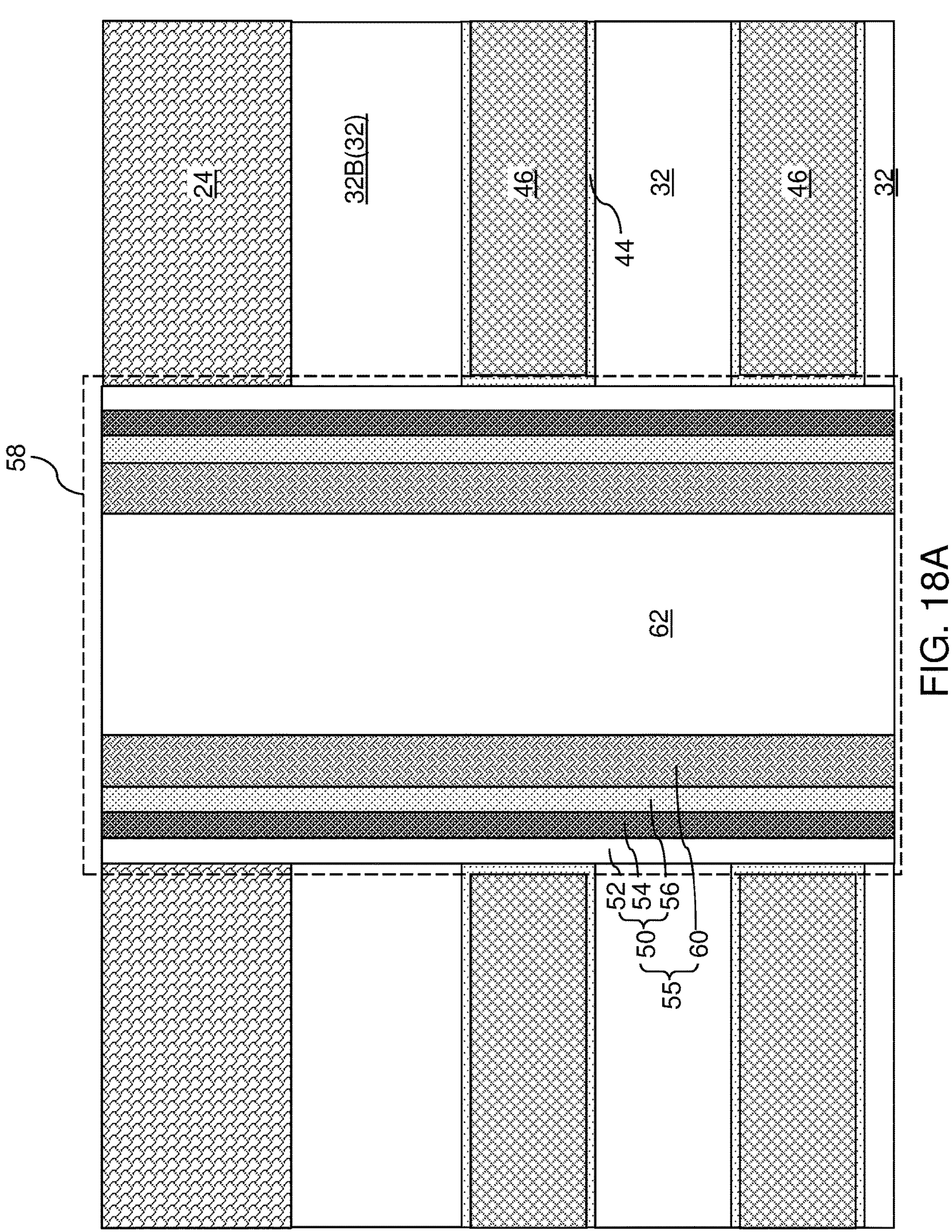
FIGS. 18A and 18B are sequential vertical cross-sectional views of a region of a fifth configuration of the first exemplary structure during formation of a backside semiconductor source structure according to the first embodiment of the present disclosure.
Figure 18B:
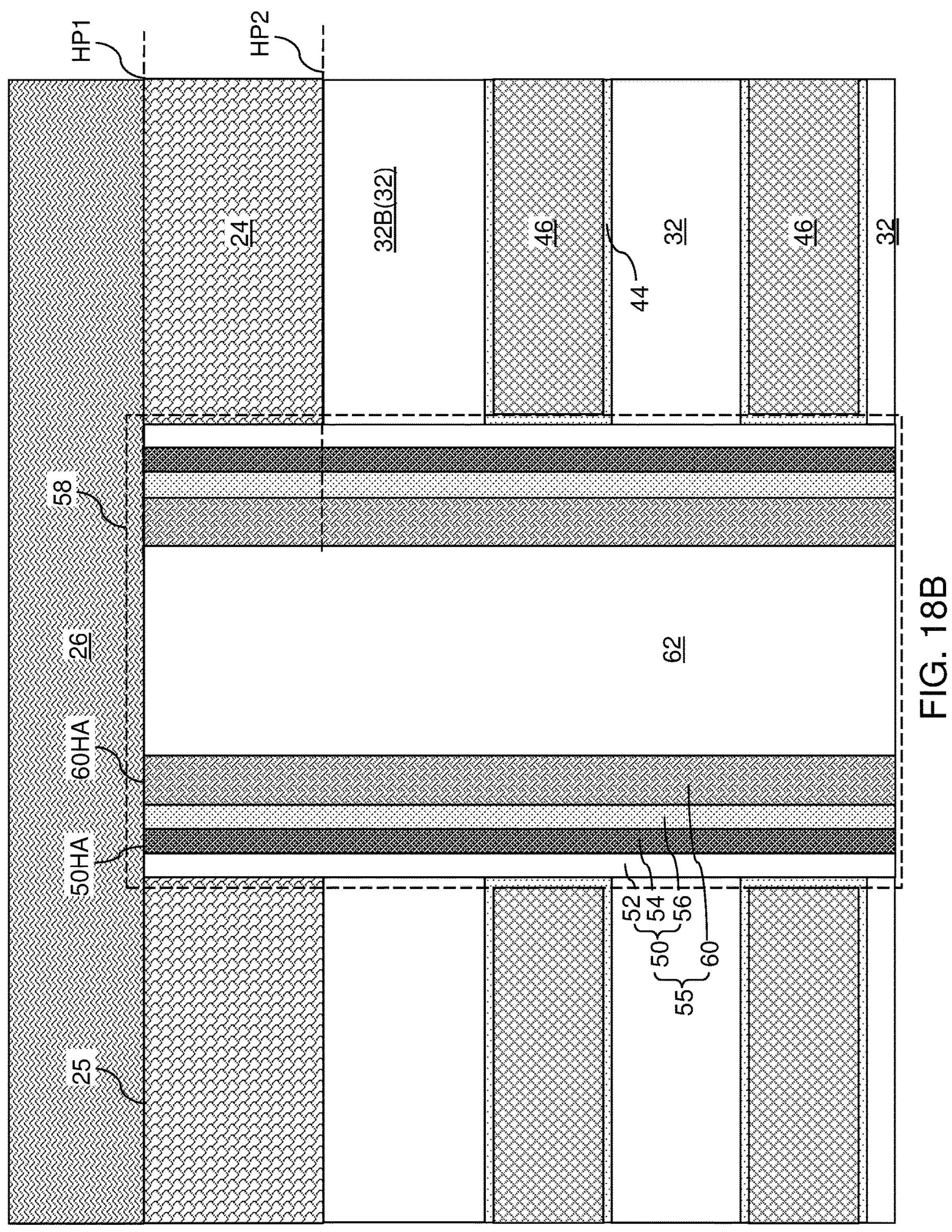

FIGS. 18A and 18B are sequential vertical cross-sectional views of a region of a fifth configuration of the first exemplary structure during formation of a backside semiconductor source structure 26 according to the first embodiment of the present disclosure.

Referring to FIG. 18A, the fifth configuration of the first exemplary structure may be derived from the first configuration of the first exemplary structure illustrated in FIG. 16A by performing an etchback or a chemical mechanical polishing (CMP) process that removes portions of the memory opening fill structures 58 that protrude farther outward than the physically exposed distal planar surface of the planar semiconductor layer 24. Alternatively, the etch stop material layer 22 and distal portions of the memory opening fill structures 58 in the first exemplary structure illustrated in FIGS. 15A and 15B may be simultaneously removed by performing a CMP process employing the planar semiconductor layer 24 as a stopping layer. In the fifth configuration of the first exemplary structure, physically exposed end surfaces of the dielectric core 62, the vertical semiconductor channel 60, and the memory film 50 of each memory opening fill structure 58 and a planar distal surface of the planar semiconductor layer 24 may be formed within a same horizontal plane.

Referring to FIG. 18B, the processing steps described with reference to FIG. 16D may be performed to form the backside semiconductor source structure 26. The backside semiconductor source structure 26 may be in direct contact with horizontal end surfaces of the dielectric cores 62, horizonal annular end surfaces 60HA of the vertical semiconductor channels 60, and horizontal annular end surfaces 50HA of the memory films 50.

Figure 19:
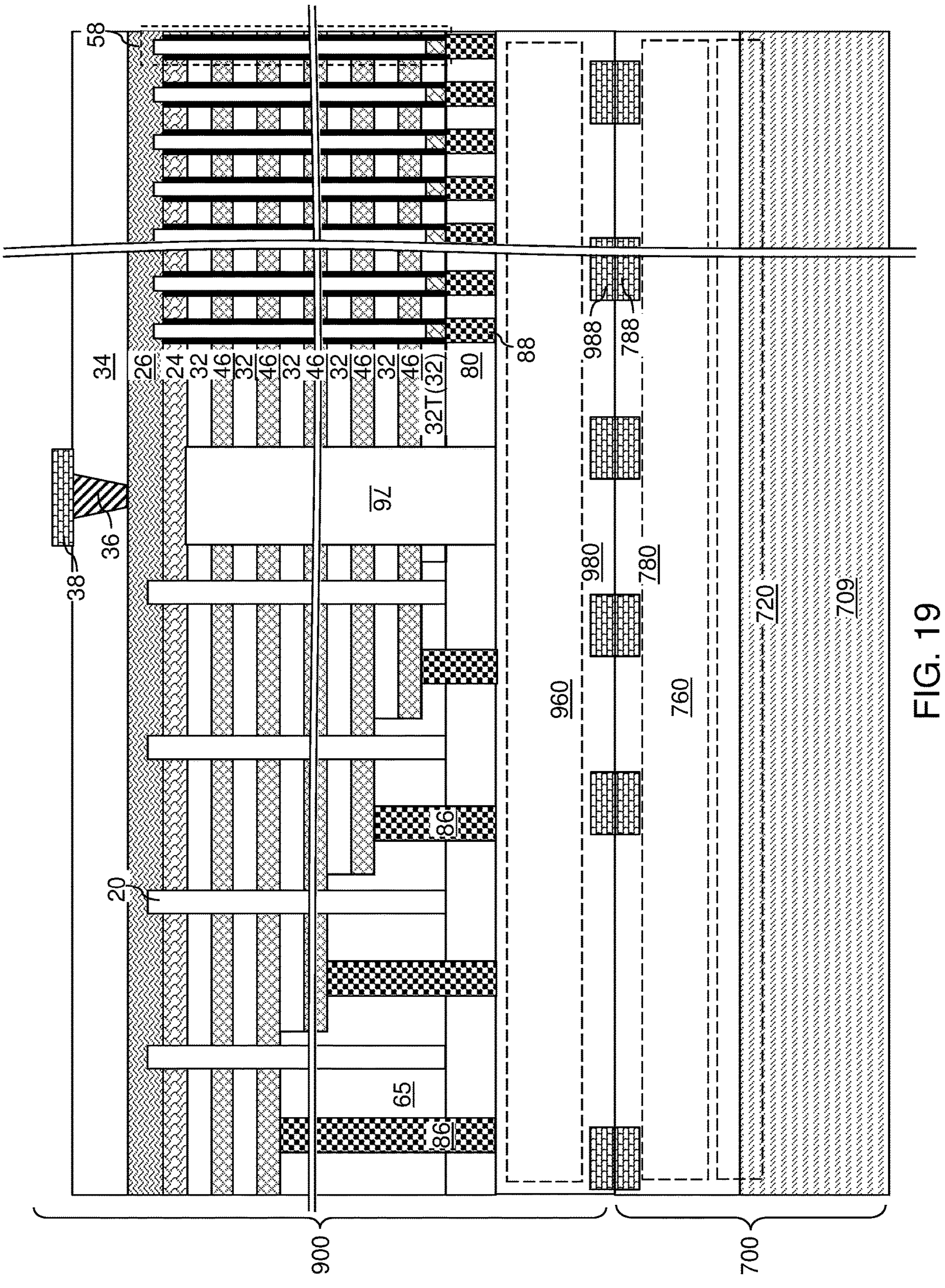
FIG. 19 is a vertical cross-sectional view of the first exemplary structure after formation of a source contact structure according to the first embodiment of the present disclosure.

Referring to FIG. 19, if the backside semiconductor source structure 26 is formed as an undoped layer, an ion implantation process can be performed to introduce dopants of the second conductivity type into the backside semiconductor source structure 26. The atomic concentration of dopants of the second conductivity type in the backside semiconductor source structure 26 may be in a range from $5\times10^{19}/cm^3$ to $2\times10^{21}/cm^3$, such as from $1\times10^{20}/cm^3$ to $1\times10^{21}/cm^3$, although lesser and greater atomic concentrations may also be employed. A laser anneal process can be performed to activate the dopants of the second conductivity type in the backside semiconductor source structure 26. A laser beam can be rastered over the entire area of the backside semiconductor source structure 26 from the backside to electrically activate the dopants in the backside semiconductor source structure 26.

A backside insulating layer 34 including an insulating material can be deposited over the backside semiconductor source structure 26. A source contact structure (36, 38) may be formed through the backside insulating layer 34 on the distal surface of the backside semiconductor source structure 26. The source contact structure (36, 38) may comprise a metal via portion 36 and a metal pad portion 38, which can be employed as a bonding pad for providing electrical connection, for example, by forming a solder ball or a wirebonding connection thereupon.

Referring to FIGS. 1-19 and according to some embodiments of the present disclosure, a semiconductor structure comprises: an alternating stack (32, 46) of insulating layers 32 and electrically conductive layers 46 located on a planar semiconductor layer 24 comprising a first semiconductor material and laterally extending along a horizontal direction; a memory opening 49 vertically extending through the alternating stack (32, 46); a memory opening fill structure 58 located in the memory opening 49 and comprising a memory film 50 and a vertical semiconductor channel 60 that includes a second semiconductor material; and a backside semiconductor source structure 26 comprising a third semiconductor material and contacting the vertical semiconductor channel 60 and the planar semiconductor layer 24.

In one embodiment, a horizontal interface 25 is present between the backside semiconductor source structure 26 and the planar semiconductor layer 24; the vertical semiconductor channel 60 has a doping of a first conductivity type; and the first semiconductor material of the planar semiconductor layer 24 comprises a doped polycrystalline semiconductor material having a doping of a second conductivity type that is an opposite of the first conductivity type.

In one embodiment, the backside semiconductor source structure 26 comprises: a planar portion 26P in contact with the planar semiconductor layer 24 and having a backside surface 26B that is spaced from the first horizontal plane HP1 by a uniform vertical spacing; and a cap portion 26C in contact with the vertical semiconductor channel 60 and having an areal overlap with the memory opening fill structure 58 and vertically protruding farther from the alternating stack (32, 46) than a distal surface of the planar portion. In one embodiment, the cap portion 26C protrudes farther outward from a horizontal plane including an interface between the alternating stack (32, 46) and the planar semiconductor layer 24 than the planar portion 26P.

In one embodiment, the backside semiconductor source structure 26 contacts an entirety of a non-vertical end surface of the memory film 50. In one embodiment, the backside semiconductor source structure 26 is in contact with a non-vertical end surface of the vertical semiconductor channel 60. In one embodiment, the backside semiconductor source structure 26 is in contact with an end portion of an outer sidewall of the vertical semiconductor channel 60.

In one embodiment, the dielectric core 62 comprises an end portion that protrudes farther away from the alternating stack (32, 46) than a first horizontal plane HP1 including a horizontal interface between the planar semiconductor layer 24 and the backside semiconductor source structure 26, and the backside semiconductor source structure 26 is in contact with the dielectric core 62.

In one embodiment, the backside semiconductor source structure 26 is in contact with an end portion of an inner sidewall of the memory film 50. In one embodiment, the backside semiconductor source structure 26 is in contact with an end portion of an outer sidewall of the memory film 50. In one embodiment, the backside semiconductor source structure 26 comprises: a first vertical sidewall 26F in contact with the vertical semiconductor channel 60; and a second vertical sidewall 26S in contact with the planar semiconductor layer 24 and laterally offset outward from the first vertical sidewall 26F.

Figure 20:
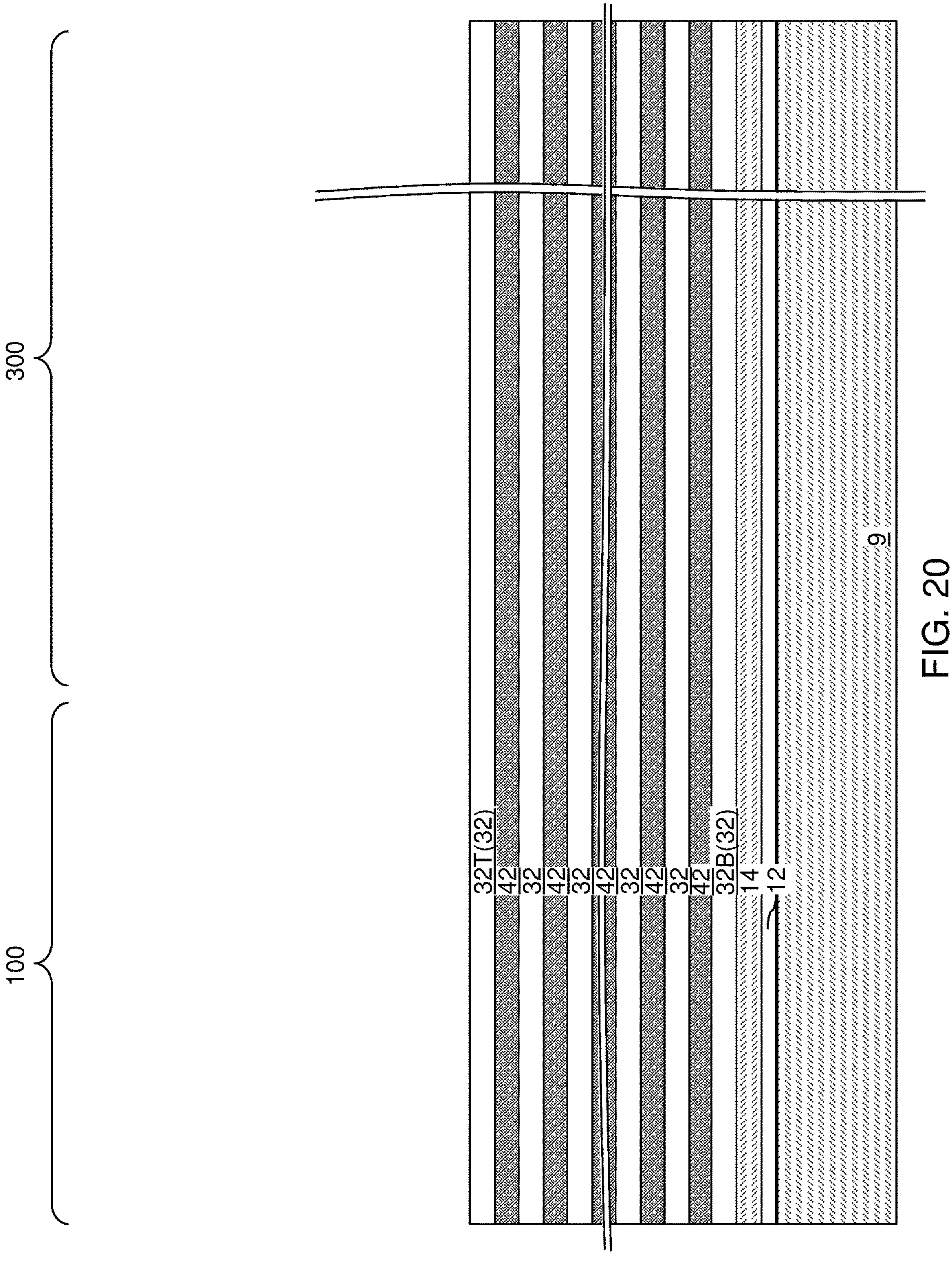
FIG. 20 is a schematic vertical cross-sectional view of a second exemplary structure after formation of an alternating stack of insulating layers and sacrificial material layers over a composite substrate including a carrier substrate, a buried insulating layer, and a single crystalline semiconductor layer according to a second embodiment of the present disclosure.
Figure 21:
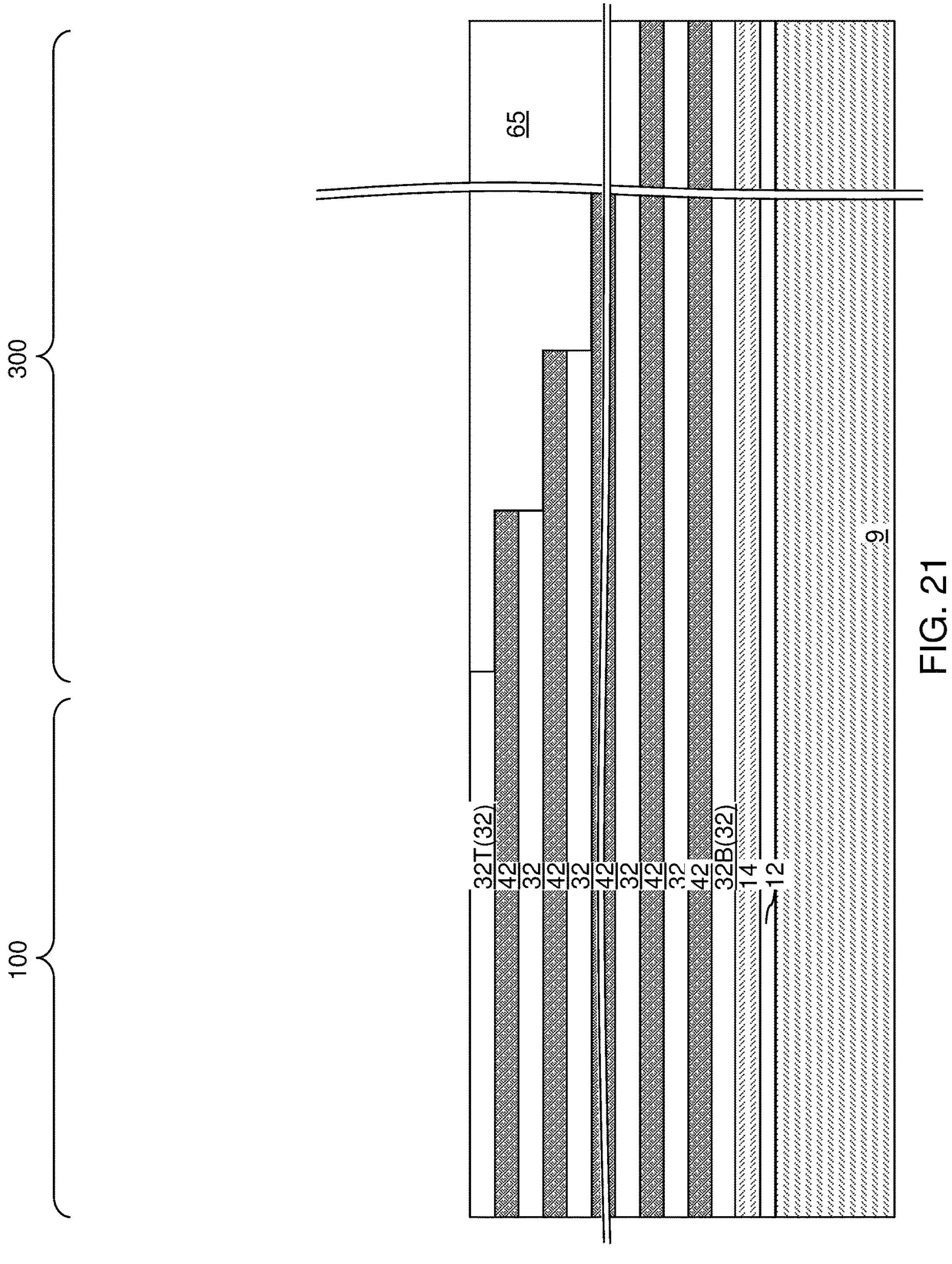
FIG. 21 is a schematic vertical cross-sectional view of the second exemplary structure after formation of stepped surfaces and a stepped dielectric material portion according to the second embodiment of the present disclosure.

Referring to FIG. 20, a second exemplary structure according to a second embodiment of the present disclosure is illustrated. The second exemplary structure can be derived from the first exemplary structure illustrated in FIG. 1 by forming a buried insulating layer 12 and a single crystalline semiconductor layer 14 in lieu of an etch stop material layer 22 and a planar semiconductor layer 24.

The buried insulating layer 12 includes an insulating material, such as silicon oxide. The thickness of the buried insulating layer 12 may be in a range from 30 nm to 300 nm, although lesser and greater thicknesses may also be employed. The singe crystalline semiconductor layer 14 comprises a single crystalline semiconductor material, such as single crystalline silicon. The thickness of the single crystalline semiconductor layer 14 may be in a range from 30 nm to 200 nm, although lesser and greater thicknesses may also be employed. Generally, a composite substrate including a semiconductor (e.g., single crystalline silicon) substrate 9, a buried insulating layer 12, and a single crystalline semiconductor layer 14 can be provided.

In one embodiment, a commercially available silicon-on-insulator (SOI) wafer may be employed as a combination of the semiconductor substrate 9, the buried insulating layer 12, and the single crystalline semiconductor layer 14. In this embodiment, the semiconductor substrate 9 and the single crystalline semiconductor layer 14 comprise single crystalline silicon, and the buried insulating layer 12 comprises silicon oxide.

In one embodiment, the SOI wafer is formed by implanting oxygen ions below a surface of a single crystalline silicon wafer followed by annealing to form the silicon oxide buried insulating layer 12. The single crystalline semiconductor layer 14 comprises an upper portion of the silicon wafer that remains above the buried insulating layer 12, while the semiconductor substrate 9 comprises a lower portion of the silicon wafer that remains below the buried insulating layer 12.

In another embodiment, the SOI wafer is formed by wafer bonding. In this embodiment, an insulating layer 12, such as a silicon oxide layer, is formed on an upper surface of a single crystalline silicon wafer by layer deposition or by oxidation of the upper surface of the silicon wafer. A carrier substrate 9 is then bonded to the insulating layer 12. The silicon wafer thickness is then reduced by grinding, polishing and/or etching to form the single crystalline semiconductor (e.g., silicon) layer 14 on the insulating layer 12, which comprises the buried insulating layer. In this embodiment, the carrier substrate 9 may comprise any suitable material (e.g., insulator, conductor or semiconductor), and thus may or may not be a single crystalline semiconductor substrate.

The single crystalline semiconductor layer 14 may have a doping of the second conductivity type. The doping may be performed in-situ during formation of this layer or by ion implantation into this layer. The atomic concentration of dopants of the second conductivity type in the single crystalline semiconductor layer 14 may be in a range from $5\times10^{18}/cm^3$ to $2\times10^{21}/cm^3$, such as from $1\times10^{19}/cm^3$ to $1\times10^{21}/cm^3$, although lesser and greater atomic concentrations may also be employed. Subsequently, an alternating stack of insulating layers and spacer material layers can be formed in the manner described within reference to FIG. 1.

Figure 22:
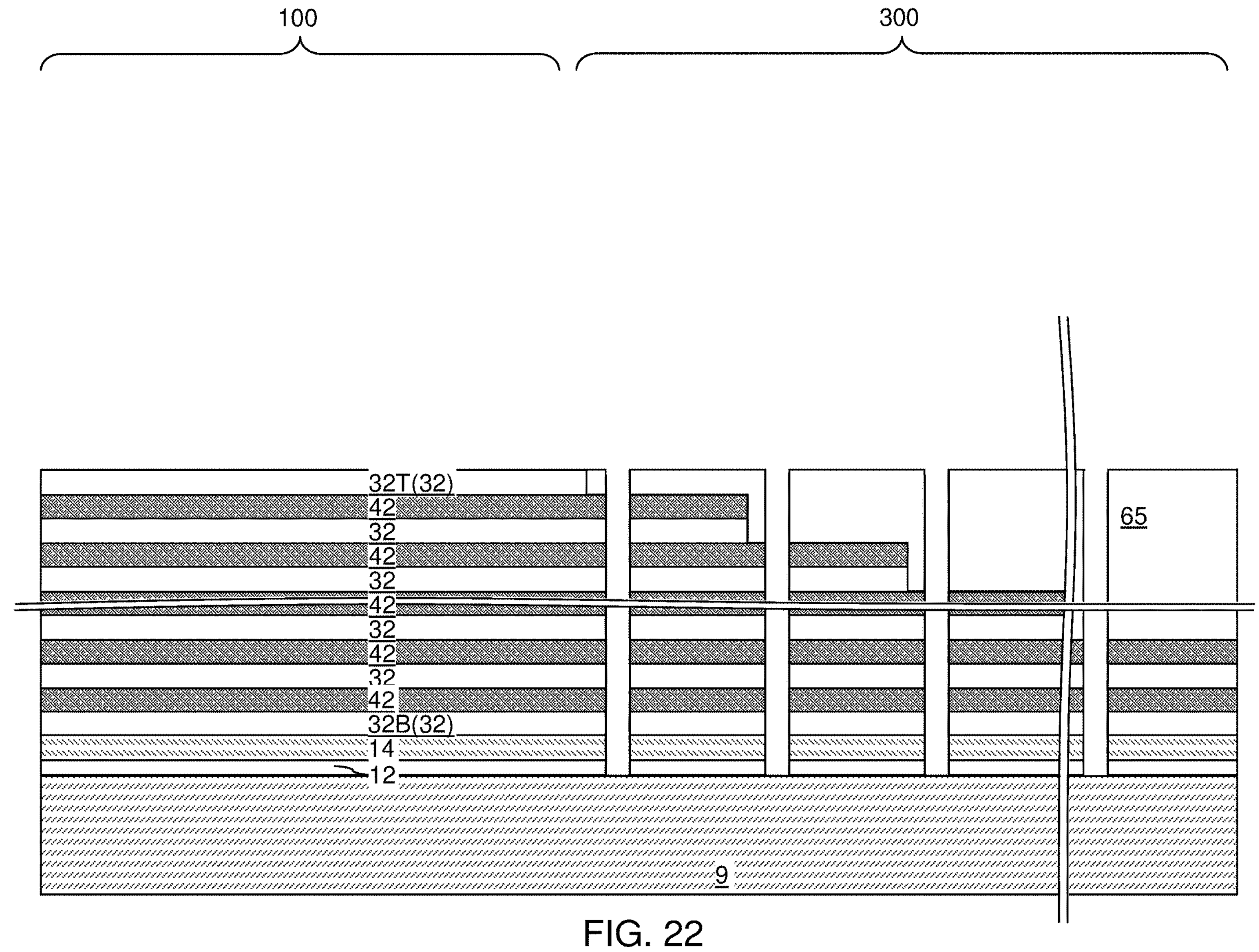
FIG. 22 is a schematic vertical cross-sectional view of the second exemplary structure after formation of support openings according to the second embodiment of the present disclosure.

Referring to FIG. 22, the processing steps described with reference to FIG. 2 may be performed to form stepped surfaces on the alternating stack (32, 42), and to form a stepped dielectric material portion 65. Subsequently, the processing steps described with reference to FIG. 3 may be performed to form support openings 19 through the stepped dielectric material portion 65, the alternating stack (32, 42), and the single crystalline semiconductor layer 14, and optionally into, and/or through, the buried insulating layer 12.

Figure 23:
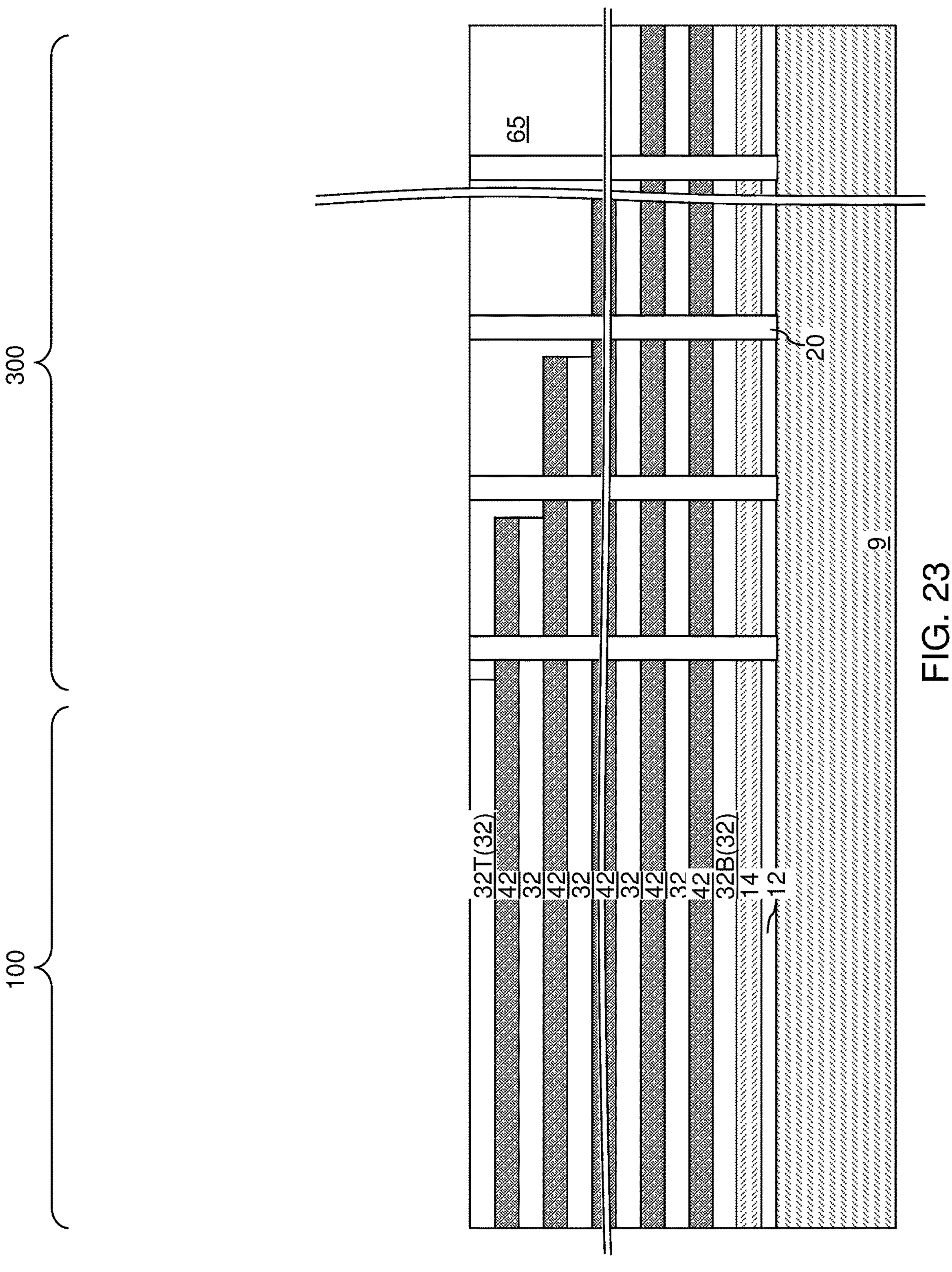
FIG. 23 is a vertical cross-sectional view of the second exemplary structure after formation of support pillar structures according to the second embodiment of the present disclosure.

Referring to FIG. 23, the processing steps described with reference to FIG. 4 may be performed to form support pillar structures 20 in the support openings 19.

Figure 24A:
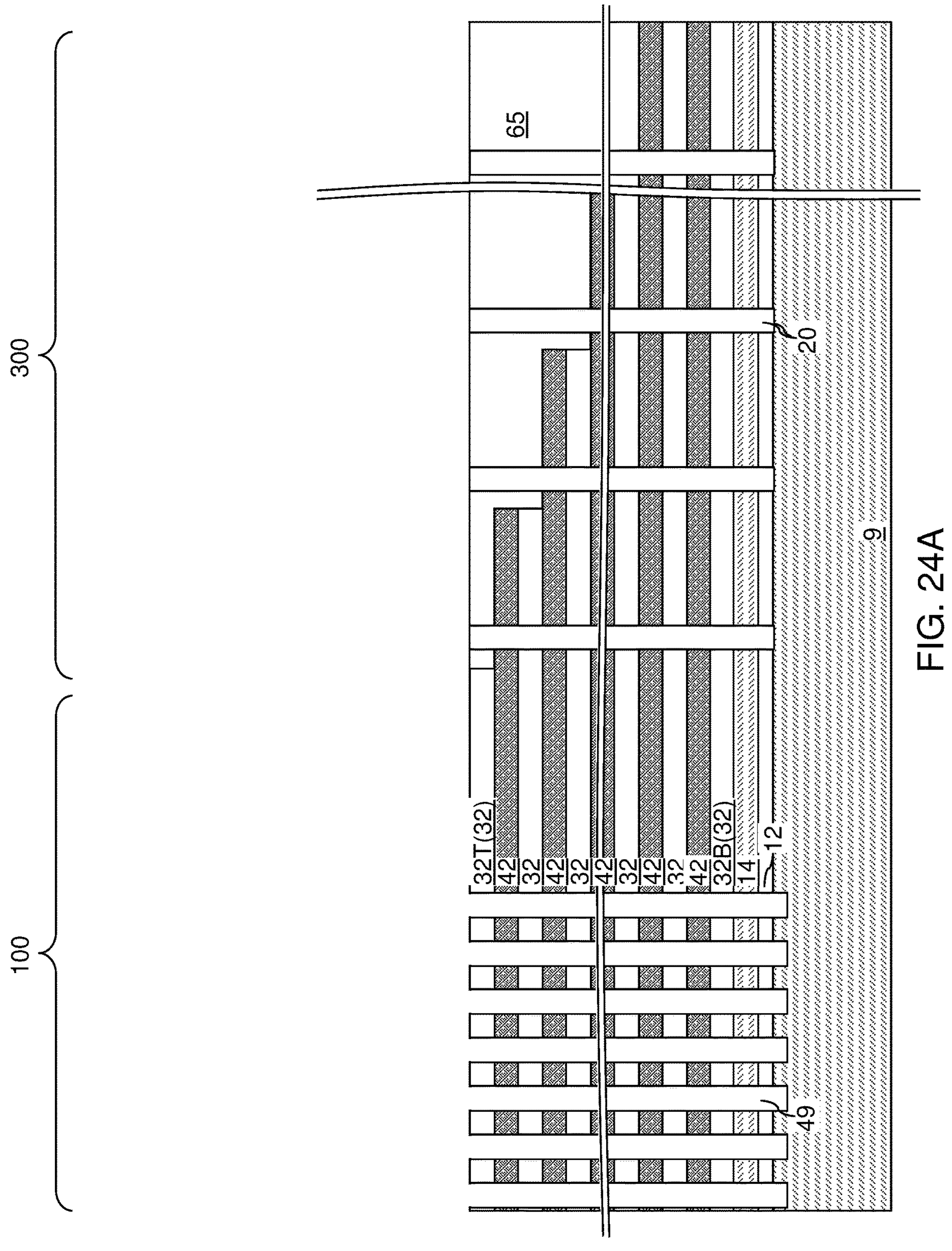
FIG. 24A is a schematic vertical cross-sectional view of the second exemplary structure after formation of memory openings according to the second embodiment of the present disclosure.
Figure 24B:
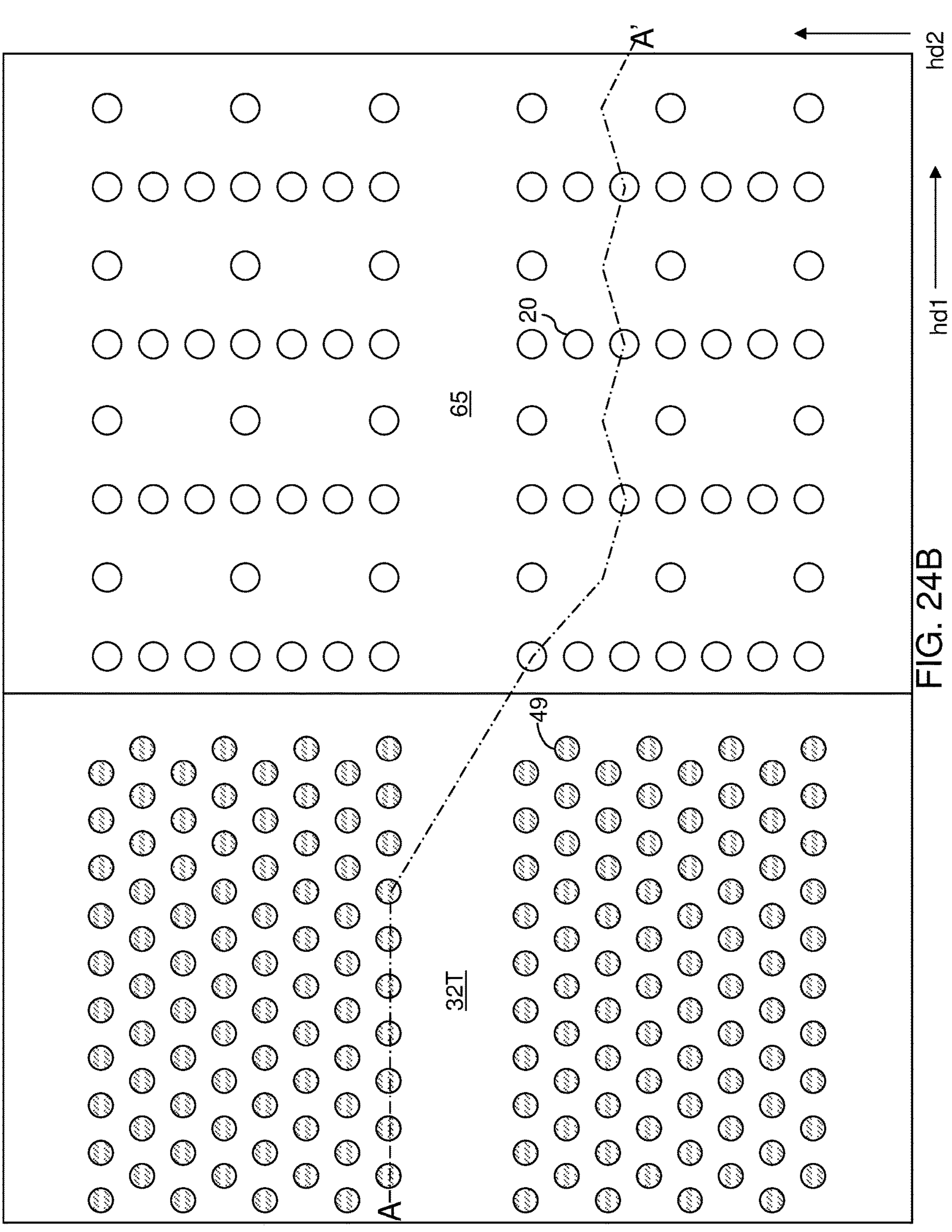
FIG. 24B is a top-down view of the second exemplary structure of FIG. 24A. The vertical plane A-A is the cut plane of the vertical cross-sectional view of FIG. 24A.
Figures 25A, 25B:
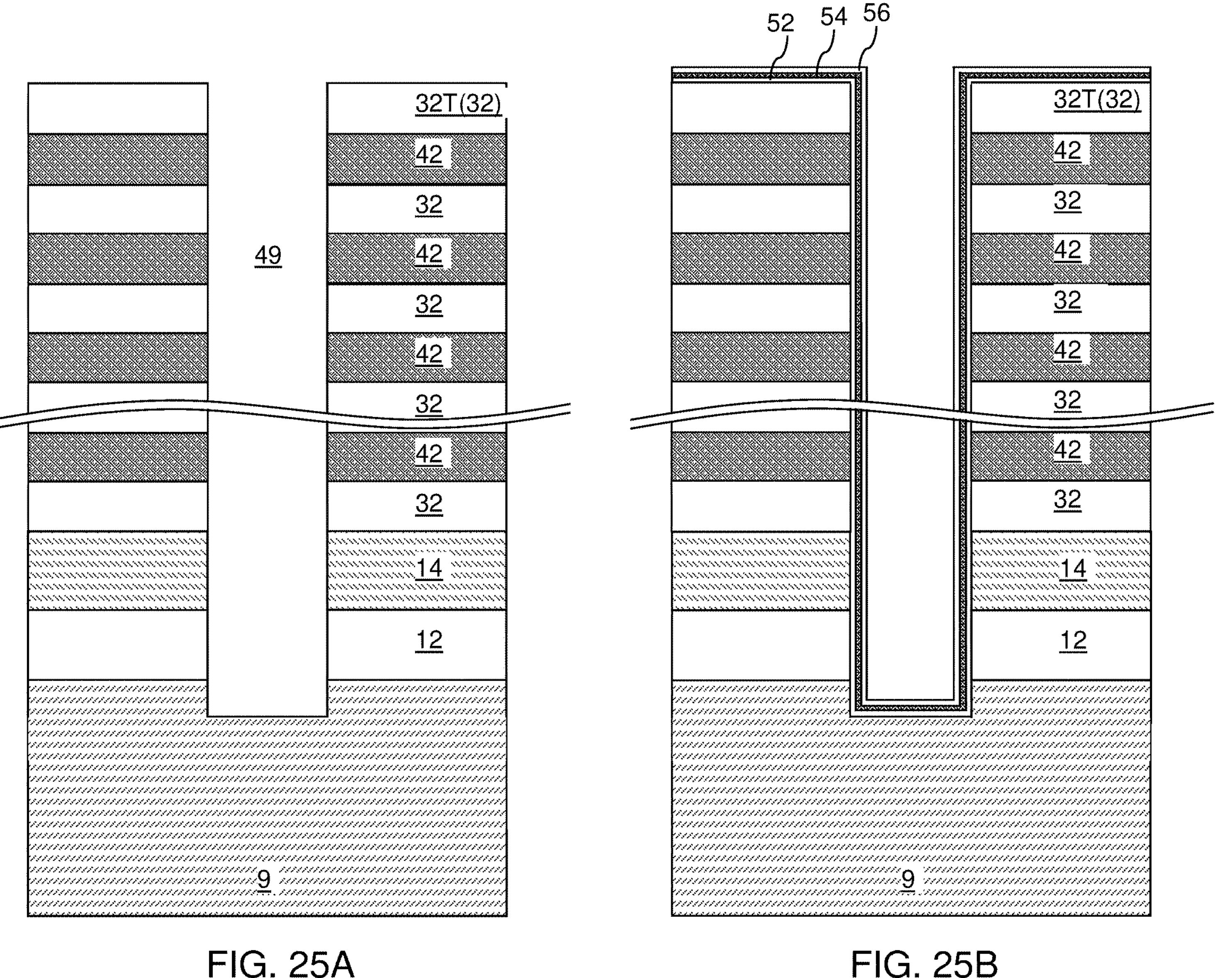
FIGS. 25A-25F are sequential vertical cross-sectional views of a memory opening during formation of a memory opening fill structure according to an embodiments of the present disclosure.
Figures 25C, 25D:
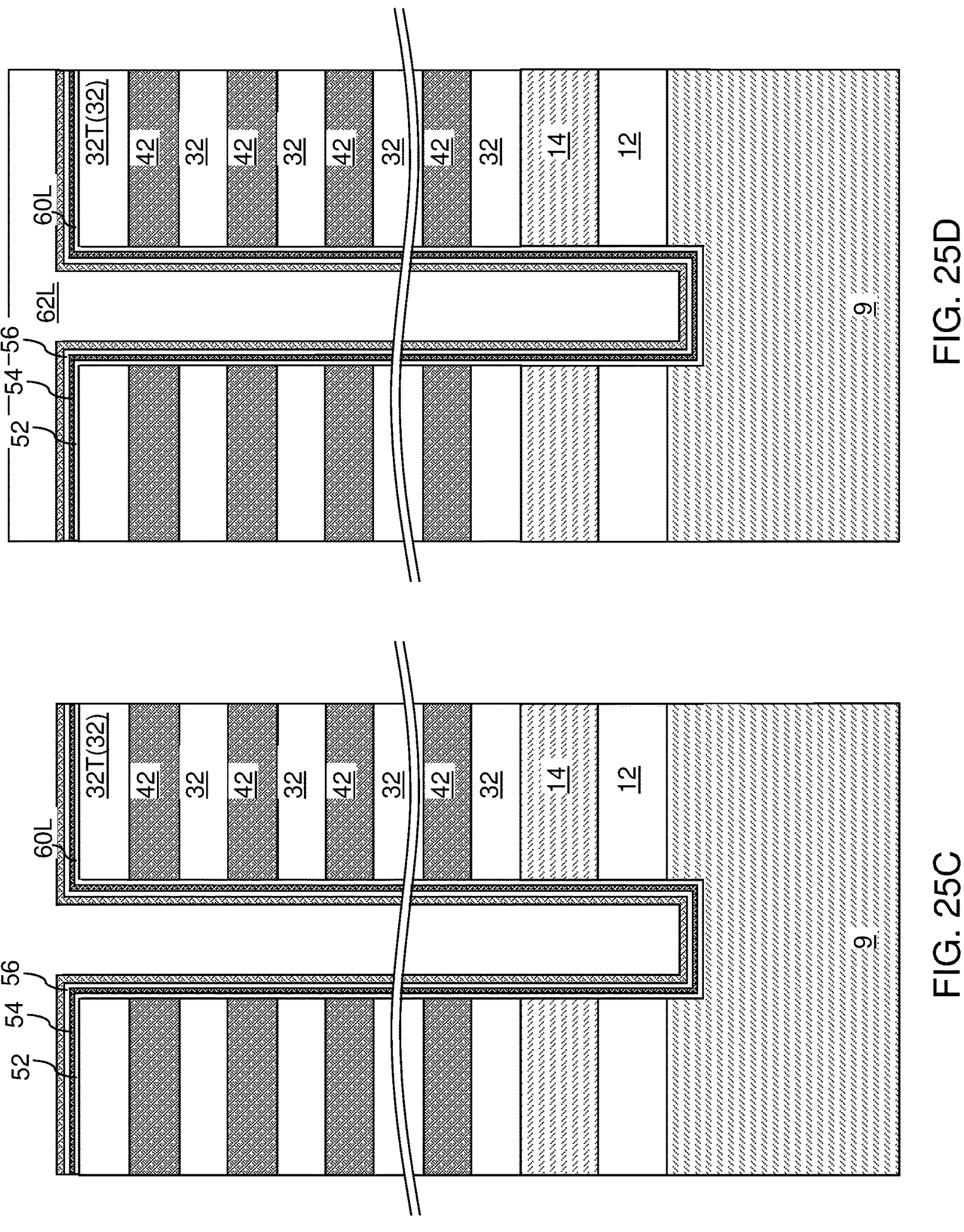
Figures 25E, 25F:
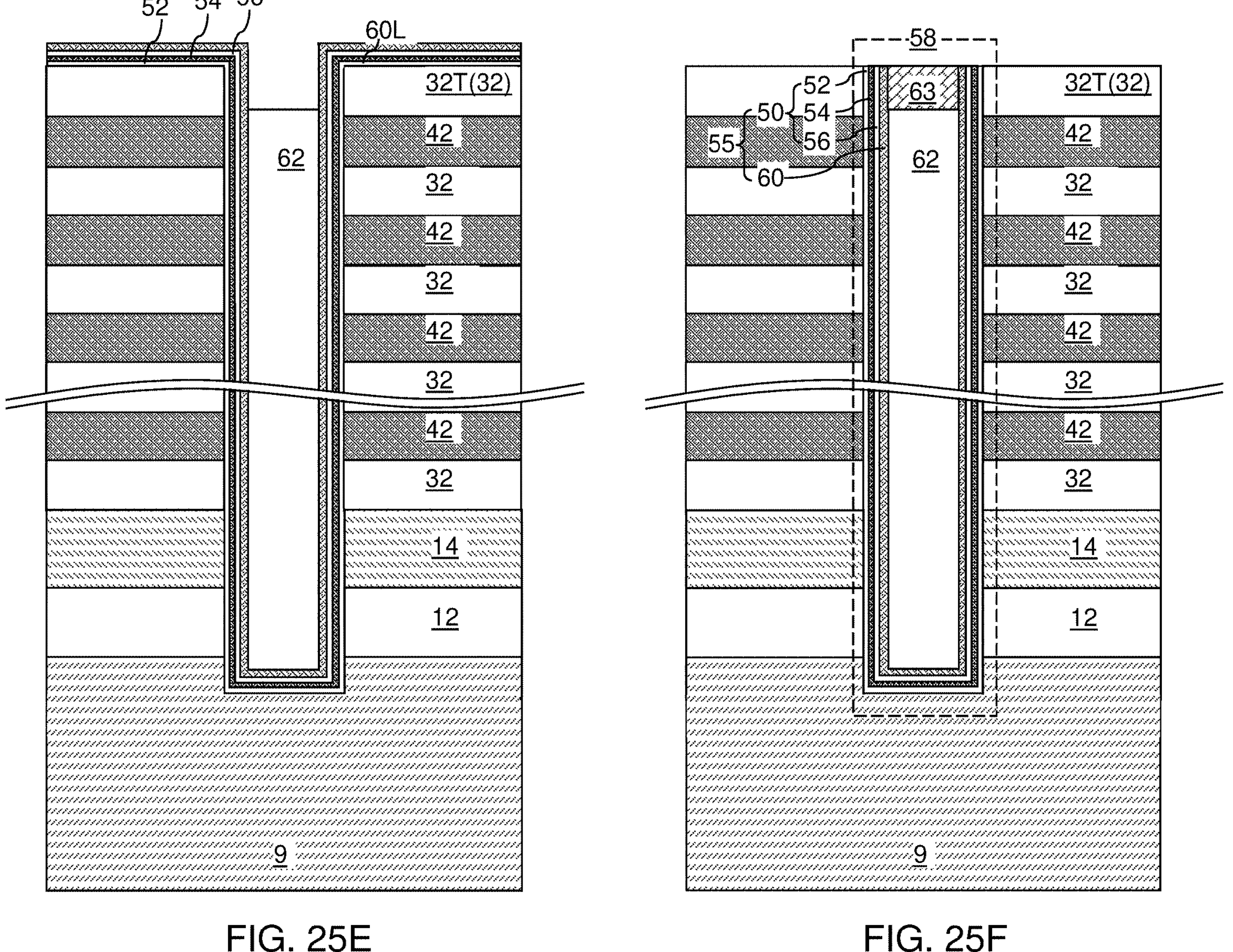

Referring to FIGS. 24A and 24B, the processing steps described with reference to FIGS. 5A and 5B may be performed, with any needed changes in the etch chemistry of anisotropic etch steps of the anisotropic etch process, to form the memory openings 49 which vertically extend through the alternating stack (32, 42), the single crystalline semiconductor layer 14, and the buried insulating layer 12. In one embodiment, bottom surfaces of the memory openings 49 may be formed below the horizontal plane including the interface between the carrier substrate 9 and the buried insulating layer 12. In one embodiment, the recess depth of the bottom surfaces of the memory openings 49 may be greater than the thickness of each memory film 50 to be subsequently formed.

FIGS. 25A-25F are sequential vertical cross-sectional views of the memory opening 49 during formation of a memory opening fill structure 58 according to an embodiments of the present disclosure. Generally, the processing steps described with reference to FIGS. 6A-6F to form the memory opening fill structure 58 within each memory opening 49.

Figure 26A:
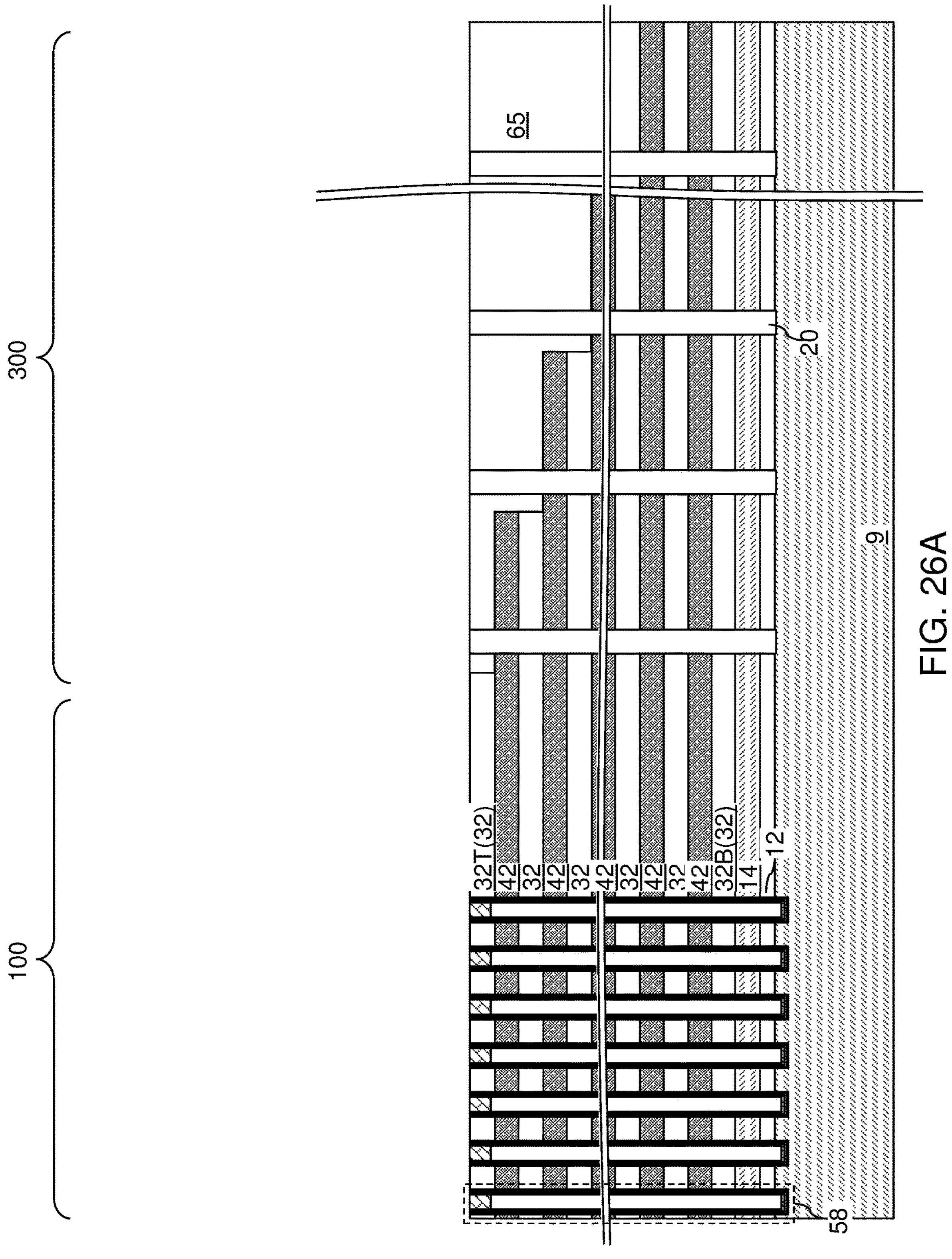
FIG. 26A is a schematic vertical cross-sectional view of the second exemplary structure after formation of memory opening fill structures according to the second embodiment of the present disclosure.
Figure 26B:
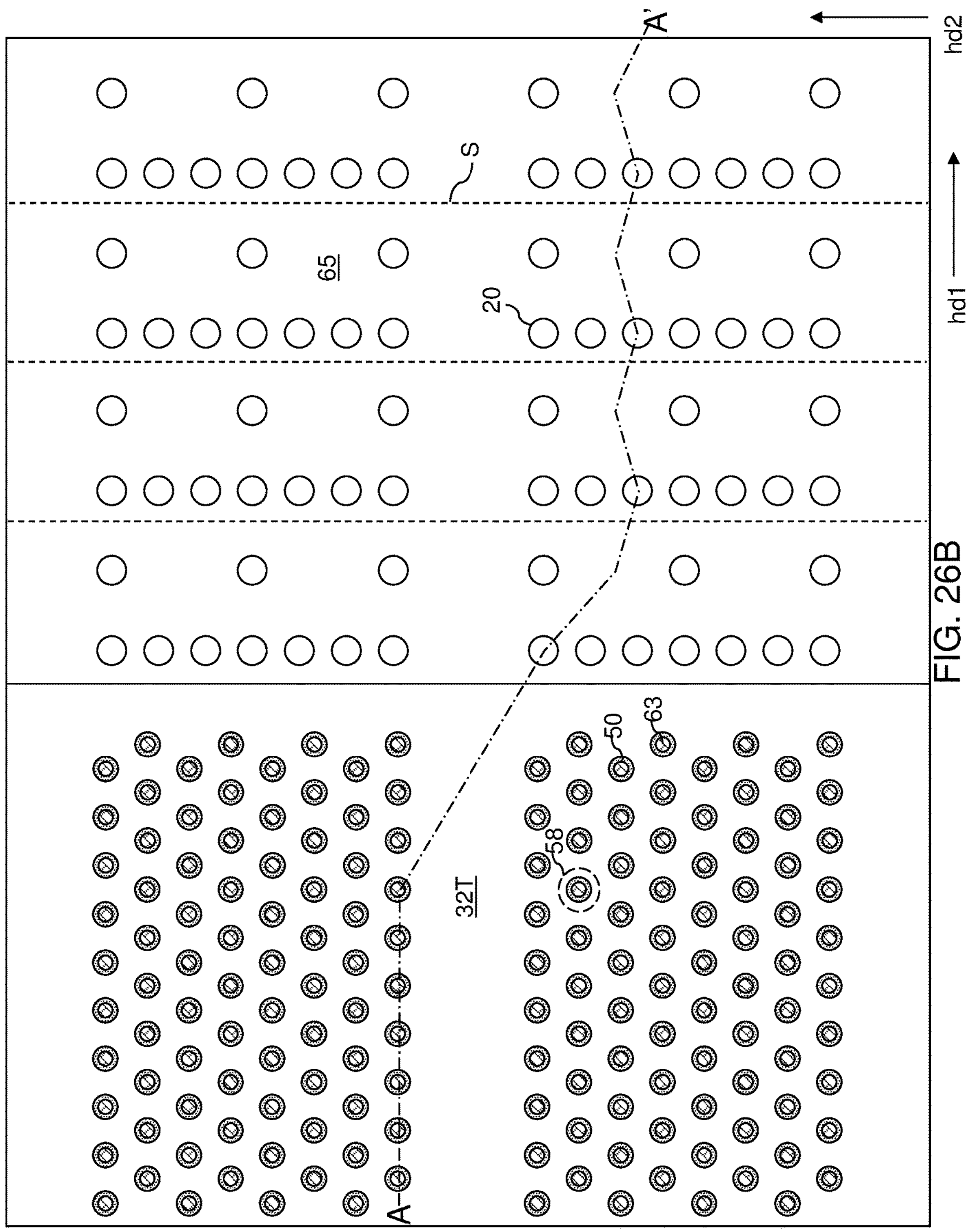
FIG. 26B is a top-down view of the second exemplary structure of FIG. 26A. The vertical plane A-A is the cut plane of the vertical cross-sectional view of FIG. 26A.

Referring to FIGS. 26A and 26B, the second exemplary structure is illustrated after formation of the memory opening fill structures 58.

Figure 27A:
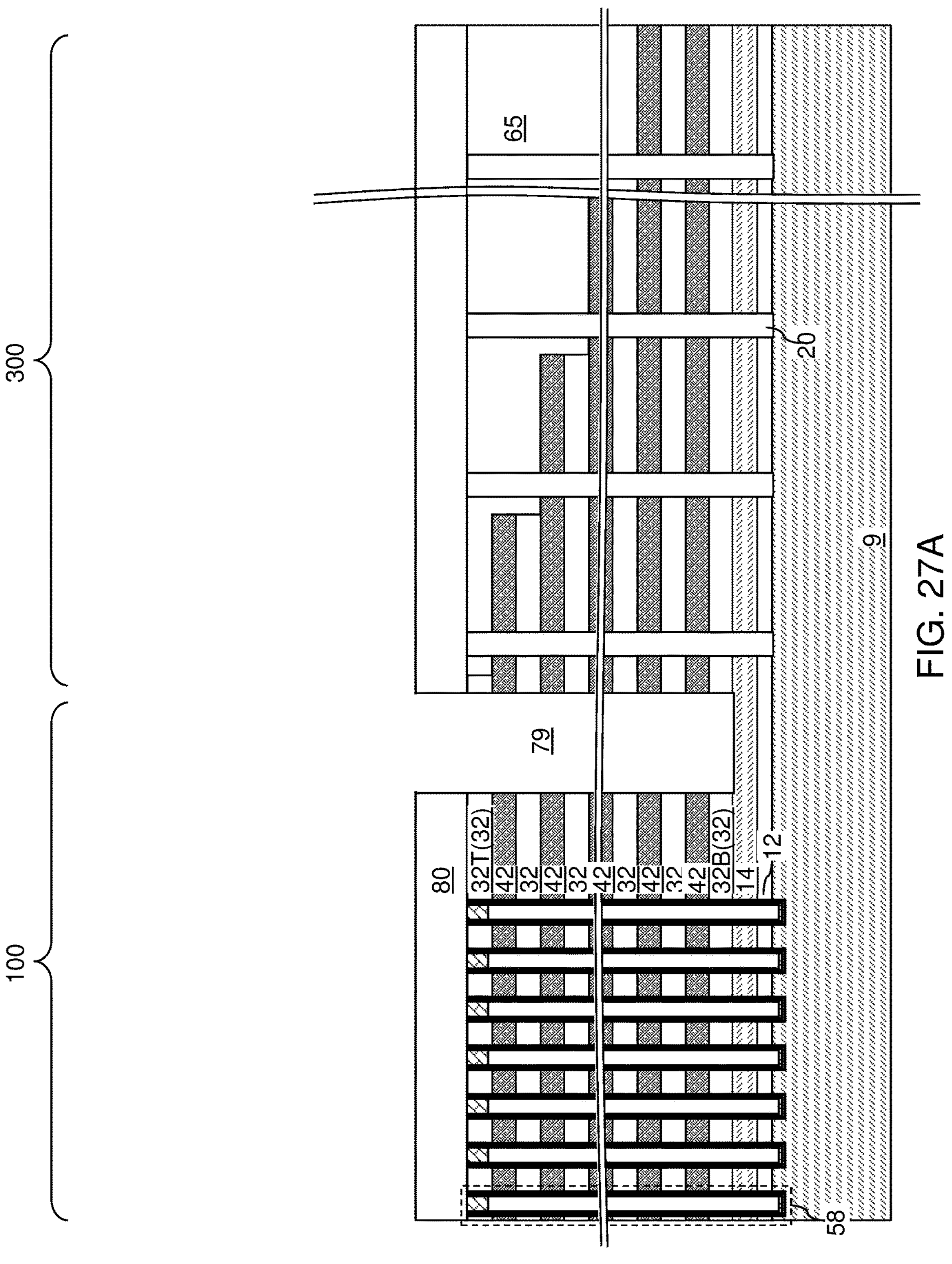
FIG. 27A is a vertical cross-sectional view of the second exemplary structure after formation of lateral isolation trenches according to the second embodiment of the present disclosure.
Figure 27B:
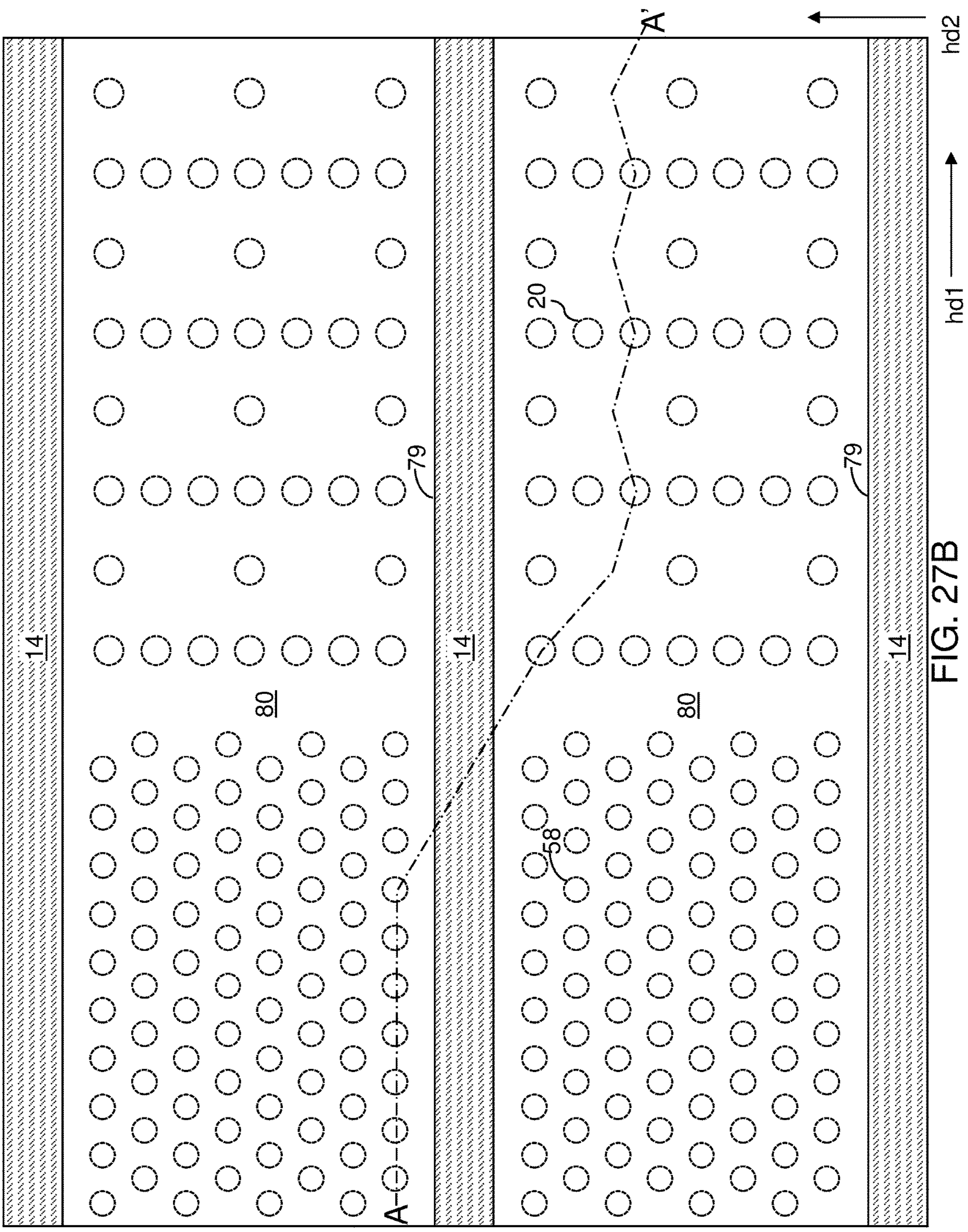
FIG. 27B is a top-down view of the second exemplary structure of FIG. 27A. The vertical plane A-A is the cut plane of the vertical cross-sectional view of FIG. 27A.

Referring to FIGS. 27A and 27B, the processing steps described with reference to FIGS. 8A and 8B can be performed to form the contact-level dielectric layer and lateral isolation trenches 79.

Figure 28:
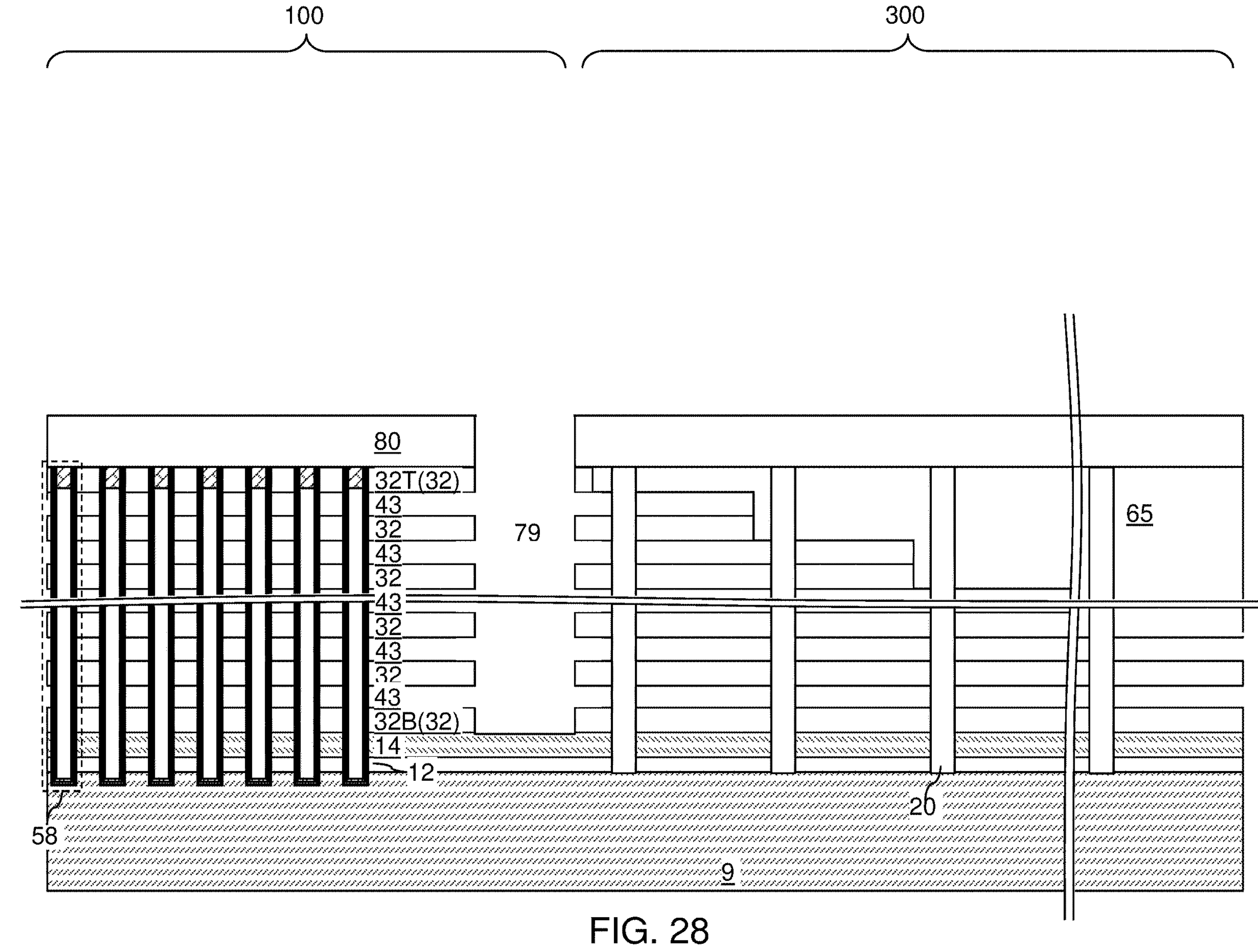
FIG. 28 is a vertical cross-sectional view of the second exemplary structure after formation of laterally-extending cavities according to the second embodiment of the present disclosure.

Referring to FIG. 28, the processing steps described with reference to FIG. 9 can be performed to form laterally-extending cavities 43.

Figure 29:
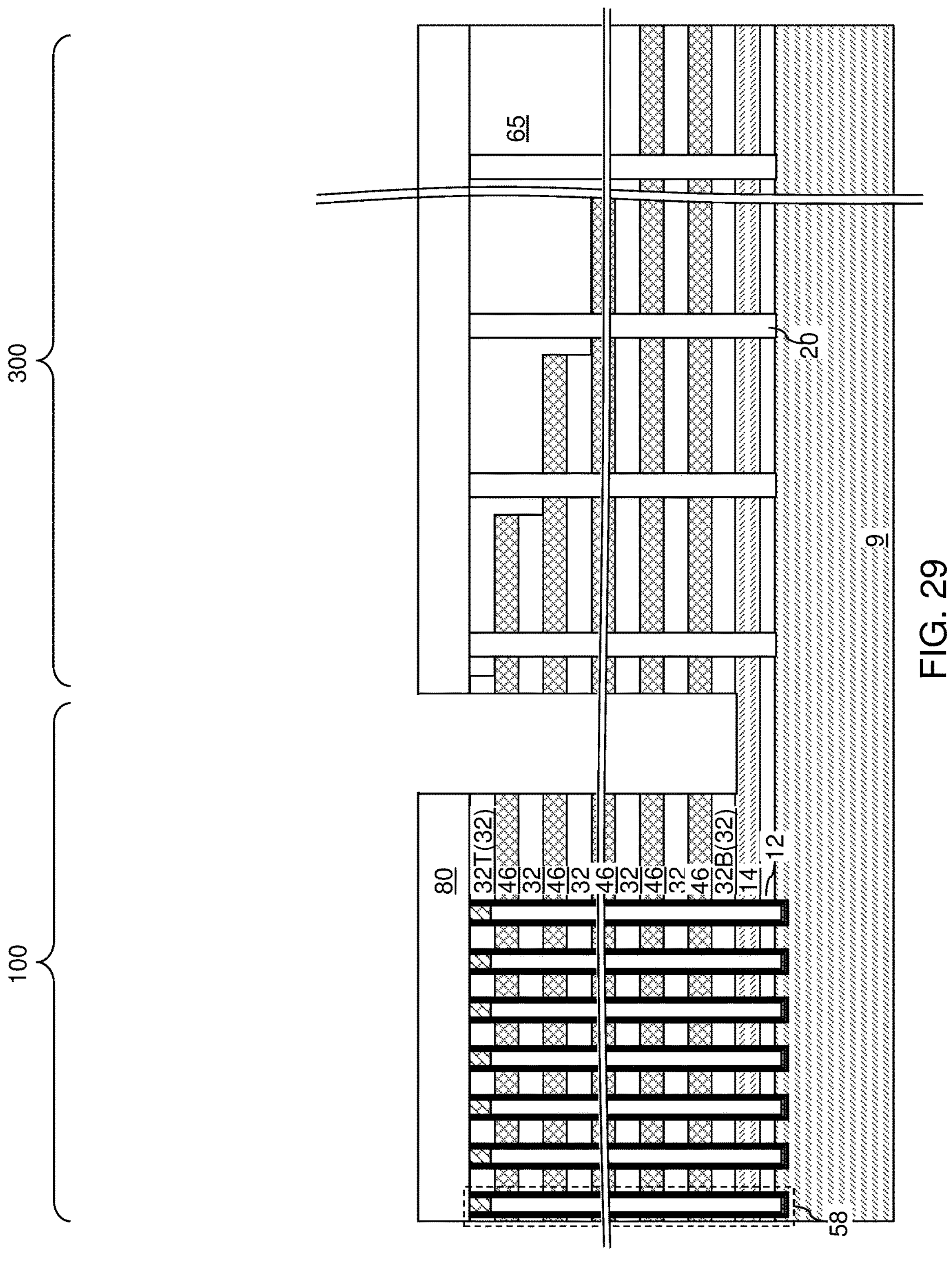
FIG. 29 is a schematic vertical cross-sectional view of the second exemplary structure after formation of electrically conductive layers according to the second embodiment of the present disclosure.

Referring to FIG. 29, the processing steps described with reference to FIG. 10 can be performed to form the optional outer blocking dielectric layer and the electrically conductive layers 46.

Figure 30A:
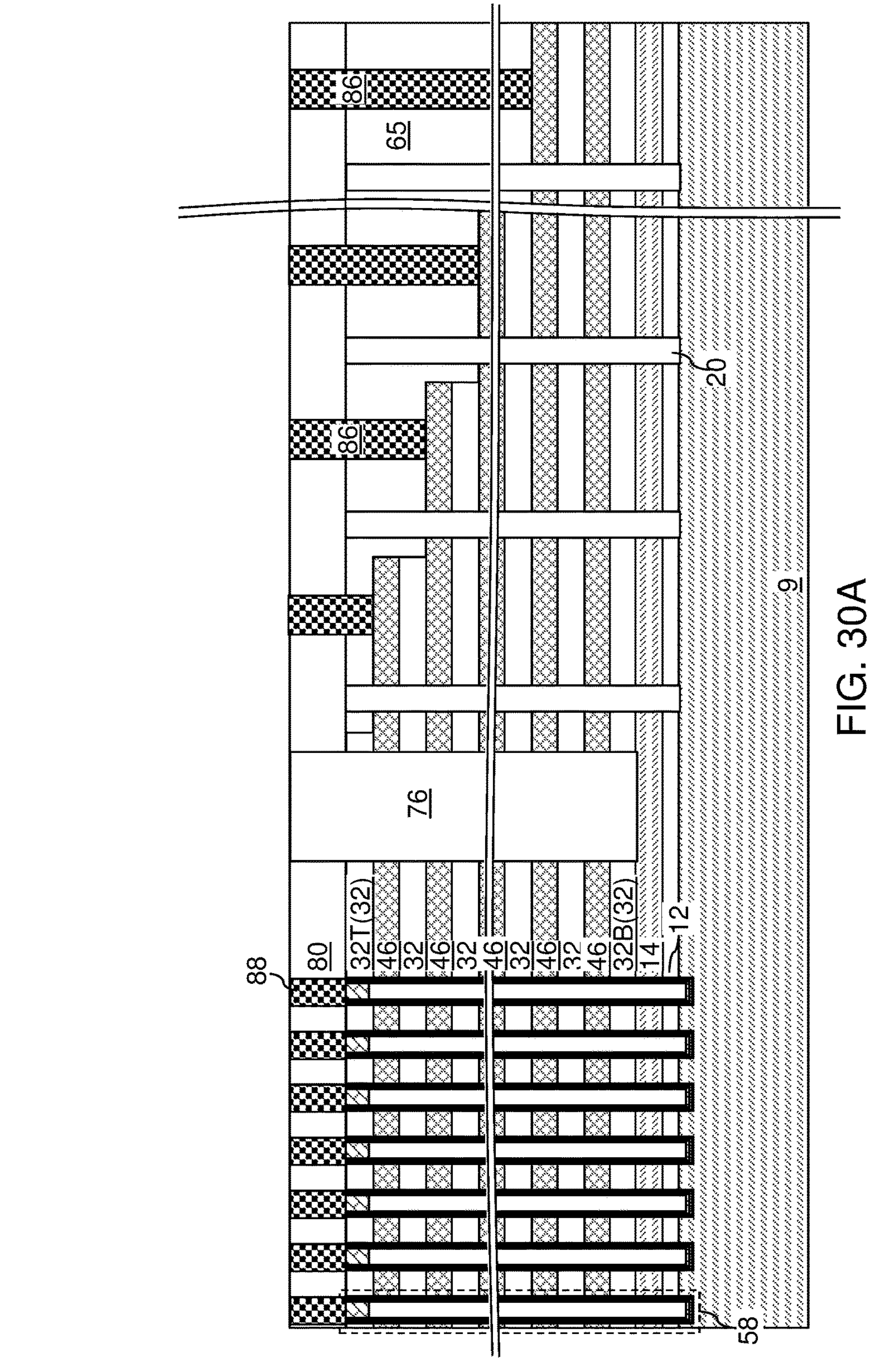
FIG. 30A is a vertical cross-sectional view of the second exemplary structure after formation of lateral isolation trench fill structures, layer contact via structures, and drain contact via structures according to the second embodiment of the present disclosure.
Figure 30B:
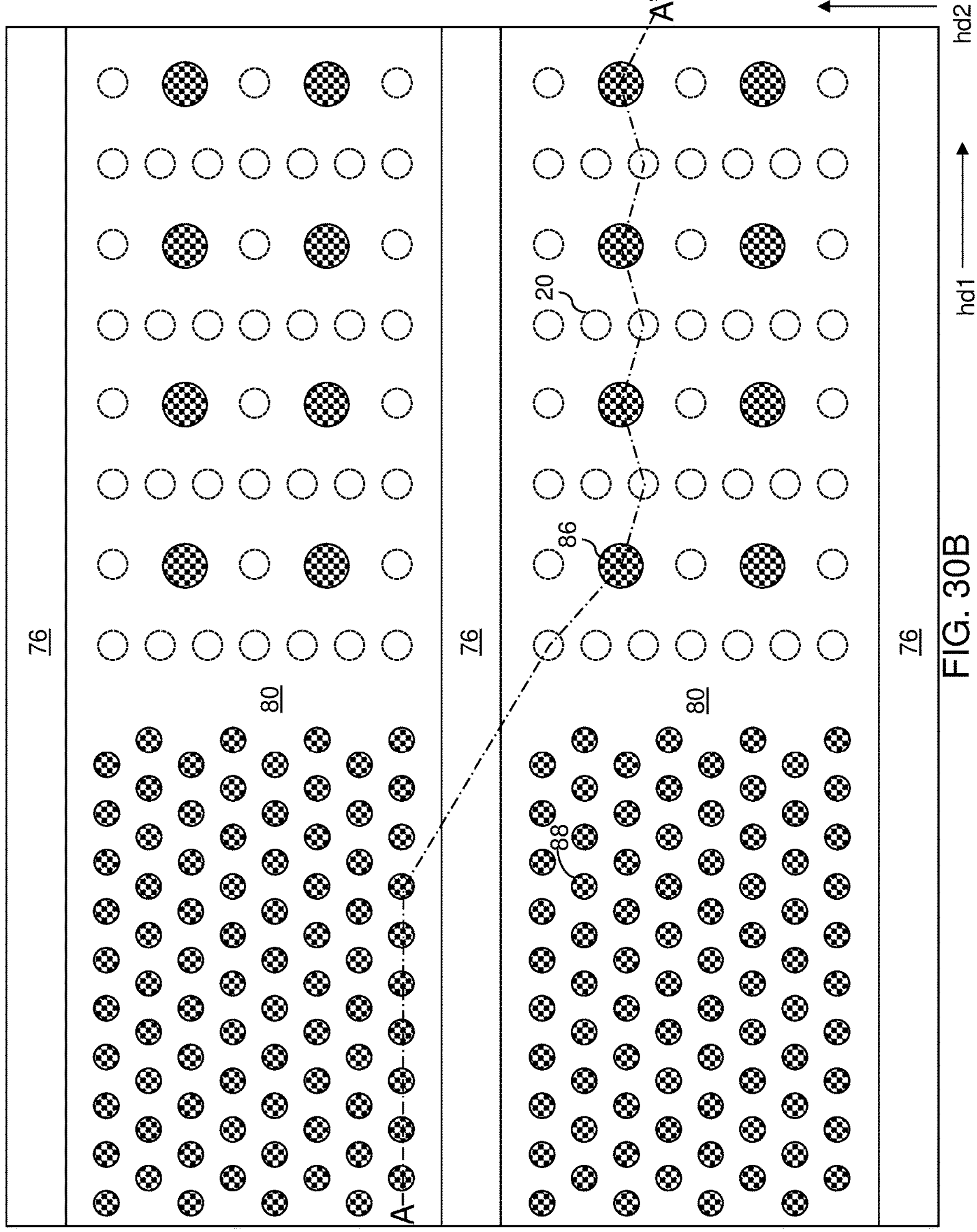
FIG. 30B is a top-down view of the second exemplary structure of FIG. 30A. The vertical plane A-A is the cut plane of the vertical cross-sectional view of FIG. 30A.

Referring to FIGS. 30A and 30B, the processing steps described with reference to FIGS. 11A and 11B can be performed to form the lateral isolation trench fill structures 76, layer contact via structures 86, and drain contact via structures 88.

Figure 31:
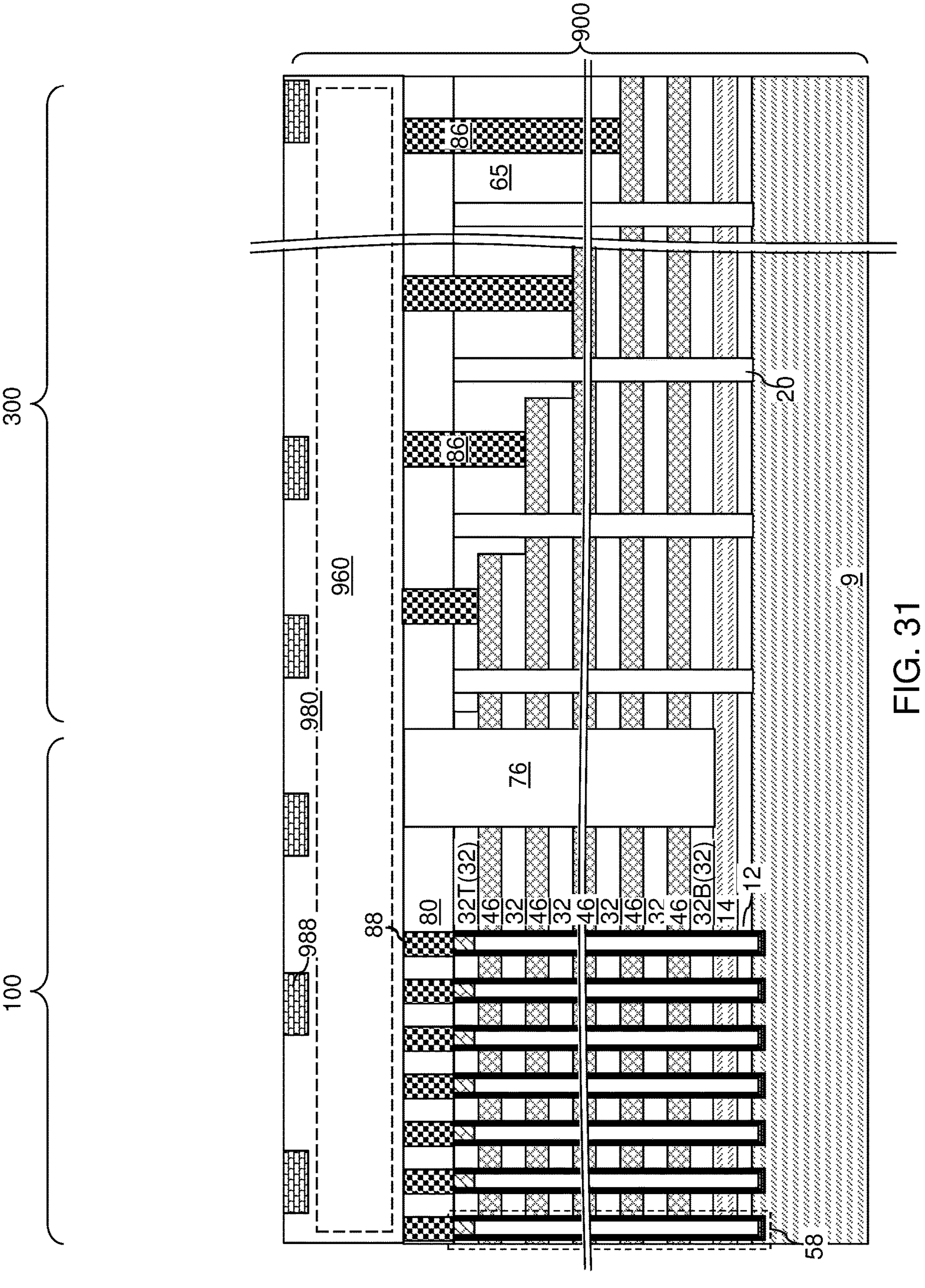
FIG. 31 is a vertical cross-sectional view of the second exemplary structure after formation of a memory die according to the second embodiment of the present disclosure.

Referring to FIG. 31, the processing steps described with reference to FIG. 12 can be performed to form the memory-side metal interconnect structures 980 embedded within memory-side dielectric material layers 960, and to form the memory-side bonding pads 988. Memory dies 900 are thus formed.

Figure 32:
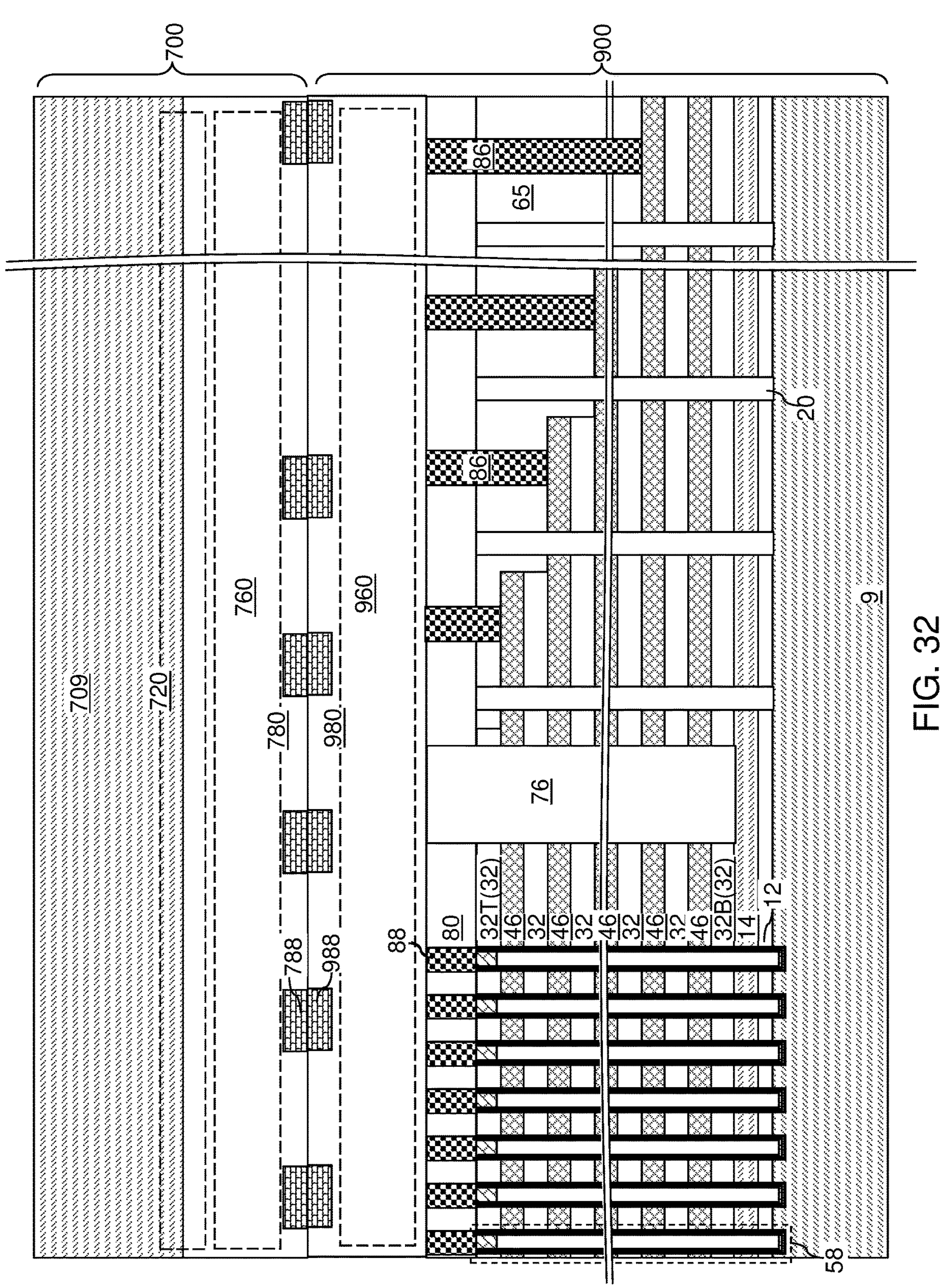
FIG. 32 is a vertical cross-sectional view of the second exemplary structure after attaching the logic die to the memory die according to the second embodiment of the present disclosure.

Referring to FIG. 32, the processing steps described with reference to FIGS. 13 and 14 can be performed to bond the logic die 700 to the memory die 900.

Figure 33A:
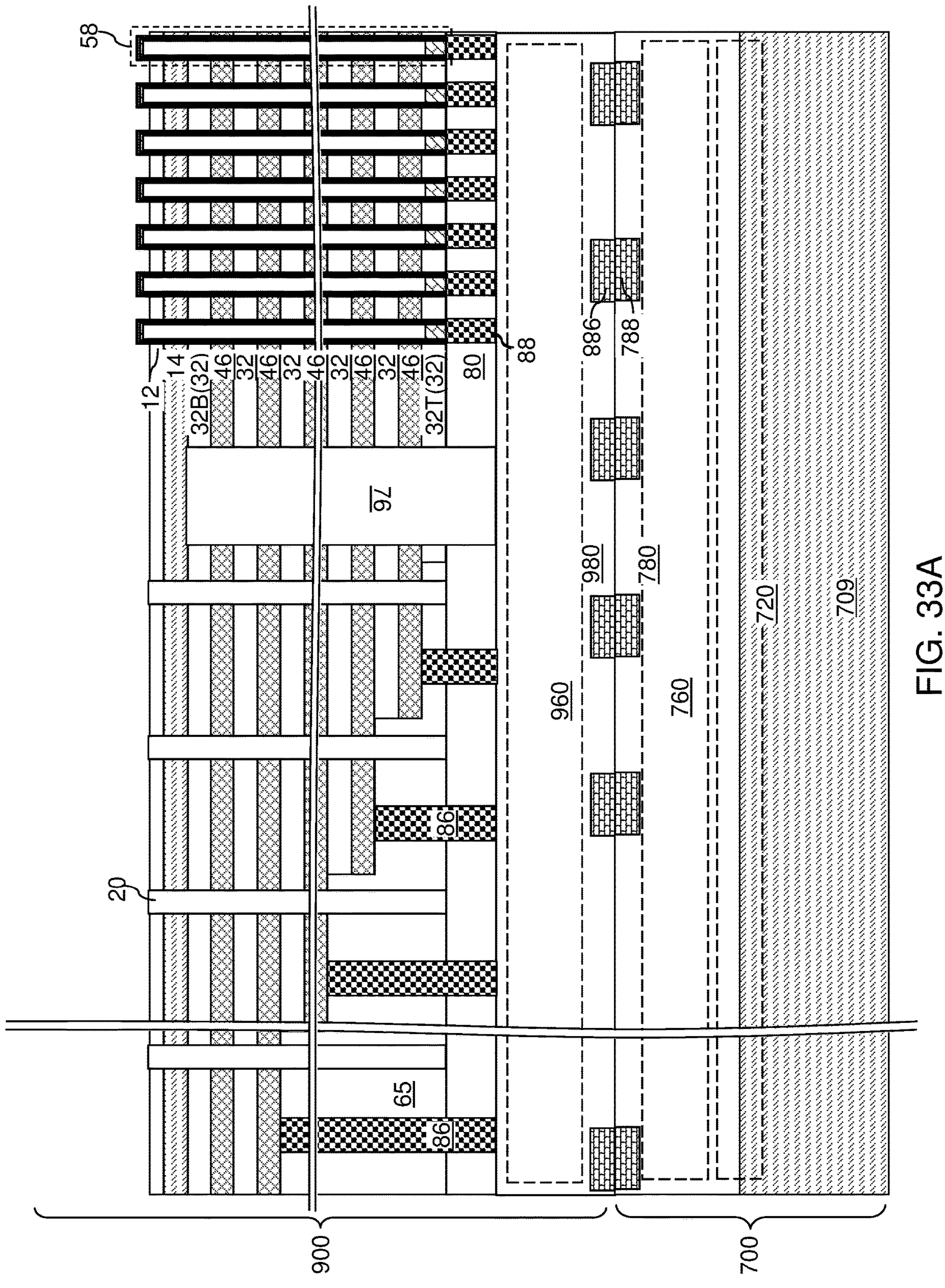
FIG. 33A is a vertical cross-sectional view of the second exemplary structure after removal of the carrier substrate according to the second embodiment of the present disclosure.
Figure 33B:
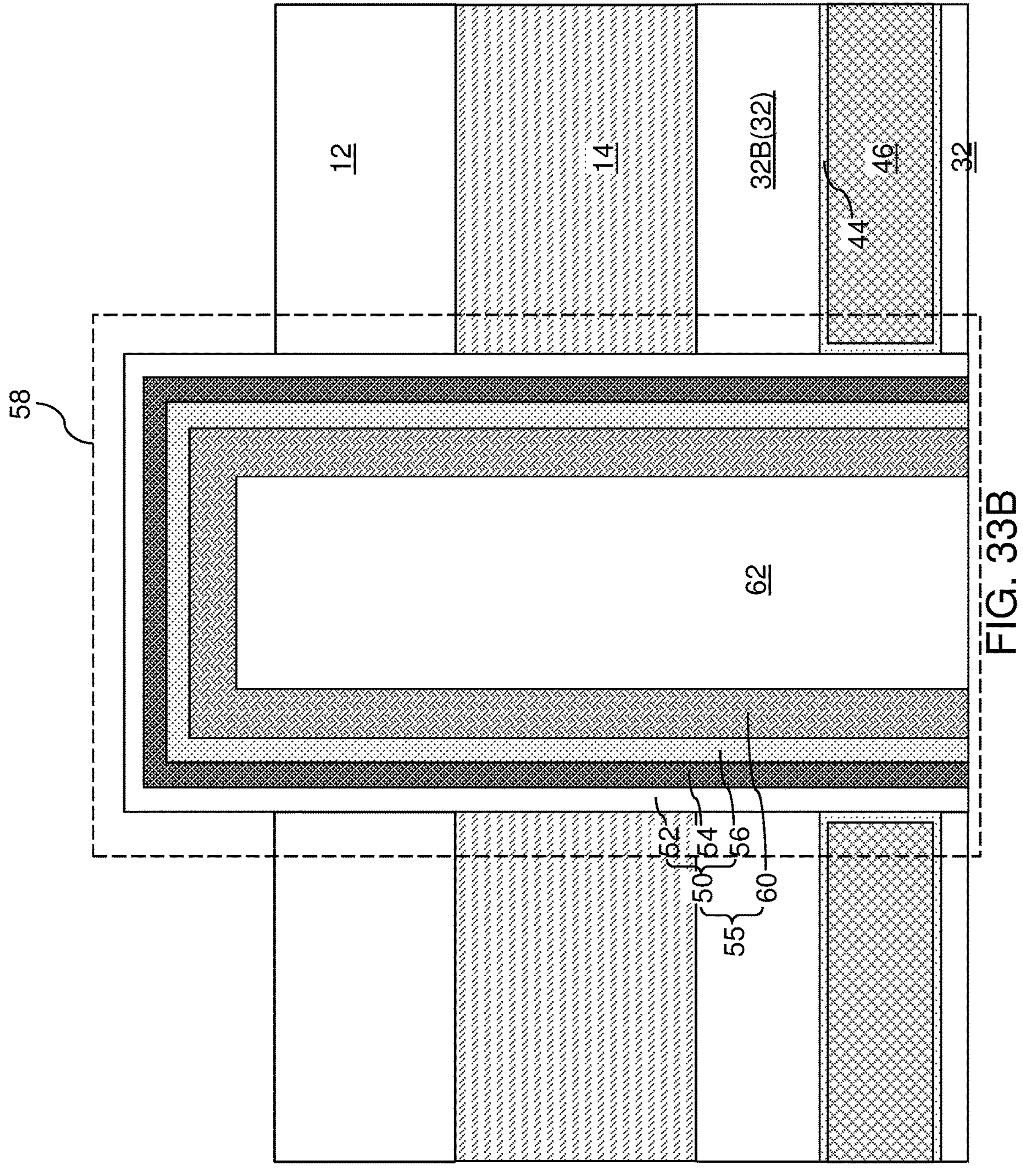
FIG. 33B is a magnified view of region B of FIG. 33A.

Referring to FIGS. 33A and 33B, the carrier substrate 9 may be removed, for example, by grinding, polishing, an anisotropic etch process, and/or an isotropic etch process selective to the buried insulating layer 12 and the memory films 50. In an illustrative example, if the carrier substrate 9 comprises silicon, then the terminal step of the at least one removal process may comprise a wet etch process using hot trimethyl-2 hydroxyethyl ammonium hydroxide ("hot TMY") or tetramethyl ammonium hydroxide (TMAH). The entirety of the carrier substrate 9 can be removed by the selective wet etch process. The backside surface, i.e., the distal surface, of the buried insulating layer 12, and the backside end surfaces of the memory opening fill structures 58 and the support pillar structures 20 can be physically exposed upon removal of the carrier substrate 9.

Figure 34A:
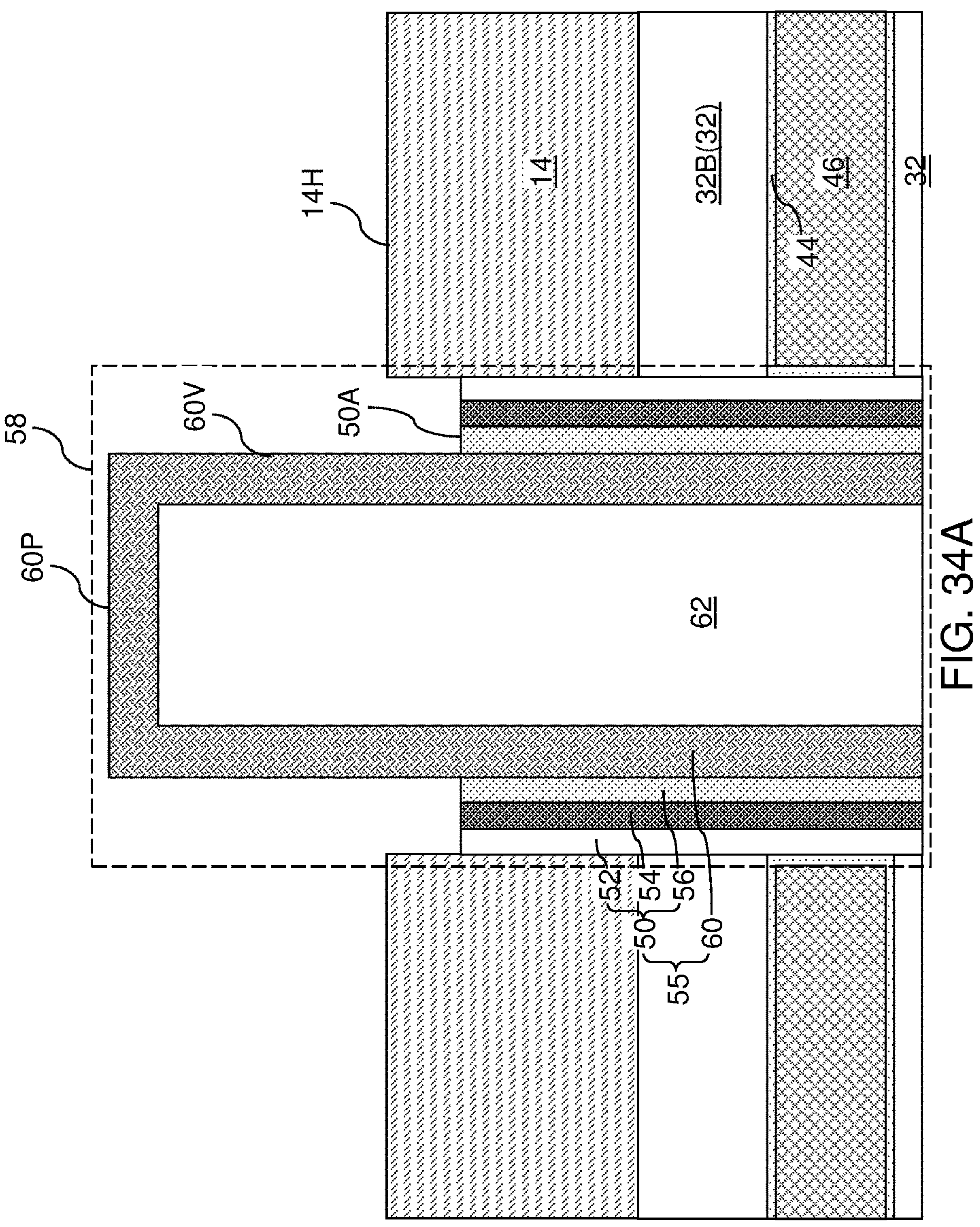
FIGS. 34A-34C are sequential vertical cross-sectional views of a region of a first configuration of the second exemplary structure during formation of a backside semiconductor source structure according to the second embodiment of the present disclosure.
Figure 34B:
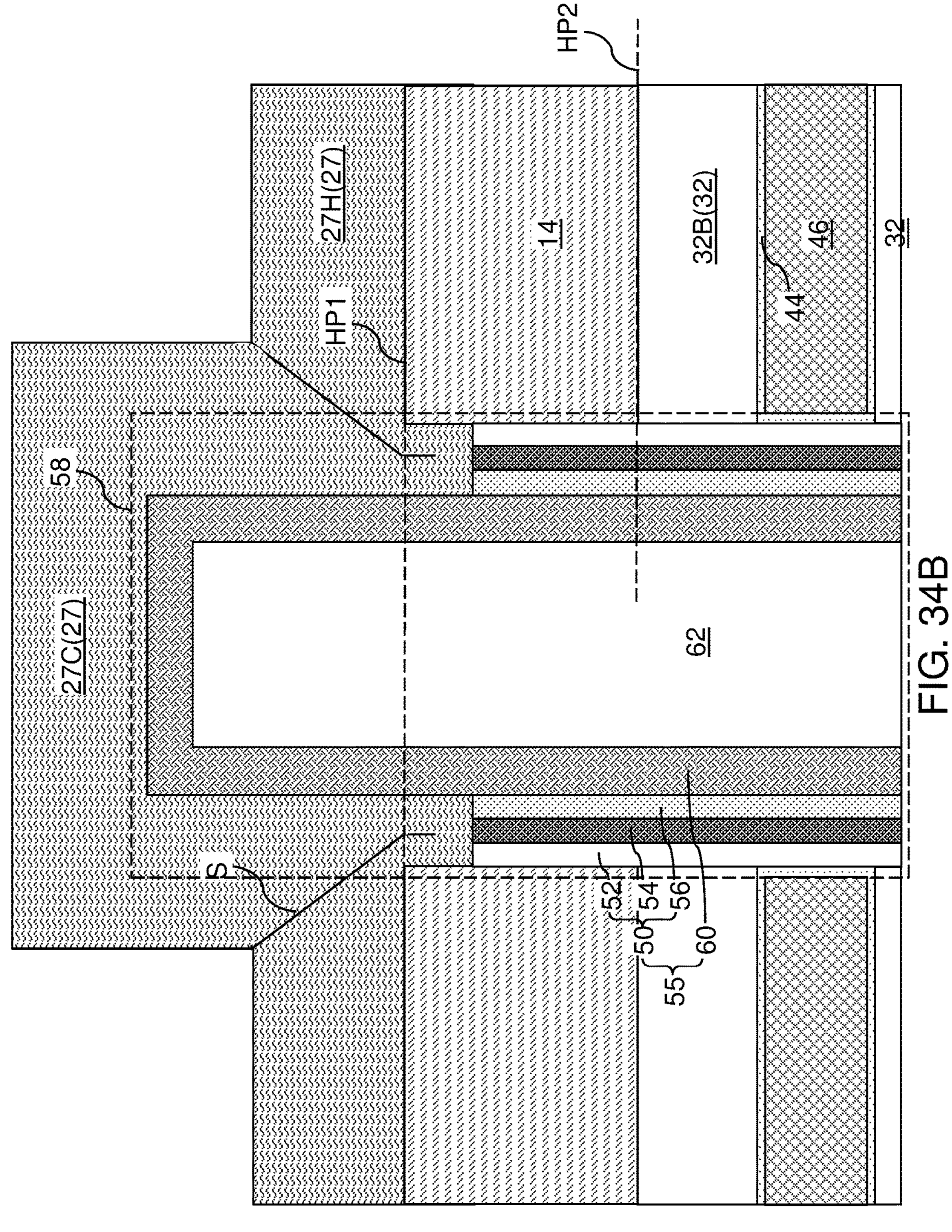
Figure 34C:
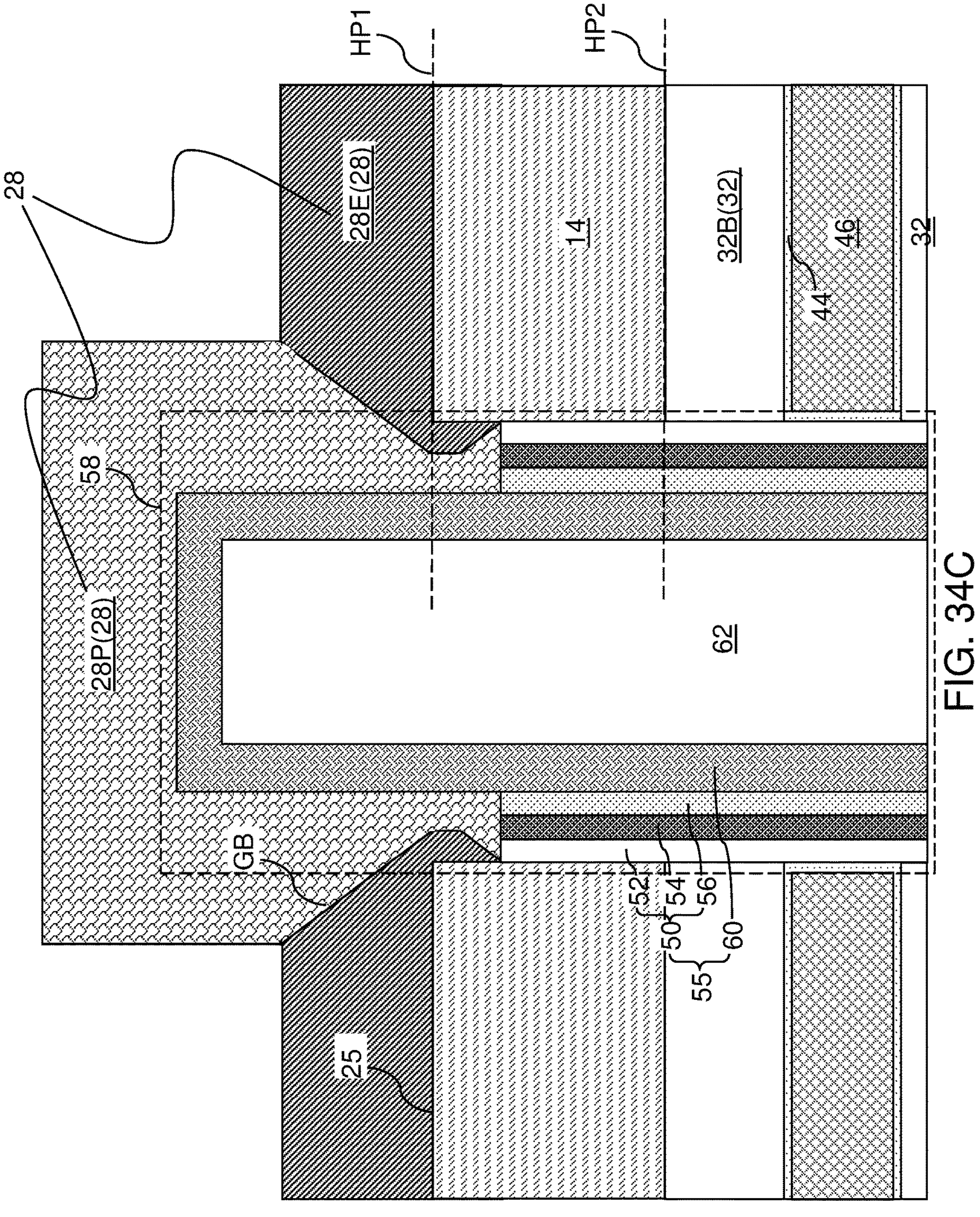

FIGS. 34A-34C are sequential vertical cross-sectional views of a region of a first configuration of the second exemplary structure during formation of a backside semiconductor source structure 28 according to the second embodiment of the present disclosure.

Referring to FIG. 34A, the buried insulating layer 12 and an end portion of the memory opening fill structure 58 can be removed such that each vertical semiconductor channel 60 and a backside surface (i.e., a distal surface) of the single crystalline semiconductor layer 14 are exposed. In one embodiment, an etch process can be performed to etch materials of the buried insulating layer 12 and the memory films 50 selective to semiconductor materials of the vertical semiconductor channel 60 and the single crystalline semiconductor layer 14. In an illustrative example, if the buried insulating layer 12 comprises silicon oxide, a wet etch process employing hydrofluoric acid can be performed to remove the buried insulating layer 12 and the silicon oxide layers (e.g., the blocking dielectric 52 and the dielectric liner 56) in the end portions of the memory films 50. A wet etch process employing phosphoric acid can be performed to remove the end portion of a silicon nitride memory material layer 54. Each vertical semiconductor channel 60 may comprise a respective planar horizontal end surface 60P and a cylindrical vertical surface segment 60V that are physically exposed after the etch process. Each remaining portion of the memory film 50 may comprise a respective annular end surface 50A that is recessed relative to the physically exposed horizontal surface 14H of the single crystalline semiconductor layer 14. In one embodiment, the annular end surface 50A of each memory film 50 may be located between a horizontal plane including an interface between the single crystalline semiconductor layer 14 and the alternating stack (32, 46).

Referring to FIG. 34B, the processing steps described with reference to FIG. 16D may be performed to form a backside semiconductor source structure including a silicon-based semiconductor material, a germanium-based semiconductor material, a silicon-germanium based semiconductor material or a stack thereof, as described above. In one embodiment, the backside semiconductor source structure can be formed as an in-process structure including an amorphous semiconductor material, which is herein referred to as an amorphous backside semiconductor source structure 27 including a planar portion 27H and cap portions 27C. The amorphous semiconductor material may comprise amorphous silicon, amorphous germanium and/or amorphous silicon-germanium. The planar portion 27H is in contact with the backside horizontal surface 14H of the single crystalline semiconductor layer 14 and has a uniform thickness throughout. The cap portion 27C is in contact with a respective vertical semiconductor channel 60, has an areal overlap with a respective memory opening fill structure 58, and vertically protrudes farther outward from the alternating stack (32, 46) than a distal surface of the planar portion 27H.

The amorphous backside semiconductor source structure 27 is doped with electrical dopants of the second conductivity type through in-situ doping or by performing an ion implantation process after a semiconductor deposition process that deposits an undoped semiconductor material. Generally, the deposition process employed to form a backside semiconductor source structure 26 as described above may be used to deposit the amorphous backside semiconductor source structure 27, provided that the semiconductor material of the amorphous backside semiconductor source structure 27 is deposited as an amorphous material. Seams S may be formed during deposition of the amorphous backside semiconductor source structure 27.

Referring to FIG. 34C, in case the amorphous backside semiconductor source structure 27 is deposited as an undoped amorphous semiconductor layer, an ion implantation process may be performed to implant dopants of the second conductivity type into the amorphous backside semiconductor source structure 27. The atomic concentration of dopants of the second conductivity type in the amorphous backside semiconductor source structure 27 may be in a range from $5\times10^{18}/cm^3$ to $2\times10^{21}/cm^3$, such as from $1\times10^{19}/cm^3$ to $1\times10^{21}/cm^3$, although lesser and greater concentrations may also be employed.

The amorphous backside semiconductor source structure 27 is converted into a crystalline backside semiconductor source structure 28 by performing a crystallization process. The backside semiconductor source structure 28 includes a planar portion 28E and cap portions 28P. The planar portion 28E is in contact with the backside horizontal surface 14H of the single crystalline semiconductor layer 14 and has a uniform thickness throughout, and the cap portion 28P is in contact with a respective vertical semiconductor channel 60, has an areal overlap with a respective memory opening fill structure 58, and vertically protrudes farther outward from the alternating stack (32, 46) than a distal surface of the planar portion 28E.

In one embodiment, the crystallization process comprises a laser anneal process. The laser anneal process activates electrical dopants of the second conductivity type while converting the amorphous backside semiconductor source structure 27 into a crystalline semiconductor material layer. According to an aspect of the present disclosure, the laser power and the duration of the laser irradiation per unit area during the laser irradiation process can be selected to induce crystallographic alignment between the crystalline materials of the planar portion 28E and the cap portions 28P of the backside semiconductor source structure 28 and the crystallographic structures of underlying semiconductor surfaces, i.e., the surfaces of the single crystalline semiconductor layer 14 and the vertical semiconductor channels 60. In one embodiment, the planar portion 28E of the backside semiconductor source structure 28 may be formed as a single crystalline semiconductor material layer in epitaxial alignment with the single crystalline semiconductor structure of the single crystalline semiconductor layer 14. Thus, the planar portions 28E of the backside semiconductor source structure 28 are also referred to as an epitaxial doped semiconductor (e.g., Si, Ge and/or SiGe) portion 28E. The cap portions 28P are formed as polycrystalline semiconductor material portions including plural crystal grains separated by grain boundaries. As such, the cap portions 28P are also referred to as polycrystalline doped semiconductor (e.g., Si, Ge and/or SiGe) portions 28P. Each seam as formed at the processing steps of FIG. 34B may be converted into a grain boundary GB.

In an embodiment described with reference to FIGS. 34B and 34C, the epitaxial doped semiconductor portion 28E and the polycrystalline doped semiconductor portion 28P are formed by performing a semiconductor deposition process that deposits an amorphous semiconductor material layer, and by performing a crystallization process that induces epitaxial alignment between crystallized portions of the amorphous semiconductor material layer and the single crystalline semiconductor layer 14. In one embodiment, boundary between the epitaxial doped semiconductor portion 28E and the polycrystalline doped semiconductor portion 28P may comprise a continuously extending grain boundary GB that extends from the memory film 50 to a backside surface of the backside semiconductor source structure 28.

In an alternative embodiment shown in FIG. 36 and described below, separate amorphous semiconductor material deposition and its crystallization steps are omitted, and the semiconductor material is deposited in the crystalline (e.g., single crystalline and/or polycrystalline) state. In this embodiment, the process parameters (e.g., the deposition temperature, reactant pressure, species of reactant gas used, etc.) used at the processing steps described with reference to FIG. 34B are selected to deposit a crystalline backside semiconductor source structure is formed in lieu of an amorphous backside semiconductor source structure 27. In other words, the epitaxial doped semiconductor portion 28E and the polycrystalline doped semiconductor portion 28P can be formed by performing an epitaxial semiconductor deposition process. In this case, the structure illustrated in FIG. 34C may be obtained directly without formation of the intermediate structure of FIG. 34C which includes the amorphous semiconductor source structure 27. An optional laser anneal can be subsequently performed to activate the dopants of the second conductivity type in the backside semiconductor source structure 28. Optionally, a boundary between the epitaxial doped semiconductor portion 28E and the polycrystalline doped semiconductor portion 28P may comprise a continuously extending grain boundary GB that extends from the memory film 50 to a backside surface of the backside semiconductor source structure 28.

In summary, a backside semiconductor source structure 28 can be formed on each vertical semiconductor channel 60 and the backside horizontal surface 14H of the single crystalline semiconductor layer 14. The backside semiconductor source structure 28 comprises an epitaxial doped semiconductor portion 28E that is formed on a backside horizontal surface 14H of the single crystalline semiconductor layer 14 and in epitaxial alignment with a single crystalline structure of the single crystalline semiconductor layer 14, and a polycrystalline doped semiconductor portions 28P that are formed on the vertical semiconductor channels 60. In one embodiment, the above described horizontal interface 25 between the single crystalline semiconductor layer 14 and the epitaxial doped semiconductor portion 28E is formed in a first horizontal plane HP1.

In one embodiment, the epitaxial doped semiconductor portion 28E comprises a portion located on the distal backside horizontal surface 14H of the single crystalline semiconductor layer 14. In one embodiment, an interface between the epitaxial doped semiconductor portion 28E and the polycrystalline doped semiconductor portion 28P comprises a tapered annular surface (e.g., the grain boundary GB) having a variable lateral extent that increases with a vertical distance from a horizontal plane including the distal backside horizonal surface 14H of the single crystalline semiconductor layer 14.

In one embodiment, the horizontal interface 25 between the single crystalline semiconductor layer 14 and the epitaxial doped semiconductor portion 28E is located in a first horizontal plane HP1; the memory opening fill structure 58 comprises a dielectric core 62 that is laterally surrounded by the vertical semiconductor channel 60; and an end surface of the dielectric core 62 is more distal from a second horizontal plane HP2 including an interface between the single crystalline semiconductor layer 14 and the alternating stack (32, 46) than the first horizontal plane HP1 is from the second horizontal plane HP2. In one embodiment, the backside semiconductor source structure 28 is not contact with the dielectric core 62, and is spaced from the dielectric core 62 by the horizontal portion 60H of the vertical semiconductor channel 60.

Figure 35A:
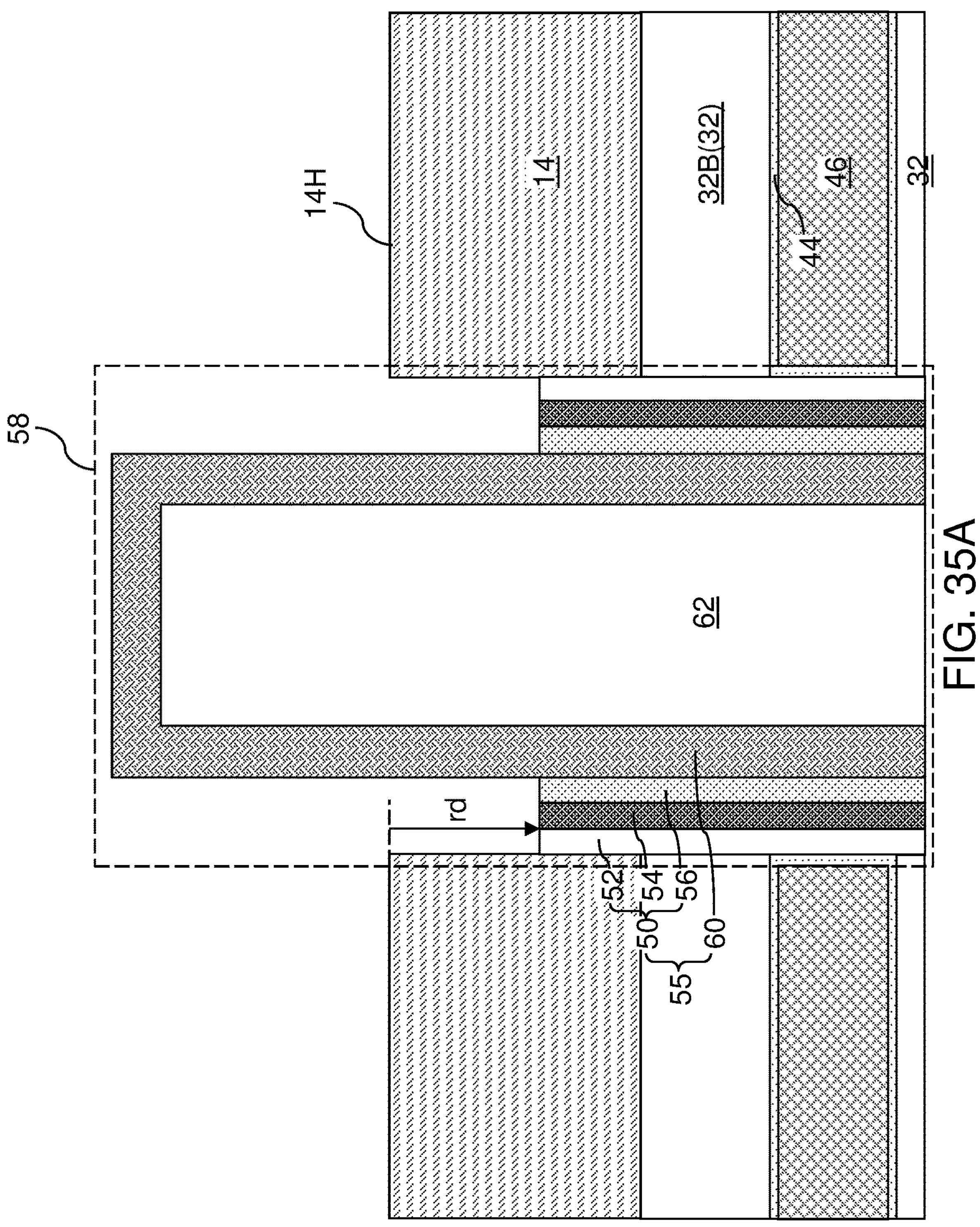
FIGS. 35A-35C are sequential vertical cross-sectional views of a region of a second configuration of the second exemplary structure during formation of a backside semiconductor source structure according to the second embodiment of the present disclosure.
Figure 35B:
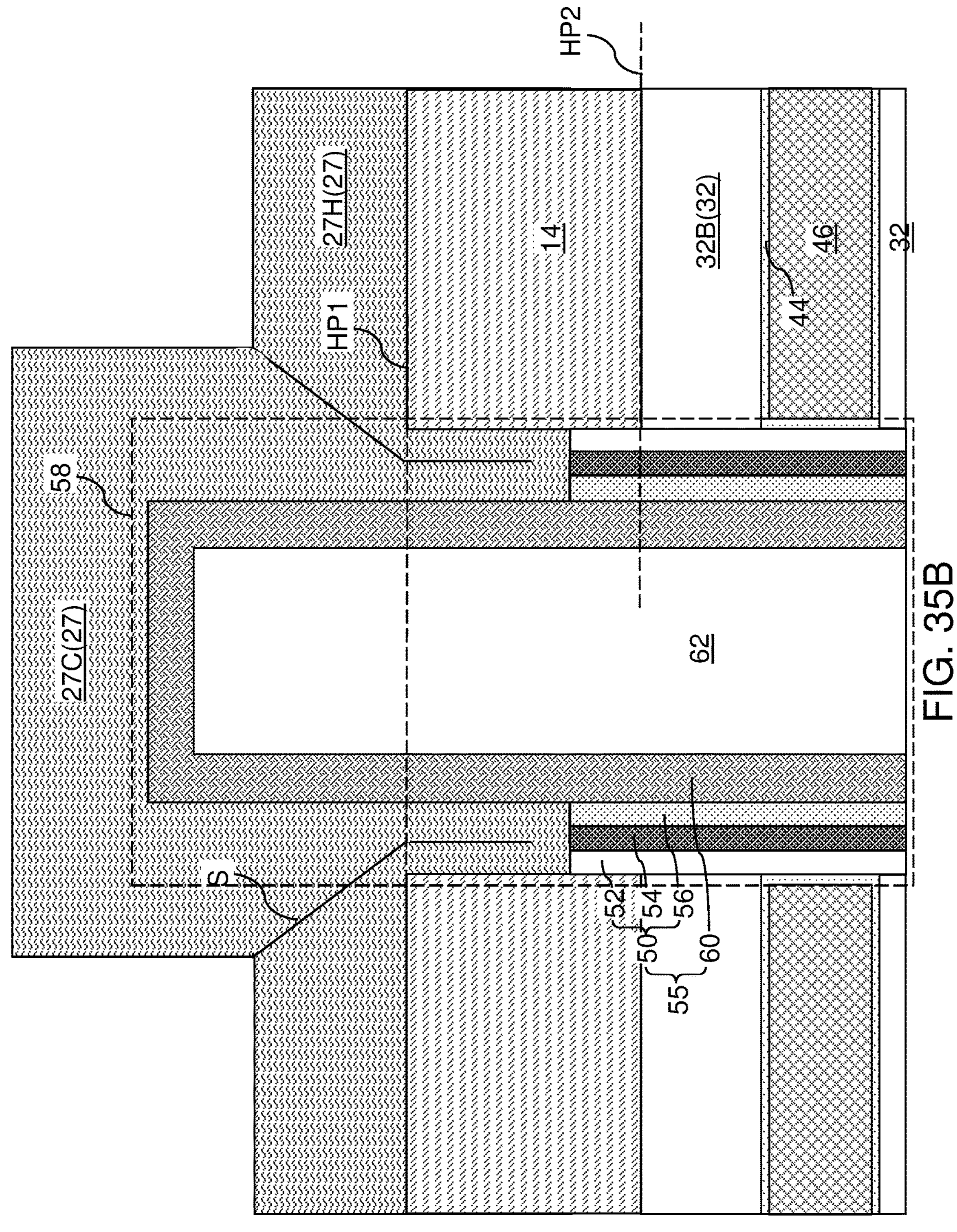
Figure 35C:
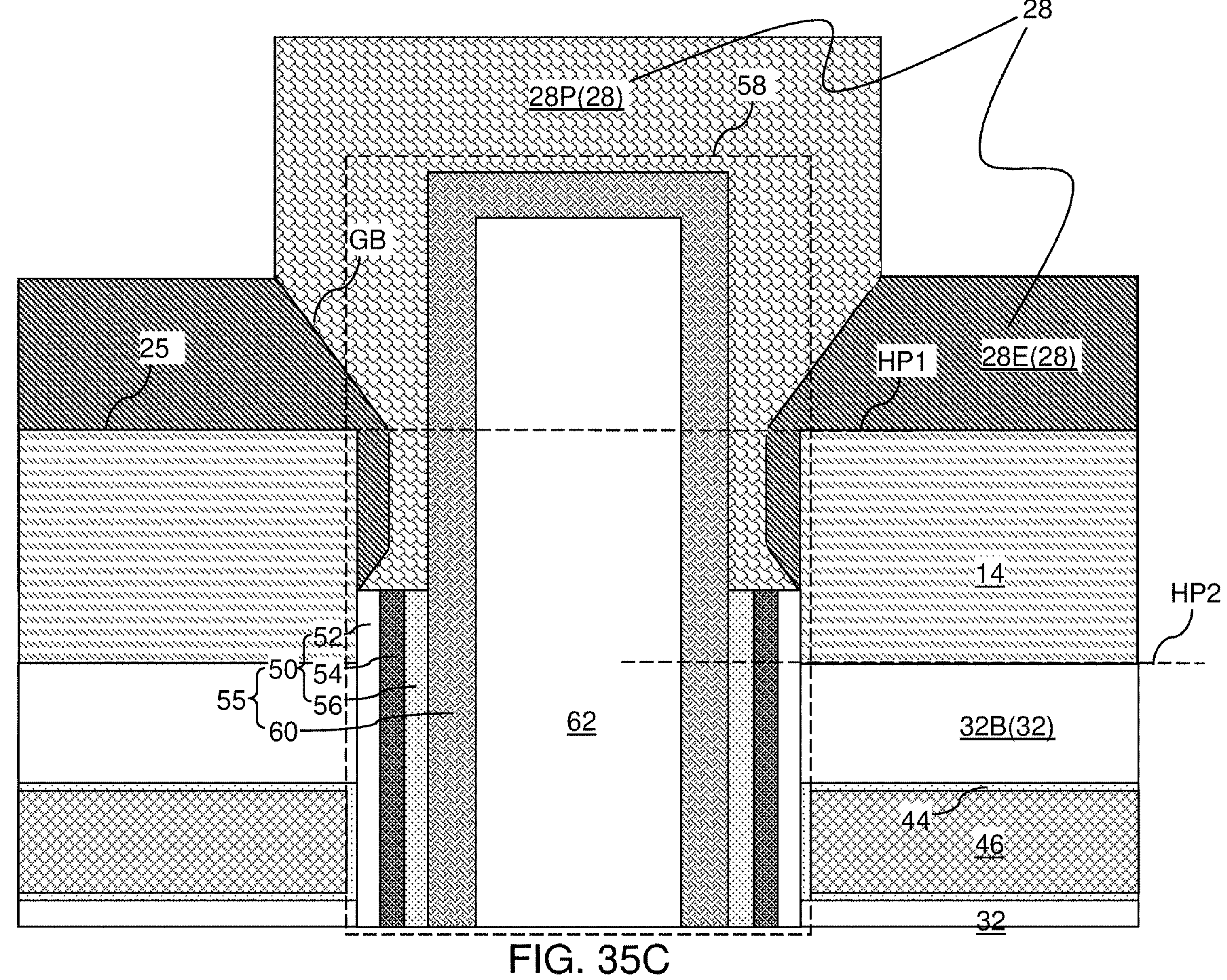

FIGS. 35A-35C are sequential vertical cross-sectional views of a region of a second configuration of the second exemplary structure during formation of a backside semiconductor source structure 28 according to the second embodiment of the present disclosure.

Referring to FIG. 35A, the second configuration of the second exemplary structure can be derived from the first configuration of the second exemplary structure by increasing the duration of the selective etch process that etches the materials of the buried insulating layer 12 and the memory films 50. Specifically, the duration of the selective etch process can be extended such that the recess depth rd, as measured between a horizontal plane including the distal backside horizontal surface 14H of the single crystalline semiconductor layer 14 and a recessed annular surface 50A of a memory film 50, may be in a range from 20% to 95%, such as from 40% to 90%, of the thickness of the single crystalline semiconductor layer 14.

Referring to FIG. 35B, the optional processing steps described with reference to FIG. 34B may optionally be performed to form an amorphous backside semiconductor source structure 27. The amorphous backside semiconductor source structure 27 may comprise cylindrical portions that are formed in the recess volumes between an outer sidewall of a respective vertical semiconductor channel 60 and a respective cylindrical sidewall of the single crystalline semiconductor layer 14 around each memory opening fill structure 58.

Figure 36:
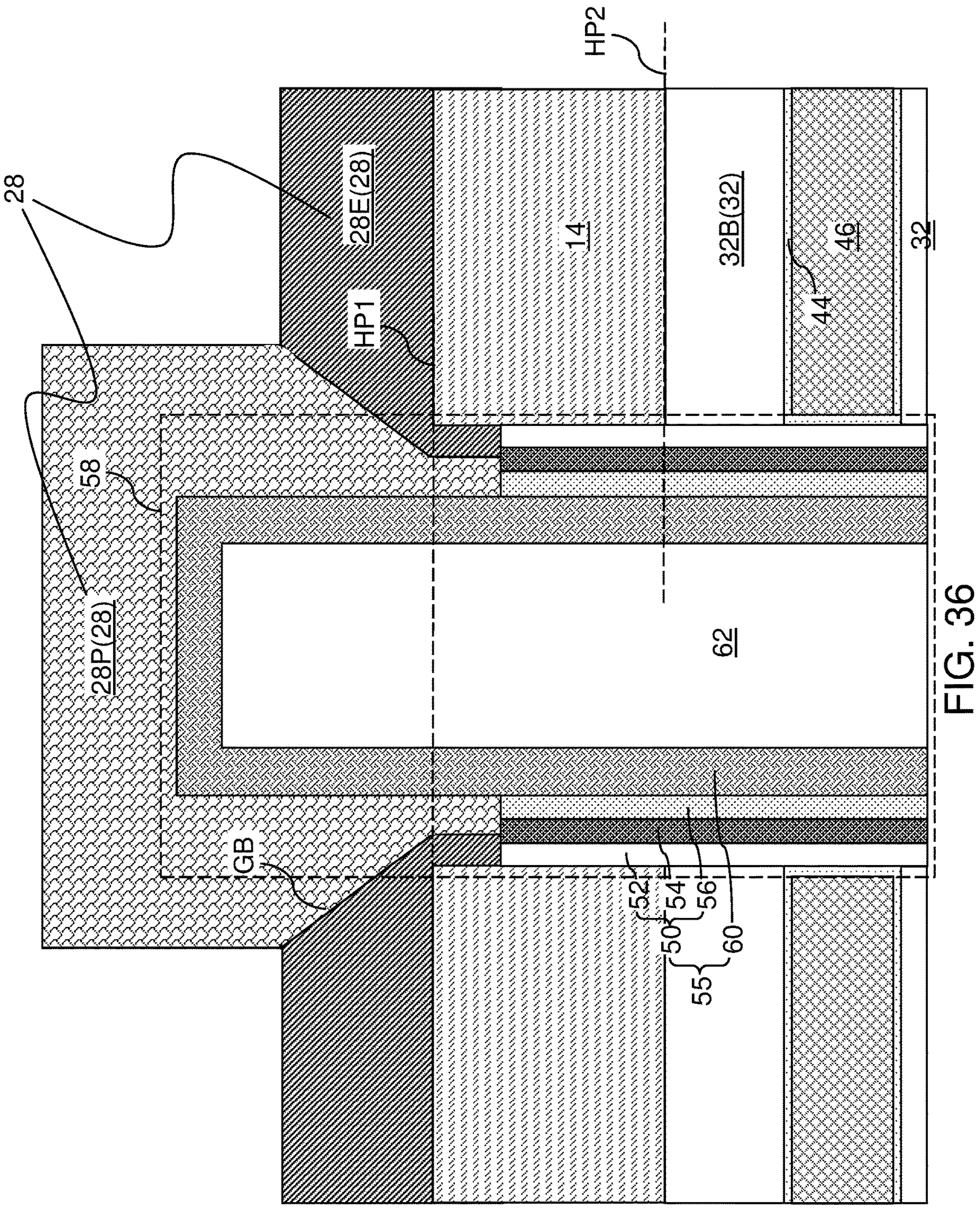
FIG. 36 is a vertical cross-sectional views of a region of a third configuration of the second exemplary structure after formation of a backside semiconductor source structure according to the second embodiment of the present disclosure.

Referring to FIG. 35C, the processing steps described with reference to FIG. 34C may be performed to convert the amorphous backside semiconductor source structure 27 into a backside semiconductor source structure 28 or to deposit a crystalline backside semiconductor source structure 28 if the step of FIG. 35B is omitted, as shown in FIG. 36 and described below. In this configuration, the epitaxial doped semiconductor portion 28E also comprises a portion located on a distal backside horizontal surface 14H of the single crystalline semiconductor layer 14. In this configuration, an interface between the epitaxial doped semiconductor portion 28E and the polycrystalline doped semiconductor portion 28P may also comprise the tapered annular surface (e.g., the grain boundary GB) having a variable lateral extent that increases with a vertical distance from a horizontal plane including the distal horizonal surface of the single crystalline semiconductor layer 14.

FIG. 36 is a vertical cross-sectional view of a region of a third configuration of the second exemplary structure after formation of a backside semiconductor source structure 28 according to the second embodiment of the present disclosure. The third configuration of the second exemplary structure may be derived from the first or second configuration of the second exemplary structure by performing an epitaxial semiconductor deposition process at the processing step of FIG. 34B or FIG. 35B such that the deposited semiconductor material forms a backside semiconductor source structure 28 described with reference to FIG. 34C or FIG. 35C. In other words, the as-deposited semiconductor material may form a backside semiconductor source structure 28 including an epitaxial doped semiconductor portion 28E and polycrystalline doped semiconductor portions 28P.

Figure 37:
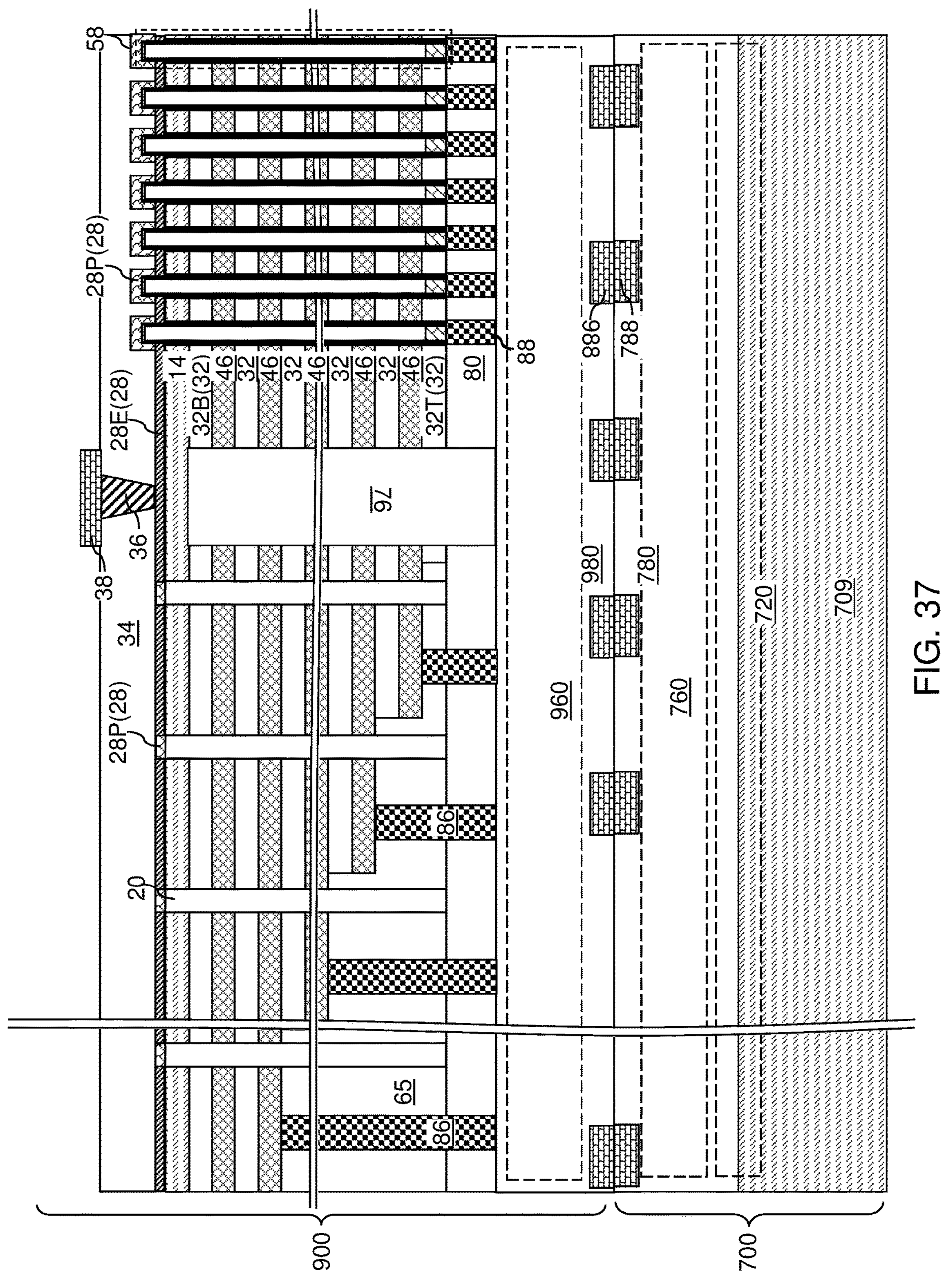
FIG. 37 is a vertical cross-sectional view of the second exemplary structure after formation of a source contact structure according to the second embodiment of the present disclosure.

Referring to FIG. 37, the processing steps described with reference to FIG. 19 may be performed. Optionally, a laser anneal process can be performed if the laser anneal process has not been performed so far. The average grain size of the polycrystalline semiconductor material in the polycrystalline doped semiconductor portions 28P of the backside semiconductor source structure 28 may increase during the laser anneal process, which also activates the electrical dopants in the backside semiconductor source structure 28. Additional polycrystalline doped semiconductor portions 28P may be formed over the support pillar structures 20 in the backside semiconductor source structure 28. A backside insulating layer 34 and a source contact structure (36, 38) can be subsequently formed.

FIGS. 38A-38D are sequential vertical cross-sectional views of a region of a fourth configuration of the second exemplary structure during formation of a backside semiconductor source structure 28 according to the second embodiment of the present disclosure.

Figure 38A:
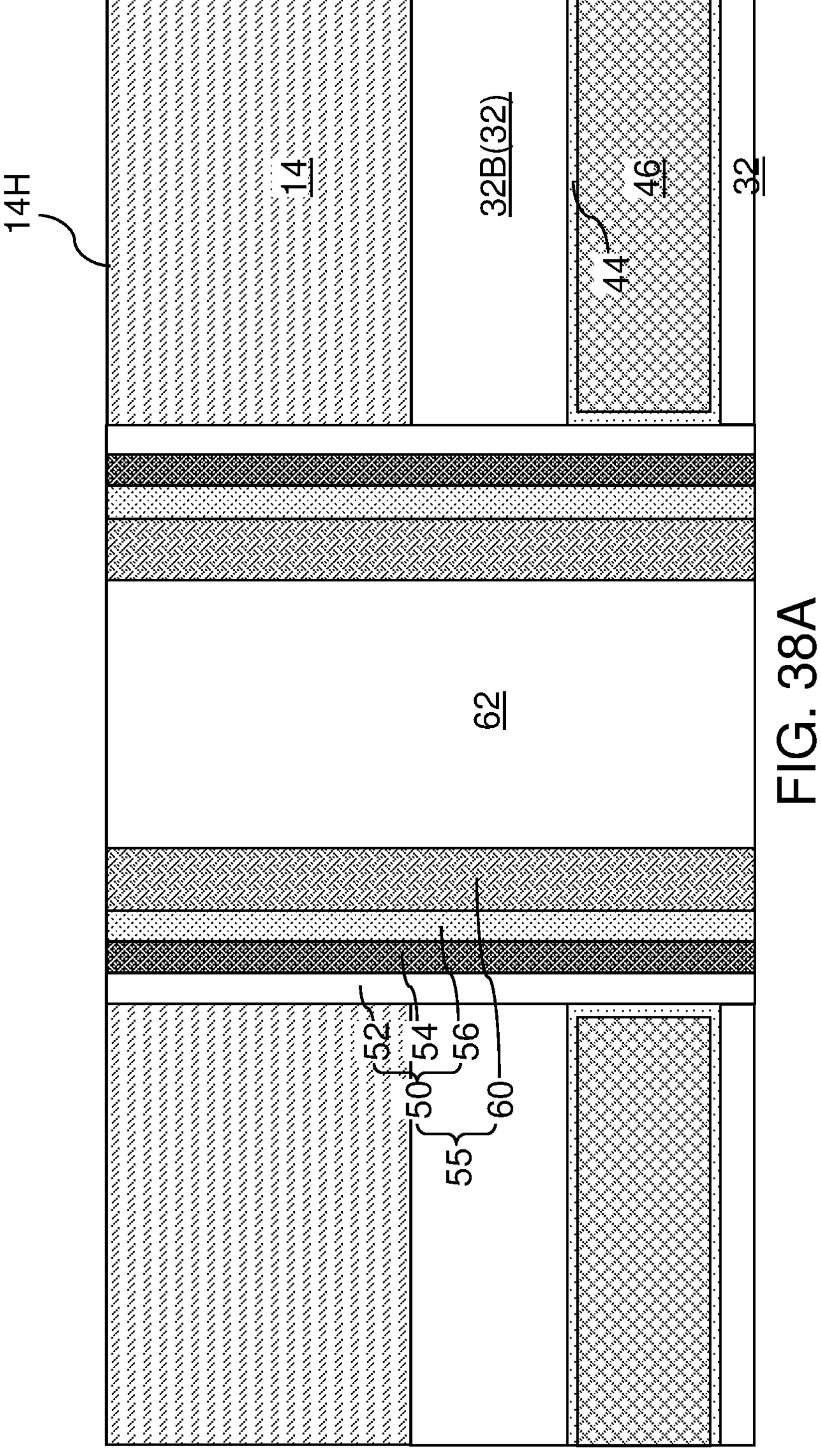
FIGS. 38A-38D are sequential vertical cross-sectional views of a region of a fourth configuration of the second exemplary structure during formation of a backside semiconductor source structure according to the second embodiment of the present disclosure.

Referring to FIG. 38A, the fourth configuration of the second exemplary structure may be derived from the second exemplary structure illustrated in FIGS. 33A and 33B by removing the buried insulating layer 12 and end portions of the memory opening fill structures 58 that are more distal from the alternating stack (32, 46) than the horizontal plane including the distal backside horizontal surface 14H of the single crystalline semiconductor layer 14. In this configuration, the horizontal portion 60H of the vertical semiconductor channel 60 is also removed, instead of being left on the dielectric core 62 as shown in FIG. 33B.

Figure 38B:
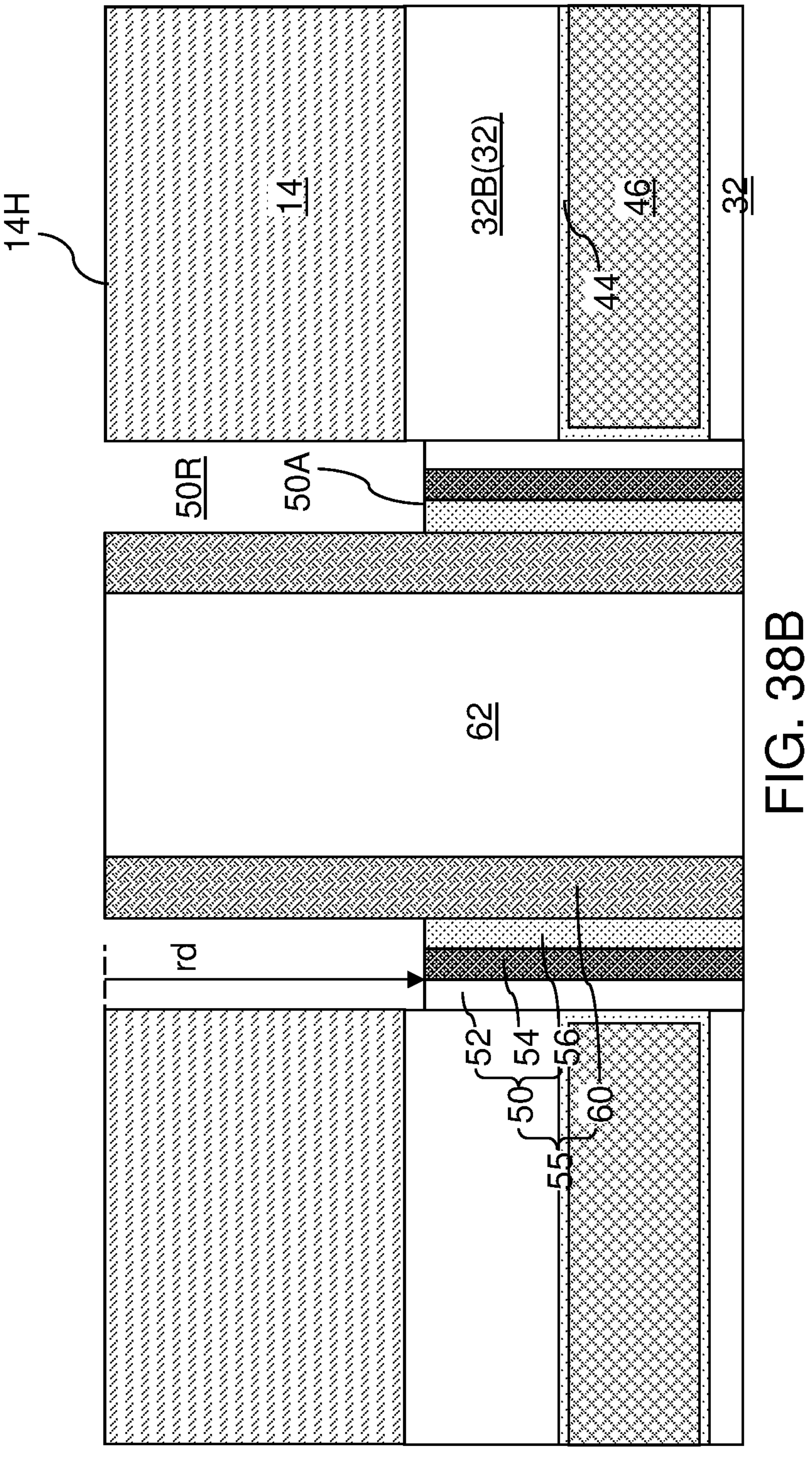

Referring to FIG. 38B, at least one isotropic etch process may be performed to vertically recess the memory films 50, as described above. The recessed annular end surfaces 50A of the memory films 50 may be formed at, above or below the horizontal plane including the interface between the alternating stack (32, 46) and the single crystalline semiconductor layer 14. In other words, the recess distance rd by which the annular end surfaces 50A of the memory films 50 are vertically recessed relative to the horizontal plane including the distal backside horizontal surface 14H of the single crystalline semiconductor layer 14 may be greater than, less than or the same as the thickness of the single crystalline semiconductor layer 14. As such, sidewall surface segments of the bottommost insulating layer 32B may or may not be physically exposed to the cylindrical recesses 50R located around end portions of the vertical semiconductor channels 60.

Figure 38C:
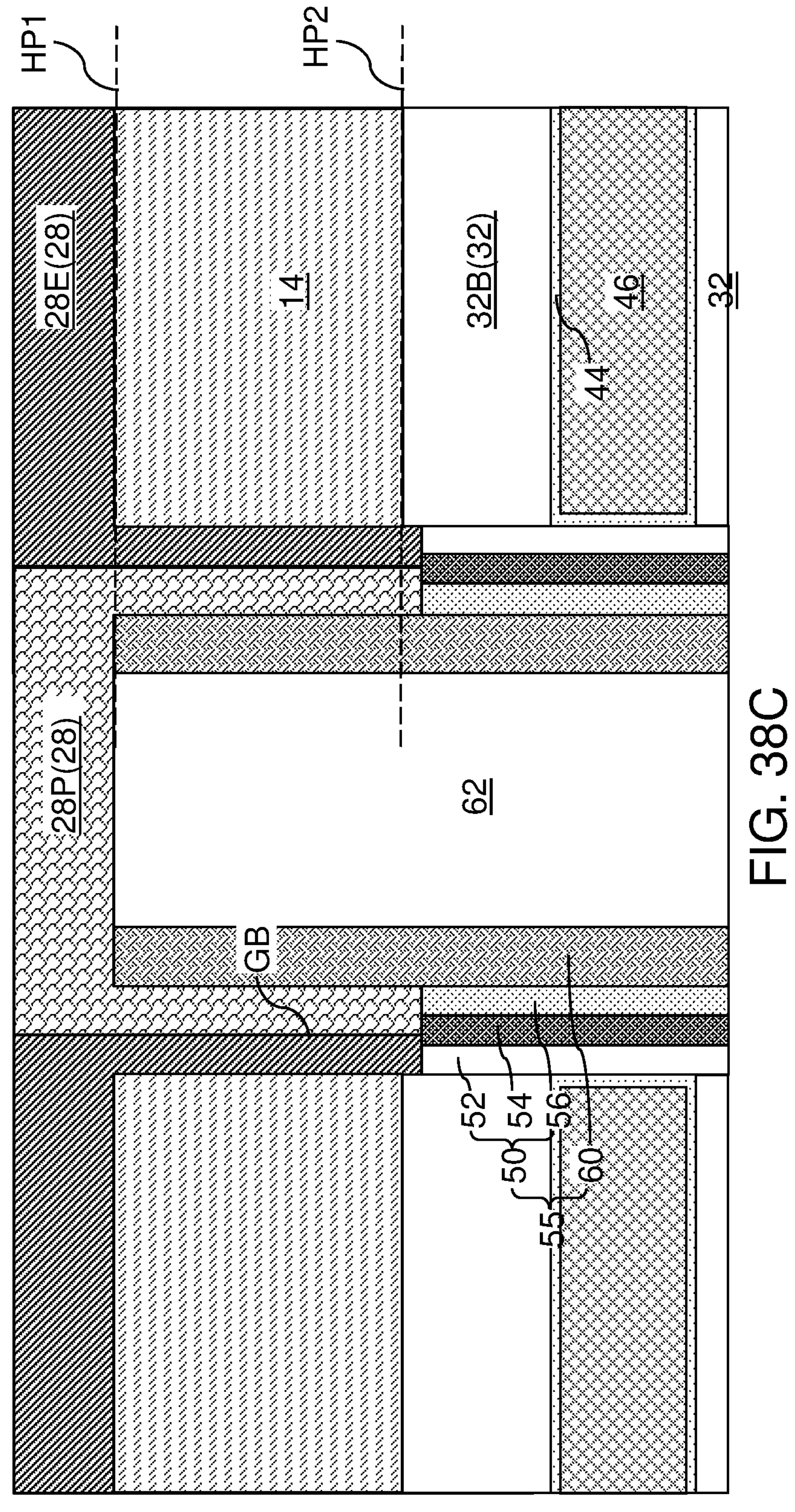

Referring to FIG. 38C, the processing steps described above may be performed to form the backside semiconductor source structure 28. In one embodiment, the backside semiconductor source structure 28 may be formed as an in-process structure including an amorphous semiconductor material, and may be subsequently crystallized to form the backside semiconductor source structure 28, as will be described in more detail with respect to FIGS. 39A-39B below. Alternatively, the backside semiconductor source structure 28 may be deposited in the crystalline state, as described above with respect to FIG. 36. As described above, the backside semiconductor source structure comprises an epitaxial doped semiconductor portion 28E and polycrystalline doped semiconductor portions 28P.

Figure 38D:
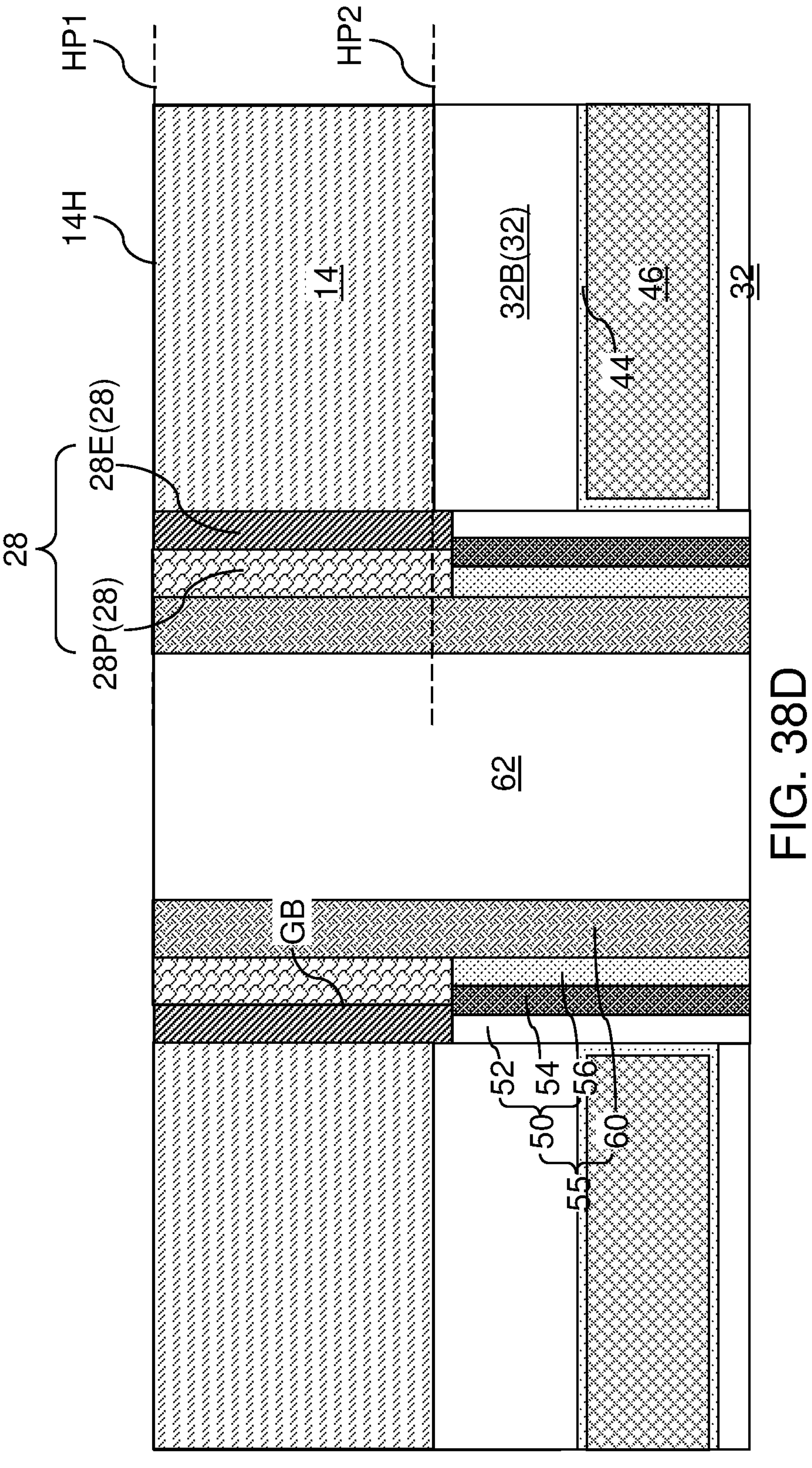
Figure 38E:
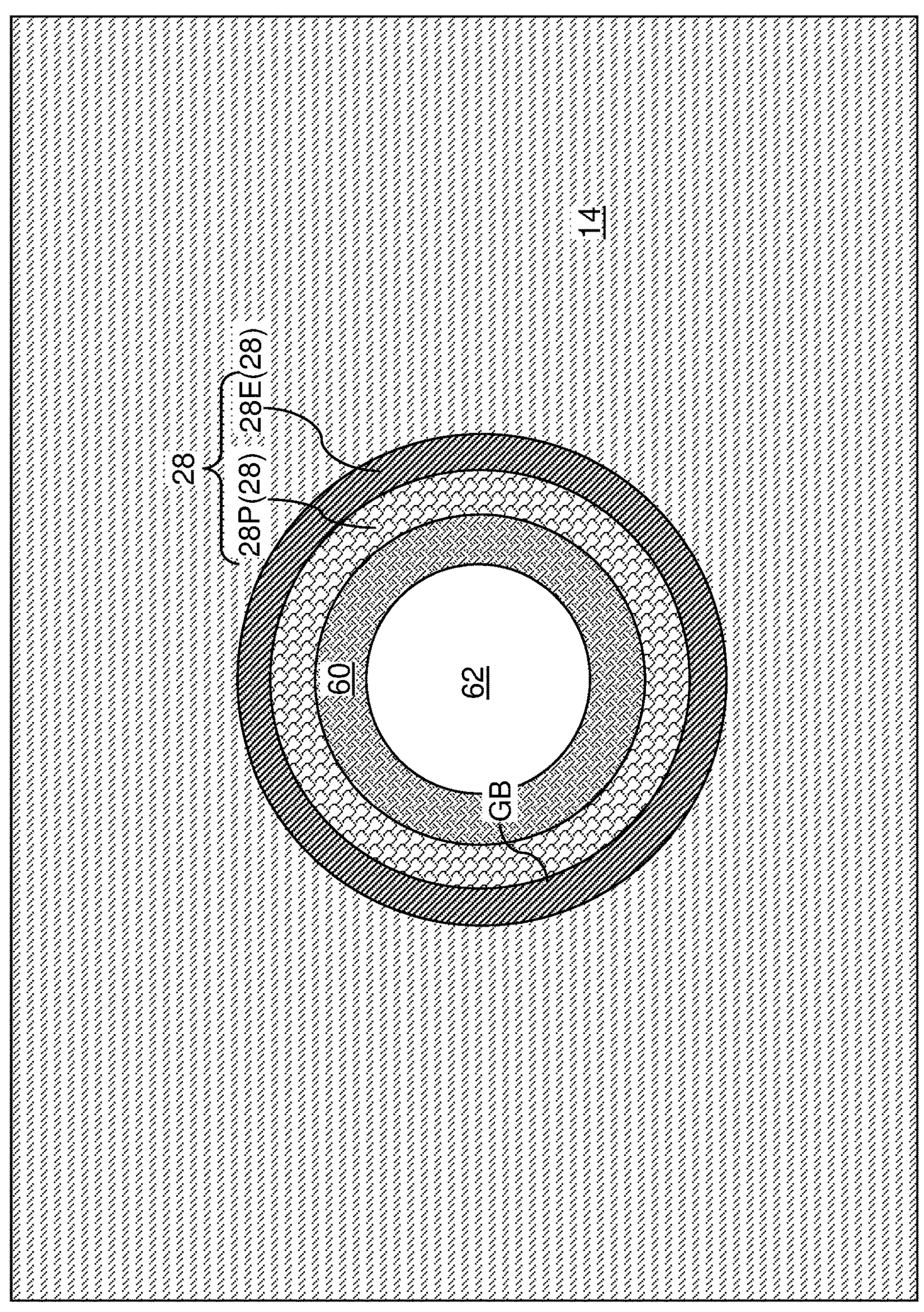
FIG. 38E is a bottom-up view of the structure of FIG. 38D.

Referring to FIGS. 38D and 38E, a chemical mechanical polishing process may be optionally performed after the processing steps of FIG. 38C. In an embodiment in which such a chemical mechanical planarization process is performed, portions of the backside semiconductor source structure 28 that overlie a first horizontal plane HP1 including the backside horizontal surface 14H of the single crystalline semiconductor layer 14 may be removed. A plurality of discrete backside semiconductor source structures 28 may be formed, each of which has a doping of the second conductivity type, and comprises a cylindrical polycrystalline doped semiconductor portions 28P and a cylindrical epitaxial doped semiconductor portion 28E.

In one embodiment, within each backside semiconductor source structure 28, the polycrystalline doped semiconductor portion 28P has a first tubular shape; the epitaxial doped semiconductor portion 28E comprises a portion having a second tubular shape that laterally surrounds the first tubular shape; and distal annular end surfaces of the polycrystalline doped semiconductor portion 28P and the epitaxial doped semiconductor portion 28E are formed within a horizontal plane including the distal horizontal surface 14H of the single crystalline semiconductor layer 14. In one embodiment, an entirety of the backside semiconductor source structure 28 is located within a bottom portion of the memory opening 49.

Figure 39A:
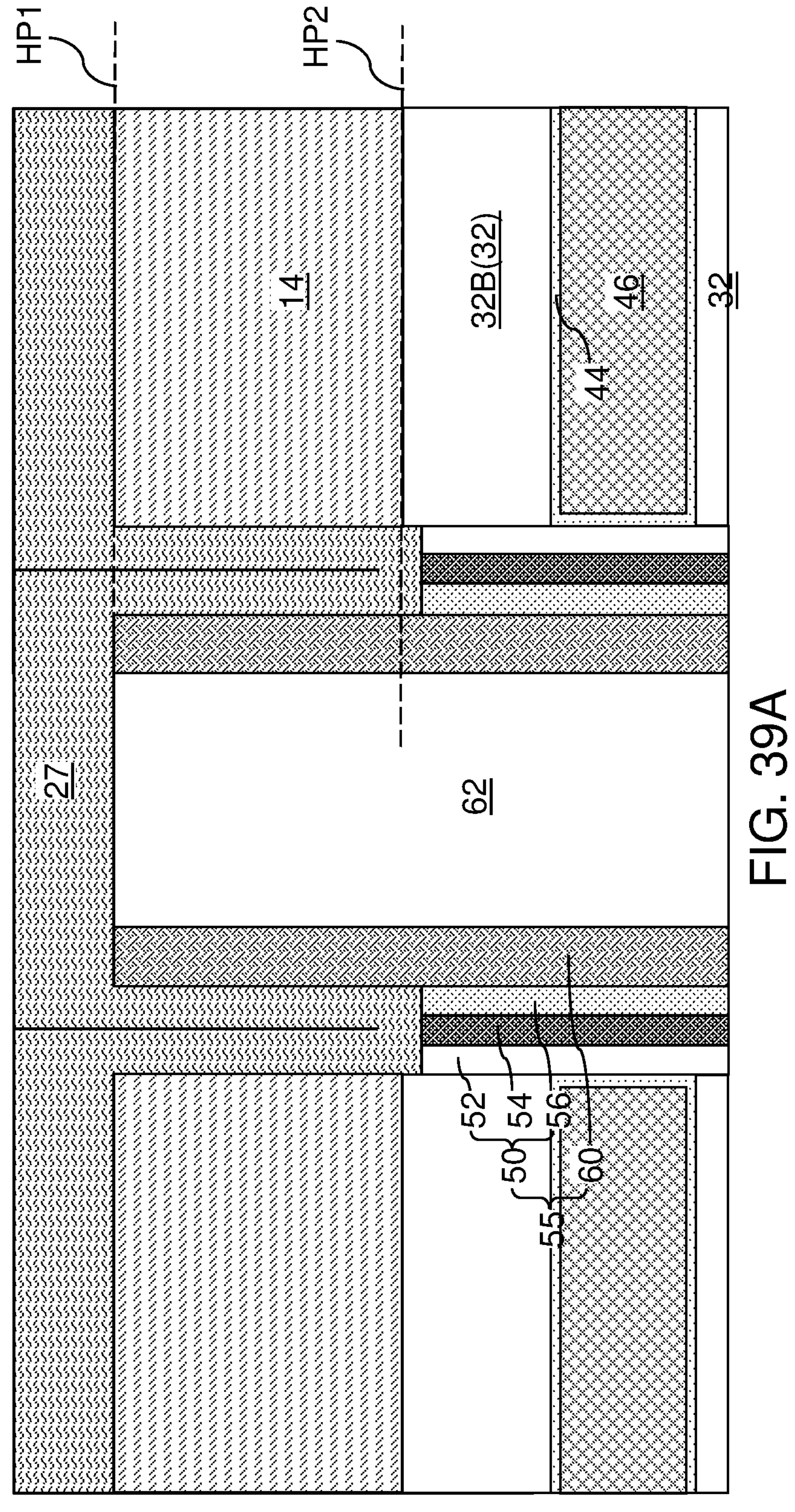
FIGS. 39A and 39B are sequential vertical cross-sectional views of a region of a fifth configuration of the second exemplary structure during formation of a backside semiconductor source structure according to the second embodiment of the present disclosure.
Figure 39B:
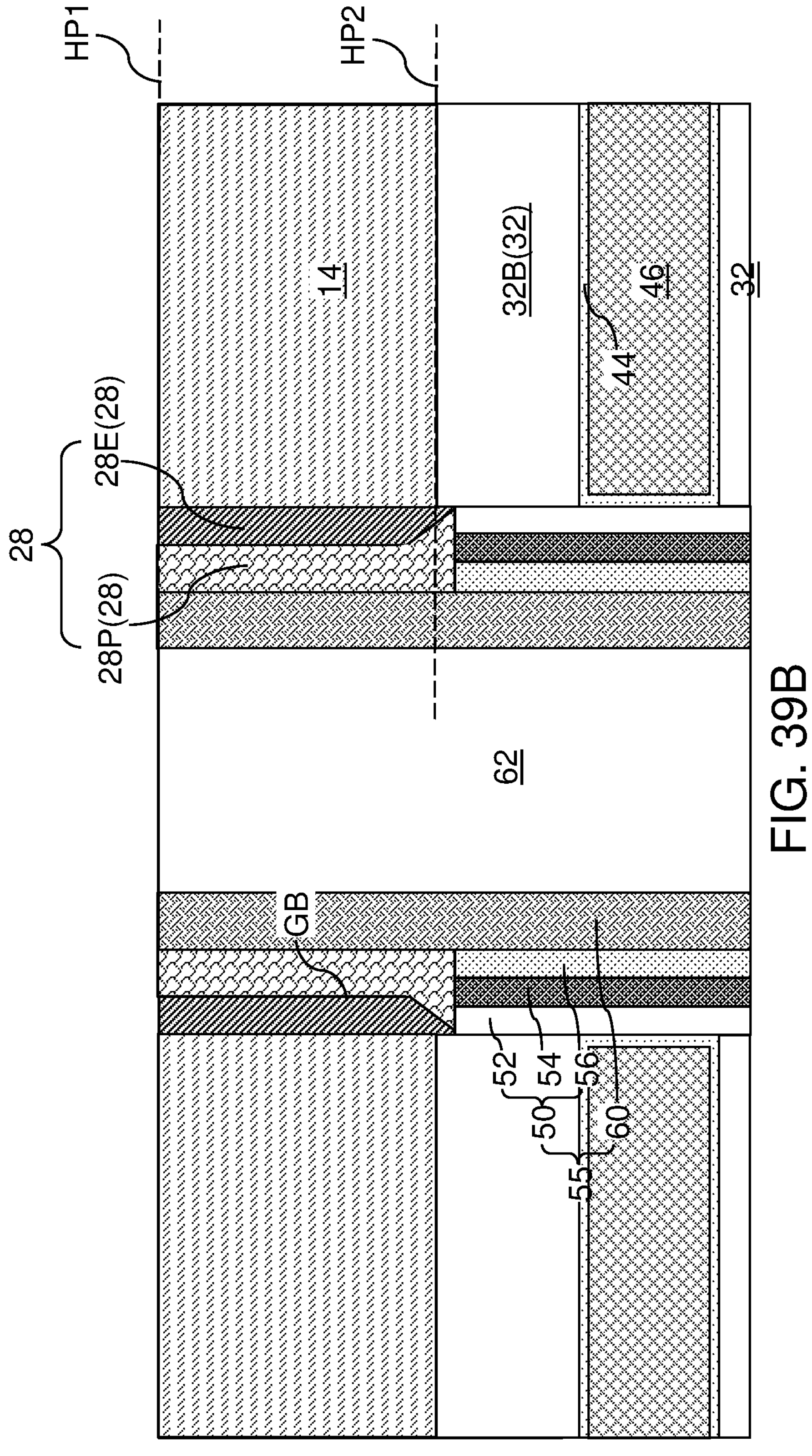

FIGS. 39A and 39B are sequential vertical cross-sectional views of a region of a fifth configuration of the second exemplary structure during formation of a backside semiconductor source structure 28 according to the second embodiment of the present disclosure.

Referring to FIG. 39A, an amorphous backside semiconductor source structure 27 can be formed by performing the processing steps described with reference to FIG. 38C with a modification in the process conditions such that the deposited semiconductor material is amorphous.

Referring to FIG. 39B, a laser anneal process and a chemical mechanical polishing process may be performed to convert the amorphous backside semiconductor source structure 27 into a plurality of backside semiconductor source structures 28, each laterally surrounding, and contacting, a respective vertical semiconductor channel 60, and laterally surrounded by, and contacting, a respective cylindrical sidewall of the single crystalline semiconductor layer 14. In one embodiment, an entirety of the backside semiconductor source structure 28 is located within a bottom portion of the memory opening 49.

Figure 40:
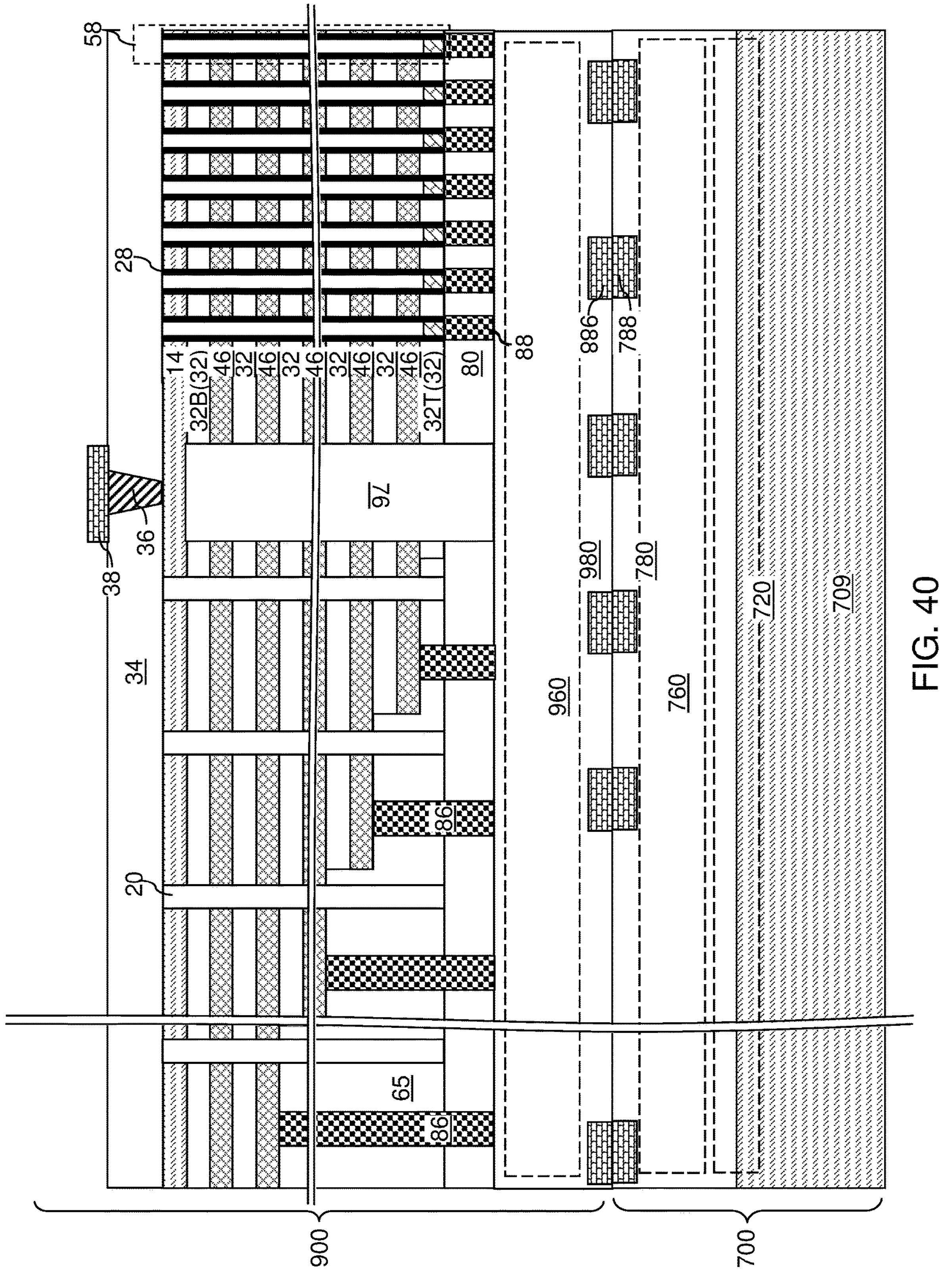
FIG. 40 is a vertical cross-sectional view of the second exemplary structure after formation of a source contact structure according to the second embodiment of the present disclosure.

Referring to FIG. 40, the processing steps described with reference to FIG. 19 may be performed to form the backside insulating layer 34 and a source contact structure (36, 38).

Referring to FIGS. 20-40 and according to various embodiments of the present disclosure, a semiconductor structure is provided, which comprises: an alternating stack (32, 46) of insulating layers 32 and electrically conductive layers 46 located on a single crystalline semiconductor layer 14; a memory opening 49 vertically extending through the alternating stack (32, 46) and through the single crystalline semiconductor layer 14; a memory opening fill structure 58 located in the memory opening 49 and comprising a memory film 50 and a vertical semiconductor channel 60; and a backside semiconductor source structure 28 comprising a doped semiconductor material, wherein the backside semiconductor source structure 28 comprises an epitaxial doped semiconductor portion 28E in contact with and in epitaxial alignment with a single crystalline structure of the single crystalline semiconductor layer 14, and a polycrystalline doped semiconductor portion 28P in contact with the vertical semiconductor channel 60.

In one embodiment, the epitaxial doped semiconductor portion 28E and the polycrystalline doped semiconductor portion 28P have a same material composition throughout. In one embodiment, the vertical semiconductor channel 60 has a doping of a first conductivity type; and an entirety of the backside semiconductor source structure 28 has a doping of a second conductivity type that is an opposite of the first conductivity type.

In one embodiment, a boundary between the epitaxial doped semiconductor portion 28E and the polycrystalline doped semiconductor portion 28P comprises a continuously extending grain boundary GB that extends from the memory film 50 to a backside surface of the backside semiconductor source structure 28.

In one embodiment, the epitaxial doped semiconductor portion 28E contacts a cylindrical sidewall of the single crystalline semiconductor layer 14 at a sidewall of the memory opening 49. In one embodiment, the polycrystalline doped semiconductor portion 28P contacts an end segment of an outer sidewall of the vertical semiconductor channel 60.

In one embodiment, the epitaxial doped semiconductor portion 28E comprises a portion located on a distal horizontal surface of the single crystalline semiconductor layer 14. In one embodiment, an interface between the epitaxial doped semiconductor portion 28E and the polycrystalline doped semiconductor portion 28P is located in a horizontal plane including the distal horizonal surface of the single crystalline semiconductor layer 14.

In one embodiment, a horizontal interface between the single crystalline semiconductor layer 14 and the epitaxial doped semiconductor portion 28E is located in a first horizontal plane HP1; the memory opening fill structure 58 comprises a dielectric core 62 that is laterally surrounded by the vertical semiconductor channel 60; and an end surface of the dielectric core 62 is more distal from a second horizontal plane HP2 including an interface between the single crystalline semiconductor layer 14 and the alternating stack (32, 46) than the first horizontal plane HP1 is from the second horizontal plane HP2. In one embodiment, the backside semiconductor source structure 28 is not contact with the dielectric core 62, and is spaced from the dielectric core 62 by the vertical semiconductor channel 60.

In one embodiment, an entirety of the backside semiconductor source structure 28 is located within a bottom portion of the memory opening 49. In one embodiment, the polycrystalline doped semiconductor portion 28P has a first tubular shape; and the epitaxial doped semiconductor portion 28E comprises a portion having a second tubular shape that laterally surrounds the first tubular shape. In one embodiment, distal annular end surfaces of the polycrystalline doped semiconductor portion 28P and the epitaxial doped semiconductor portion 28E are located within a horizontal plane including a distal horizontal surface of the single crystalline semiconductor layer 14.

The various embodiments of the present disclosure may be employed to form a backside semiconductor source structure (26, 28) or a plurality of backside semiconductor source structures 28 that can provide reliable electrical contact to end portions of vertical semiconductor channels 60. The semiconductor layers (14, 24) provide a template for epitaxial growth of one or more backside semiconductor source structures (28, 26) with high mobility and which provide a low resistance Ohmic contact to the vertical semiconductor channel 60.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A semiconductor structure, comprising:

an alternating stack of insulating layers and electrically conductive layers located on a single crystalline semiconductor layer;

a memory opening vertically extending through the alternating stack and through the single crystalline semiconductor layer;

a memory opening fill structure located in the memory opening and comprising a memory film and a vertical semiconductor channel; and a backside semiconductor source structure comprising a doped semiconductor material, wherein the backside semiconductor source structure comprises an epitaxial doped semiconductor portion in contact with and in epitaxial alignment with a single crystalline structure of the single crystalline semiconductor layer, and a polycrystalline doped semiconductor portion in contact with the vertical semiconductor channel;

wherein:

a horizontal interface between the single crystalline semiconductor layer and the epitaxial doped semiconductor portion is located in a first horizontal plane;

the memory opening fill structure comprises a dielectric core that is laterally surrounded by the vertical semiconductor channel;

an end surface of the dielectric core is more distal from a second horizontal plane including an interface between the single crystalline semiconductor layer and the alternating stack than the first horizontal plane is from the second horizontal plane; and the backside semiconductor source structure is not in contact with the dielectric core, and is spaced from the dielectric core by the vertical semiconductor channel.

* * * * *